(12) United States Patent
Shimoyama et al.

(10) Patent No.: US 10,468,338 B2
(45) Date of Patent: Nov. 5, 2019

(54) SEMICONDUCTOR DEVICE

(71) Applicant: Renesas Electronics Corporation, Koutou-ku, Tokyo (JP)

(72) Inventors: Hiroya Shimoyama, Tokyo (JP); Hiroyuki Nakamura, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/048,284

(22) Filed: Jul. 29, 2018

(65) Prior Publication Data

US 2019/0088577 A1    Mar. 21, 2019

(30) Foreign Application Priority Data

Sep. 20, 2017    (JP) .................. 2017-180379

(51) Int. Cl.
*H01L 23/495* (2006.01)
*H01L 23/31* (2006.01)
(Continued)

(52) U.S. Cl.
CPC .... *H01L 23/49575* (2013.01); *H01L 23/3121* (2013.01); *H01L 23/36* (2013.01); *H01L 23/3675* (2013.01); *H01L 23/49503* (2013.01); *H01L 23/49524* (2013.01); *H01L 23/49541* (2013.01); *H01L 23/49562* (2013.01); *H01L 24/32* (2013.01); *H01L 24/33* (2013.01); *H01L 24/40* (2013.01); *H01L 24/48* (2013.01); *H01L 24/73* (2013.01); *H01L 25/072* (2013.01); *H05K 7/209* (2013.01); *H01L 23/49555* (2013.01); *H01L 2224/0603* (2013.01); *H01L 2224/32245* (2013.01); *H01L 2224/33181* (2013.01); *H01L 2224/40137* (2013.01);
(Continued)

(58) Field of Classification Search
CPC ......... H01L 23/49503; H01L 23/49575; H01L 23/49541; H01L 23/49568; H01L 25/072; H05K 7/209
USPC .................................................. 257/676, 723
See application file for complete search history.

(56) References Cited

U.S. PATENT DOCUMENTS 6,448,645 B1 * 9/2002 Kimura ................ H01L 25/072
257/692
7,692,285 B2    4/2010 Sato et al.
(Continued)

FOREIGN PATENT DOCUMENTS

JP    2007-012857 A    1/2007
JP    2013-149730 A    8/2013

*Primary Examiner* — Nitin Parekh
(74) *Attorney, Agent, or Firm* — Shapiro, Gabor and Rosenberger, PLLC

(57) ABSTRACT

Performance of a semiconductor device is enhanced. A semiconductor device is a semiconductor device obtained by sealing in a sealing portion first, second, and third semiconductor chips each incorporating a power transistor for high-side switch, fourth, fifth, and sixth semiconductor chips each incorporating a power transistor for low-side switch, and a semiconductor chip incorporating a control circuit controlling these chips. The source pads of the fourth, fifth, and sixth semiconductor chips are electrically coupled to a plurality of leads LD9 and a plurality of leads LD10 via a metal plate. As viewed in a plane, the leads LD9 intersect with a side MRd4 of the sealing portion and the leads LD10 intersect with a side MRd2 of the sealing portion.

20 Claims, 34 Drawing Sheets

(51) Int. Cl.
  *H01L 23/00*    (2006.01)
  *H01L 23/367*   (2006.01)
  *H05K 7/20*     (2006.01)
  *H01L 25/07*    (2006.01)
  *H01L 23/36*    (2006.01)
  *H02M 7/537*    (2006.01)

(52) U.S. Cl.
  CPC ............... *H01L 2224/40177* (2013.01); *H01L 2224/40245* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48101* (2013.01); *H01L 2224/48137* (2013.01); *H01L 2224/48247* (2013.01); *H01L 2224/73215* (2013.01); *H01L 2224/73263* (2013.01); *H01L 2224/73265* (2013.01); *H01L 2924/13091* (2013.01); *H01L 2924/14252* (2013.01); *H01L 2924/181* (2013.01); *H02M 7/537* (2013.01)

(56) References Cited

U.S. PATENT DOCUMENTS

| | | | |
|---|---|---|---|
| 8,779,575 B2* | 7/2014 | Shinohara | H01L 23/49531 257/666 |
| 9,059,334 B2 | 6/2015 | Usui et al. | |
| 2003/0107120 A1* | 6/2003 | Connah | H01L 23/49562 257/691 |
| 2006/0113664 A1* | 6/2006 | Shiraishi | H02M 7/003 257/723 |
| 2007/0145580 A1* | 6/2007 | Satou | H01L 23/49575 257/723 |
| 2007/0216013 A1* | 9/2007 | Funakoshi | H01L 23/3735 257/691 |
| 2008/0054439 A1* | 3/2008 | Malhan | H01L 23/49844 257/690 |
| 2014/0103514 A1* | 4/2014 | Fernando | H01L 23/49575 257/676 |
| 2014/0117517 A1* | 5/2014 | Fernando | H01L 23/49575 257/666 |
| 2014/0361419 A1* | 12/2014 | Xue | H01L 23/492 257/676 |

* cited by examiner

SEMICONDUCTOR DEVICE

CROSS-REFERENCE TO RELATED APPLICATIONS

The disclosure of Japanese Patent Application No. 2017-180379 filed on Sep. 20, 2017 including the specification, drawings and abstract is incorporated herein by reference in its entirety.

BACKGROUND

The present invention relates to a semiconductor device and is favorably applicable to a semiconductor device obtained, for example, by sealing three semiconductor chips each including a power transistor for high-side switch, three semiconductor chips each including a power transistor for low-side switch, and a semiconductor chip controlling these chips.

An inverter circuit in wide use as an example of a power supply circuit has a configuration in which a power MOSFET for high-side switch and a power MOSFET for low-side switch are coupled in series between a terminal supplied with a supply voltage and a terminal supplied with a ground voltage. A supply voltage can be converted with the inverter circuit by controlling a gate voltage of the power MOSFET for high-side switch and a gate voltage of the power MOSFET for low-side switch with a control circuit.

Japanese Unexamined Patent Application Publication No. 2007-012857 (Patent Document 1) describes a technology related to a HSOP 46 for driving a three-phase motor obtained by sealing three first semiconductor chips 30 including a pMISFET and three second semiconductor chips 31 including an nMISFET with a sealing portion 44.

Japanese Unexamined Patent Application Publication No. 2013-149730 (Patent Document 2) describes a power semiconductor module 100B including six semiconductor chips 120c to 120h as IGBT chips and six semiconductor chips 140c to 140h as diode chips as shown in FIG. 9 to FIG. 12.

RELATED ART DOCUMENTS

Patent Documents

[Patent Document 1] Japanese Unexamined Patent Application Publication No. 2007-012857
[Patent Document 2] Japanese Unexamined Patent Application Publication No. 2013-149730

SUMMARY

It is desired to enhance performance of a semiconductor device obtained by sealing three semiconductor chips each including a power transistor for high-side switch, three semiconductor chips each including a power transistor for low-side switch, and a semiconductor chip controlling these chips. Or, it is desired to reduce a size of a semiconductor device. Alternatively, it is desired to enhance performance of a semiconductor device and further reduce a size of the semiconductor device.

Other problems and novel features will be apparent from the description in this specification and the accompanying drawings.

According to an embodiment, a semiconductor device is a semiconductor device obtained by sealing first, second, and third semiconductor chips each incorporating a power transistor for high-side switch, fourth, fifth, and sixth semiconductor chips each incorporating a power transistor for low-side switch, and a seventh semiconductor chip incorporating a control circuit controlling these chips with a sealing body. The first, second, and third semiconductor chips are mounted over a first chip mounting portion and the fourth, fifth, sixth, and seventh semiconductor chips are respectively mounted over second, third, fourth, and fifth chip mounting portions. The semiconductor device includes a plurality of first leads electrically coupled to a first electrode of the first semiconductor chip, a plurality of second leads electrically coupled to a second electrode of the second semiconductor chip, and a plurality of third leads electrically coupled to a third electrode of the third semiconductor chip. The semiconductor device further includes a plurality of fourth leads electrically coupled to a fourth back electrode of the fourth semiconductor chip, a plurality of fifth leads electrically coupled to a fifth back electrode of the fifth semiconductor chip, and a plurality of sixth leads electrically coupled to a sixth back electrode of the sixth semiconductor chip. The semiconductor device further includes a plurality of seventh leads and a plurality of eighth leads electrically coupled to first, second, and third back electrodes of the first, second, and third semiconductor chips and a plurality of ninth leads and a plurality of 10th leads electrically coupled to fourth, fifth, and sixth electrodes of the fourth, fifth, and sixth semiconductor chips through a first metal plate. As viewed in a plane, the sealing body includes a first side extending along a first direction, a second side extending along a second direction intersecting with the first direction, a third side extending along the first direction and positioned on the opposite side to the first side, and a fourth side extending along the second direction and positioned on the opposite side to the second side. As viewed in a plane, the first leads, second leads, and third leads intersect with the third side of the sealing body and the fourth leads, fifth leads, and sixth leads intersect with the first side of the sealing body. As viewed in a plane, the eighth leads and the 10th leads intersect with the second side of the sealing body and the seventh leads and the ninth leads intersect with the fourth side of the sealing body.

According to an embodiment, performance of a semiconductor device can be enhanced.

Or, a size of a semiconductor device can be reduced.

Alternatively, performance of a semiconductor device can be enhanced and further a size of the semiconductor device can be reduced.

DETAILED DESCRIPTION

Figure 1:
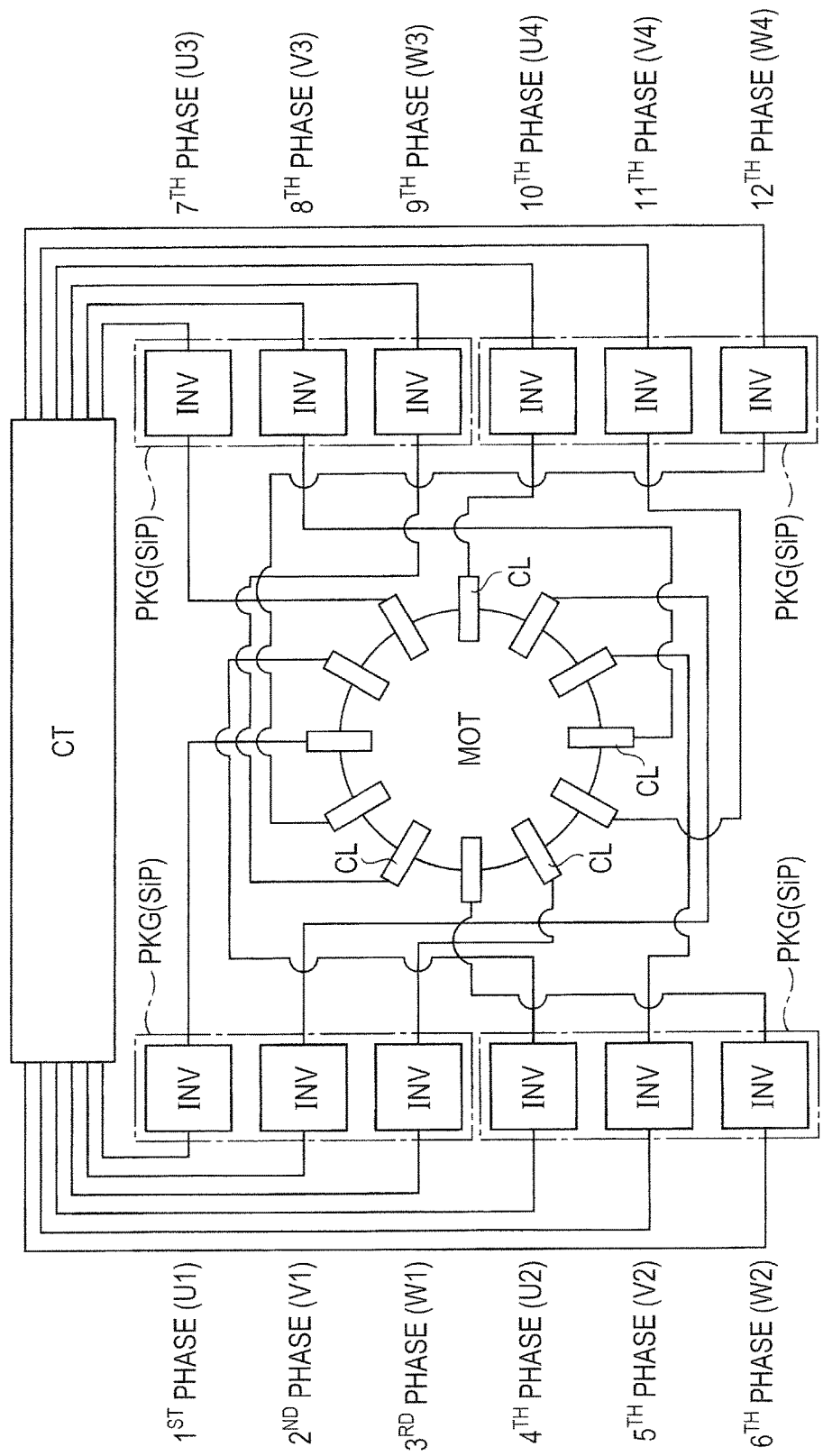
FIG. 1 is a circuit diagram schematically illustrating a circuit formed in a control board controlling a 12-phase BLDC motor.

In the following description of each embodiment, the embodiment will be divided into multiple sections or embodiments if necessary for the sake of convenience. These sections and embodiments are not irrelevant to one another unless explicitly stated otherwise and one is a modification to, a detailed description, or a supplementary explanation of part or all of another. When a number of elements or the like (including a number of pieces, a numerical value, a quantity, a range, and the like) is referred to in the following description of each embodiment, the description is not limited to that specific number unless explicitly stated otherwise or the description is evidently limited to that specific number in principle. Any number not less or more than that specific number is acceptable. In the following description of each embodiment, each constituent element (including constituent step and the like) thereof is not always indispensable unless explicitly stated otherwise or it is evidently considered to be indispensable in principle, needless to add. Similarly, when a shape, positional relation, or the like of each constituent element or the like is referred to, those substantially approximate or similar to that shape or the like are included unless explicitly stated otherwise or it is evidently considered not to be so in principle. This is also the case with the above-mentioned number and range.

Hereafter, a detailed description will be given to embodiments with reference to the drawings. In all the drawings illustrating the following embodiments, members having an identical function will be marked with identical reference numerals and a repetitive description thereof will be omitted. With respect to the following embodiments, a description of an identical or a similar item will not be repeated as a rule unless especially necessary.

In a drawing referred to in connection with the following embodiments, hatching may be omitted for making the drawing more visible even though the drawing is a sectional view. Even a plan view may be hatched for making the drawing more visible.

In the present specification, a field effect transistor will be referred to as MOSFET (Metal Oxide Semiconductor Field Effect Transistor) or simply as MOS but a non-oxide film is not excluded from gate insulating films. That is, when MOSFET is cited in the present specification, it includes not only MISFET (Metal Insulator Semiconductor Field Effect Transistor: MIS-type field effect transistor) using an oxide film (silicon oxide film) for a gate insulating film but also MISFET using an insulating film other than an oxide film (silicon oxide film) for a gate insulating film.

Details of Investigation

In recent years, designing and development have been made to replace related-art three-phase BLDC (brushless DC) motors with six-phase or 12-phase BLDC motors with an eye on functional and safety enhancement for practical use of automatic driving of automobiles. Since BLDC motors are not of a self-rectifying type and it is generally recognized that BLDC motors are complicated to control. Consequently, six-phase BLDC motors are provided with two sets of related-art three phases (U phase, V phase, W phase) and 12-phase BLDC motors are provided with four sets of related-art three phases (U phase, V phase, W phase). Thus, if a trouble occurs in any set, the trouble would not immediately become obvious.

The present inventors have been considering controlling the three phases of a BLDC motor with SiP (System in Package) including three semiconductor chips CP1, CP2, CP3 each including a power MOSFET for high-side switch, three semiconductor chips CP4, CP5, CP6 each including a power MOSFET for low-side switch, and a semiconductor chip CPC controlling these semiconductor chips. Three inverter circuits are formed by this SiP and alternating-current power supplied from the three inverter circuits is supplied to each of the three phase coils of the BLDC motor. To this end, the present inventors have been considering using what including two or four SiPs mentioned above mounted over a circuit board (corresponding to the circuit board PB1 described later) as a control board (corresponding to the control board PB described later) controlling the six-phase BLDC motor or the 12-phase BLDC motor. The semiconductor device PKG described later corresponds to this SiP.

FIG. 1 is a circuit diagram schematically illustrating a circuit (motor drive system) formed in a control board controlling a 12-phase BLDC motor.

The motor MOT shown in FIG. 1 is a 12-phase BLDC motor and has 12 coils CL, each coil CL being respectively coupled to an inverter circuit INV. That is, an inverter circuit INV is correspondingly provided for each of the 12 coils of the motor MOT; therefore, the circuit in FIG. 1 has 12 inverter circuits INV in total. Since three inverter circuits INV are formed of the above-mentioned SiP (semiconductor device PKG), four of the SiPs are required in the circuit in FIG. 1. The four SiPs are coupled to a control circuit CT and controlled by the control circuit CT, each inverter circuit INV being thereby controlled. Alternating-current power is supplied from each inverter circuit INV to each coil CL coupled to the inverter circuit INV and the motor MOT is thereby driven.

Figure 2:
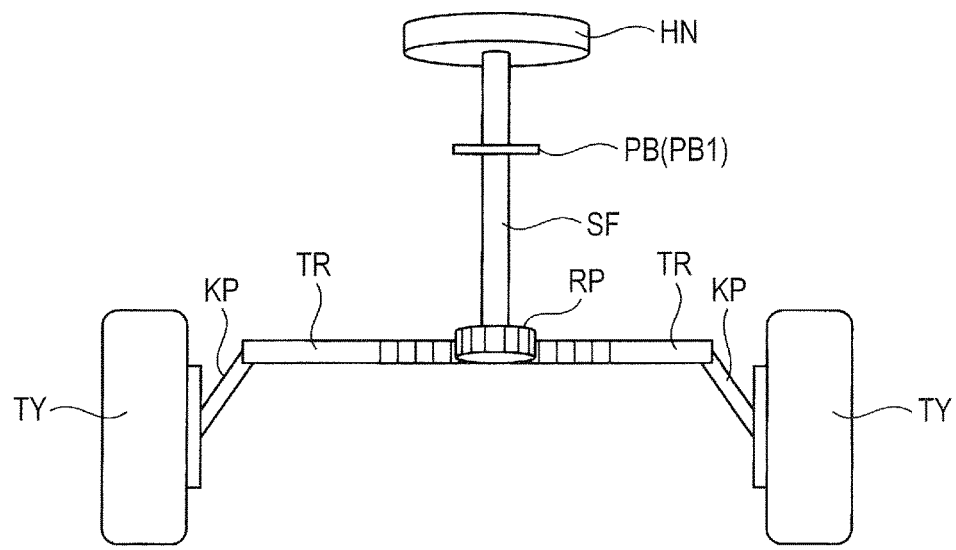
FIG. 2 is an explanatory drawing illustrating a rack-and-pinion steering mechanism of an automobile.

FIG. 2 is an explanatory drawing illustrating a rack-and-pinion steering mechanism of an automobile. The present inventors considered utilizing a space surrounding a steering shaft SF to dispose a control board (electronic device, module) PB in which the circuit in FIG. 1 is implemented in the steering mechanism in FIG. 2. That is, the present inventors considered passing the steering shaft SF through the control board PB.

In the steering mechanism shown in FIG. 2, a rack-and-pinion mechanism RP is provided at a tip of the steering shaft SF coupled to a wheel (steering wheel) HN. When the wheel HN is turned, the steering shaft SF is also rotated in conjunction therewith. This rotational motion is converted into horizontal movement at the rack-and-pinion mechanism RP and transmitted to tires TY via tie rods TR and kingpins KP. Thus, tires TY can be steered to change a direction thereof by operating (turning) the wheel HN.

Figure 3A:
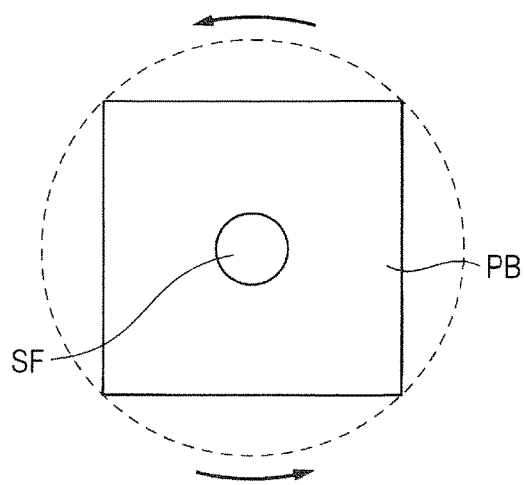
FIG. 3A is an explanatory drawing illustrating how a control board is rotated together with a steering shaft.
Figure 3B:
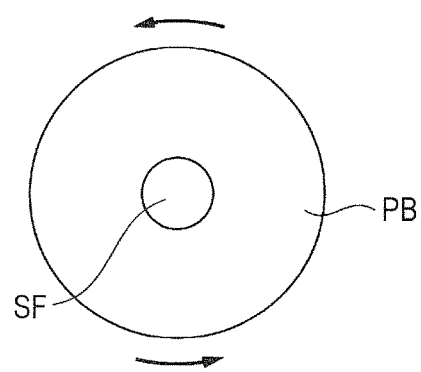
FIG. 3B is an explanatory drawing illustrating how a control board is rotated together with a steering shaft.

When the wheel HN is turned, the steering shaft SF is also rotated; therefore, in cases where the steering shaft SF penetrates the control board PB, the control board PB is also rotated together with the steering shaft SF. FIGS. 3A and 3B are explanatory drawings (plan views) illustrating how the control board PB is rotated together with the steering shaft SF. FIG. 3A shows a case where a planar shape of the control board PB is rectangular and FIG. 3B shows a case where a planar shape of the control board PB is circular.

A space required for the control board PB to rotate is least wasteful when a planar shape of the control board PB is circular. When a planar shape of the control board PB is rectangular as in FIG. 3A, a circular area whose diameter is equivalent to a length of a diagonal line of the rectangle is a space required for the control board PB to rotate. As a result, a space required for the control board PB to rotate is made larger than the dimensions of the control board PB. Meanwhile, when a planar shape of the control board PB is circular as in FIG. 3B, a space required for the control board PB to rotate is substantially identical in size with the control board PB. For this reason, by making a planar shape of the control board PB circular, it is possible to efficiently suppress increase in size of a space required to dispose the control board PB and to rotate the control board PB. For this reason, the present inventors have been considering adopting a control board PB having a circular planar shape and mounted with four SiPs as a control board PB controlling a 12-phase BLDC motor.

Circuitry

Figure 4:
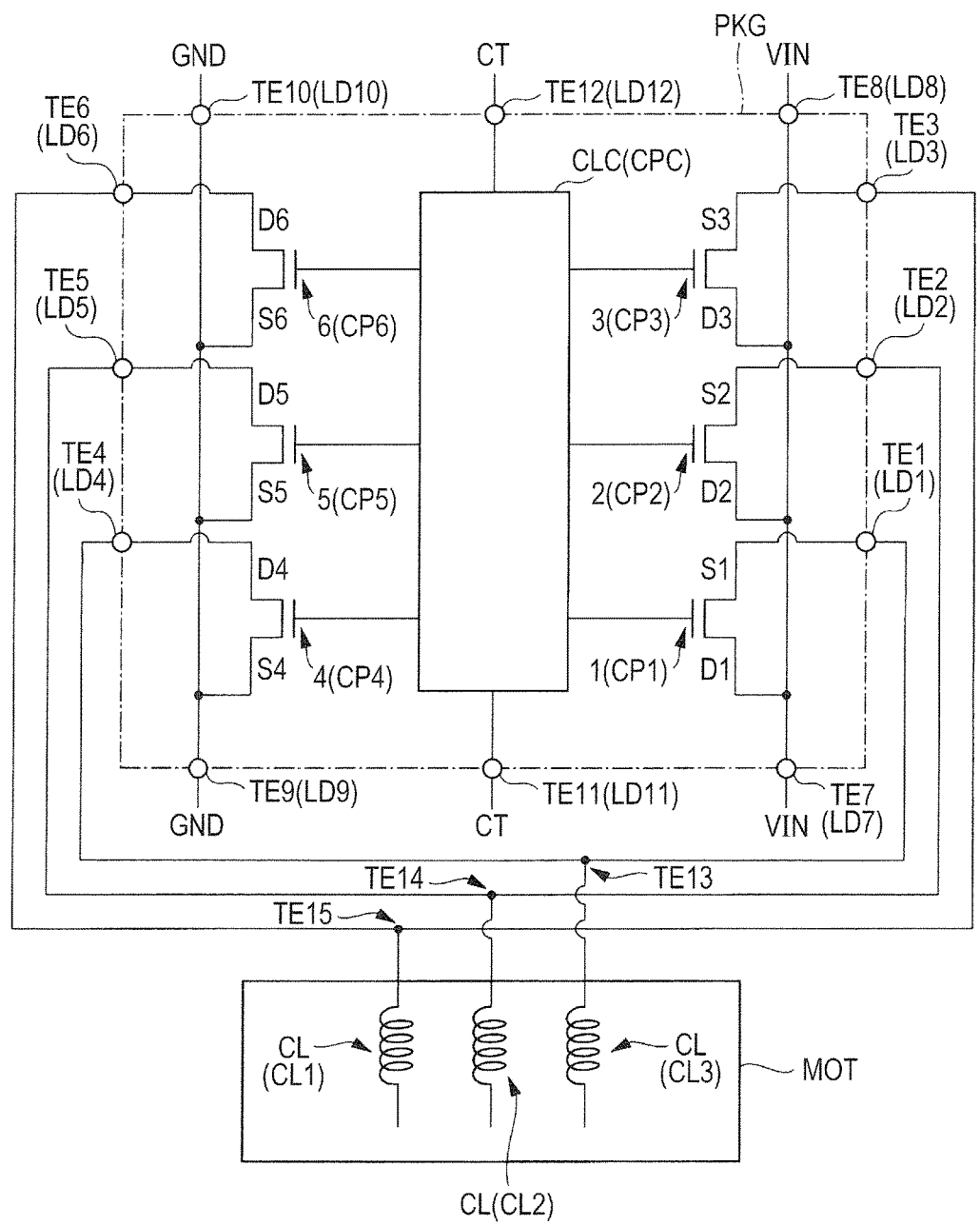
FIG. 4 is a circuit diagram illustrating an inverter circuit using a semiconductor device in an embodiment.

FIG. 4 is a circuit diagram illustrating an inverter circuit using a semiconductor device PKG in this embodiment. The area encircled with an alternate long and short dashed line is formed within the semiconductor device PKG.

The semiconductor device PKG used for the inverter circuits shown in FIG. 4 includes six power MOSFETs 1, 2, 3, 4, 5, 6 and a control circuit CLC. The control circuit CLC is formed within a semiconductor chip CPC. The power MOSFET 1 is formed within a semiconductor chip CP1; the power MOSFET 2 is formed within a semiconductor chip CP2; and the power MOSFET 3 is formed within a semiconductor chip CP3. The power MOSFET 4 is formed within a semiconductor chip CP4; the power MOSFET 5 is formed within a semiconductor chip CP5; and the power MOSFET 6 is formed within a semiconductor chip CP6. The seven semiconductor chips CP1 to CP6, CPC are sealed together to form the semiconductor device PKG.

The power MOSFETs 1, 4 and the control circuit CLC form one inverter circuit INV. The power MOSFETs 2, 5 and the control circuit CLC form another inverter circuit INV. The power MOSFETs 3, 6 and the control circuit CLC form a further inverter circuit INV. Therefore, three inverter circuits INV are formed by one semiconductor device PKG.

The control circuit CLC is a circuit that controls a potential of each respective gate of the power MOSFETs 1 to 6 and controls operation of each of the power MOSFETs 1 to 6 in response to a signal or the like supplied from a control circuit CT external to the semiconductor device PKG to the control circuit CLC. Each gate of the power MOSFETs 1 to 6 is coupled to a driver circuit in the control circuit CLC.

A source (S1) of the power MOSFET 1 is coupled to a terminal TE1; a source (S2) of the power MOSFET 2 is coupled to a terminal TE2; and a source (S3) of the power MOSFET 3 is coupled to a terminal TE3. A drain (D4) of the power MOSFET 4 is coupled to a terminal TE4; a drain (D5) of the power MOSFET 5 is coupled to a terminal TE5; and a drain (D6) of the power MOSFET 6 is coupled to a terminal TE6. A drain (D1) of the power MOSFET 1, a drain (D2) of the power MOSFET 2, and a drain (D3) of the power MOSFET 3 are coupled to a terminal TE7 and a terminal TE8. A source (S4) of the power MOSFET 4, a source (S5) of the power MOSFET 5, and a source (S6) of the power MOSFET 6 are coupled to a terminal TE9 and a terminal TE10.

The terminals TE1 to TE12 are all external connection terminals of the semiconductor device PKG and are formed of a lead LD described later. Of these terminals, the terminals TE7, TE8 are terminals for supplying a supply potential and the lead LD7 described later corresponds to the terminal TE7 and the lead LD8 described later corresponds to the terminal TE8. The terminals TE9, TE10 are terminals for supplying a reference potential and the lead LD9 described later corresponds to the terminal TE9 and the lead LD10 described later corresponds to the terminal TE10. The terminals TE7, TE8 (leads LD7, LD8) are supplied with a high potential-side potential (supply potential) VIN of a power supply (inputting power supply) external to the semiconductor device PKG and the terminals TE9, TE10 (leads LD9, LD10) are supplied with a reference potential, for example, a ground potential (grounding potential) GND lower than the potential VIN supplied to the terminals TE7, TE8. The lead LD1 described later corresponds to the terminal TE1; the lead LD2 described later corresponds to the terminal TE2; the lead LD3 described later corresponds to the terminal TE3; the lead LD4 described later corresponds to the terminal TE4; the lead LD5 described later corresponds to the terminal TE5; and the lead LD6 described later corresponds to the terminal TE6.

The terminal TE1 (lead LD1) and the terminal TE4 (lead LD4) are electrically coupled with each other outside the semiconductor device PKG. That is, the source (S1) of the power MOSFET 1 and the drain (D4) of the power MOSFET 4 are electrically coupled with each other via a conductive path provided outside the semiconductor device PKG. For this reason, the power MOSFET 1 and the power MOSFET 4 are coupled in series between the terminals TE7, TE8 and the terminals TE9, TE10 and the power MOSFET 1 corresponds to MOSFET for high side and the power MOSFET 4 corresponds to MOSFET for low side.

The terminal TE2 (lead LD2) and the terminal TE5 (lead LD5) are electrically coupled with each other outside the semiconductor device PKG. That is, the source (S2) of the power MOSFET 2 and the drain (D5) of the power MOSFET 5 are electrically coupled with each other via a conductive path provided outside the semiconductor device PKG. For this reason, the power MOSFET 2 and the power MOSFET 5 are coupled in series between the terminals TE7, TE8 and the terminals TE9, TE10 and the power MOSFET 2 corresponds to MOSFET for high side and the power MOSFET 5 corresponds to MOSFET for low side.

The terminal TE3 (lead LD3) and the terminal TE6 (lead LD6) are electrically coupled with each other outside the semiconductor device PKG. That is, the source (S3) of the power MOSFET 3 and the drain (D6) of the power MOSFET 6 are electrically coupled with each other via a conductive path provided outside the semiconductor device PKG. For this reason, the power MOSFET 3 and the power MOSFET 6 are coupled in series between the terminals TE7, TE8 and the terminals TE9, TE10 and the power MOSFET 3 corresponds to MOSFET for high side and the power MOSFET 6 corresponds to MOSFET for low side.

Each of the power MOSFETs 1, 2, 3 is a power transistor for high-side (high potential-side) switch and each of the power MOSFETs 4, 5, 6 is a power transistor for low-side (low potential-side) switch. Thus, the power MOSFETs 1, 2, 3, 4, 5, 6 can be all considered as a switching power transistor.

However, neither of the conductive path electrically coupling the terminals TE1, TE4, the conductive path electrically coupling the terminals TE2, TE5, and the conductive path electrically coupling the terminals TE3, TE6 is provided within the semiconductor device PKG but these conductive paths are all provided outside the semiconductor device PKG and provided, for example, in the circuit board PB1 described later mounted with the semiconductor device PKG. For this reason, a junction point TE13 between the power MOSFET 1 (source S1) and the power MOSFET 4 (drain D4), a junction point TE14 between the power MOSFET 2 (source S2) and the power MOSFET 5 (drain D5), and a junction point TE15 between the power MOSFET 3 (source S3) and the power MOSFET 6 (drain D6) are provided (in the circuit board PB1) outside the semiconductor device PKG. Each of the junction points TE13, TE14, TE15 is coupled to a coil (load) CL of the motor MOT. For example, a coil CL coupled to the junction point TE13 is a coil CL3 for W phase, a coil CL coupled to the junction point TE14 is a coil CL2 for V phase, and a coil CL coupled to the junction point TE15 is a coil CL1 for U phase.

Direct-current power supplied to an inverter circuit (INV) formed of the power MOSFETs 1, 4 and the control circuit CLC is converted into alternating-current power and supplied to a coil CL (CL3) of the motor MOT. Direct-current power supplied to an inverter circuit (INV) formed of the power MOSFETs 2, 5 and the control circuit CLC is converted into alternating-current power and supplied to a coil CL (CL2) of the motor MOT. Direct-current power supplied to an inverter circuit (INV) formed of the power MOSFETs 3, 6 and the control circuit CLC is converted into alternating-current power and supplied to a coil CL (CL1) of the motor MOT. The motor MOT is driven on alternating-current power supplied from each inverter circuit.

The lead LD11 described later corresponds to a terminal TE11 and the lead LD12 described later corresponds to a terminal TE12. The control circuit CLC is coupled to the terminals TE11, TE12 (leads LD11, LD12) and the terminals TE11, TE12 (leads LD11, LD12) are coupled to the above-mentioned control circuit CT provided outside the semiconductor device PKG.

Each semiconductor chip CP1 to CP6 incorporates not only a power MOSFET (1 to 6) but also a current detecting sense MOSFET (not shown) and a temperature detecting diode (not shown). As a result, a current, a voltage, and a temperature of each semiconductor chip CP1 to CP6 can be detected with the above-mentioned control circuit (digital and analog mixed circuit) CLC. Thermal resistance between the semiconductor chips CP1 to CP6 and the heat sink HS described later is sufficiently smaller than thermal resistance between the semiconductor chips CP1 to CP6 and the controlling semiconductor chip CPC. Therefore, even when a temperature of a semiconductor chip CP1 to CP6 reaches, for example, 175° C., there is a low probability that a temperature of the controlling semiconductor chip CPC will reach 175° C. For this reason, in cases where a temperature of each power (switching) semiconductor chip CP1 to CP6 is detected with the control circuit CLC in the controlling semiconductor chip CPC, an advantage is brought about. When the temperature reaches a predetermined limit temperature (for example, 175° C.), thermal destruction of the entire semiconductor device PKG can be prevented by stopping an operation of the power semiconductor chips CP1 to CP6 with a thermal shutdown circuit provided in the control circuit CLC. For this reason, even when the semiconductor device PKG adopts a structure in which the controlling semiconductor chip CPC is surrounded with the power semiconductor chips CP1 to CP6 as viewed in a plane, as described later, it is possible to prevent a trouble in the controlling semiconductor chip CPC caused by heat produced in the power semiconductor chips CP1 to CP6.

The thermal shutdown circuit cited here refers to a circuit that when a bonding temperature of a semiconductor chip (power semiconductor chip) of interest abnormally rises (for example, to 150 to 200° C.), shuts off an output voltage to lower the temperature of the semiconductor chip to a safe level. The principle of operation of the thermal shutdown circuit is, for example, as follows: a forward voltage (Vf) of a temperature detecting diode built in a power semiconductor chip and a reference voltage (Vk) are inputted to a comparator in the thermal shutdown circuit; when a temperature of the temperature detecting diode rises to a predetermined temperature, a magnitude relation between the forward voltage (Vf) of the diode and the reference voltage (Vk) is inverted and an output of the comparator is switched; and a gate of a power MOSFET in the power semiconductor chip can be controlled to stop an operation of the power MOSFET by feeding this on/off back to a predriver in a control circuit CLC. The comparator is an element that compares inputted two voltages or currents and switches an output thereof depending on which is larger.

Structure of Semiconductor Device

Figure 5:
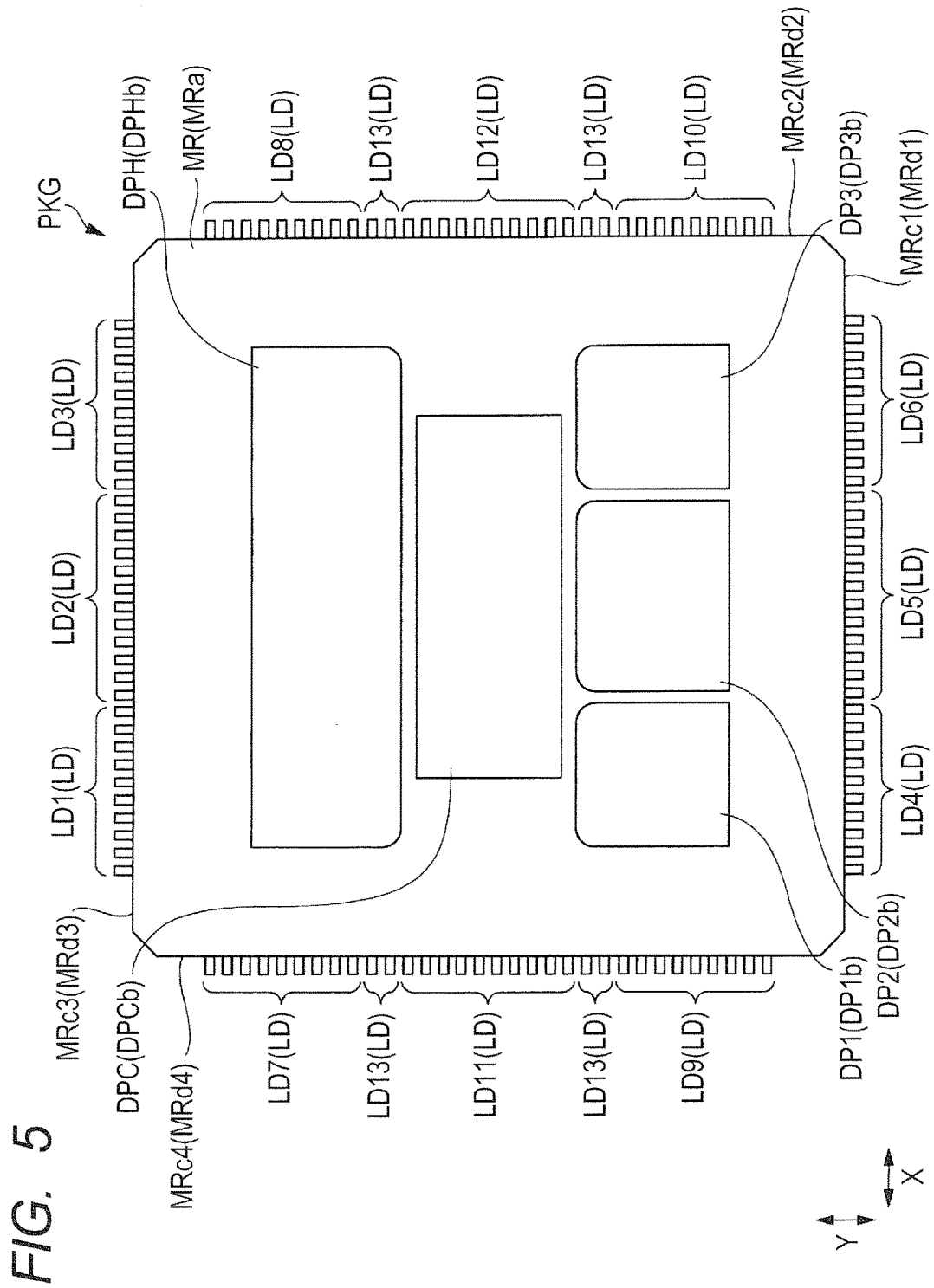
FIG. 5 is a top view of a semiconductor device in an embodiment.
Figure 6:
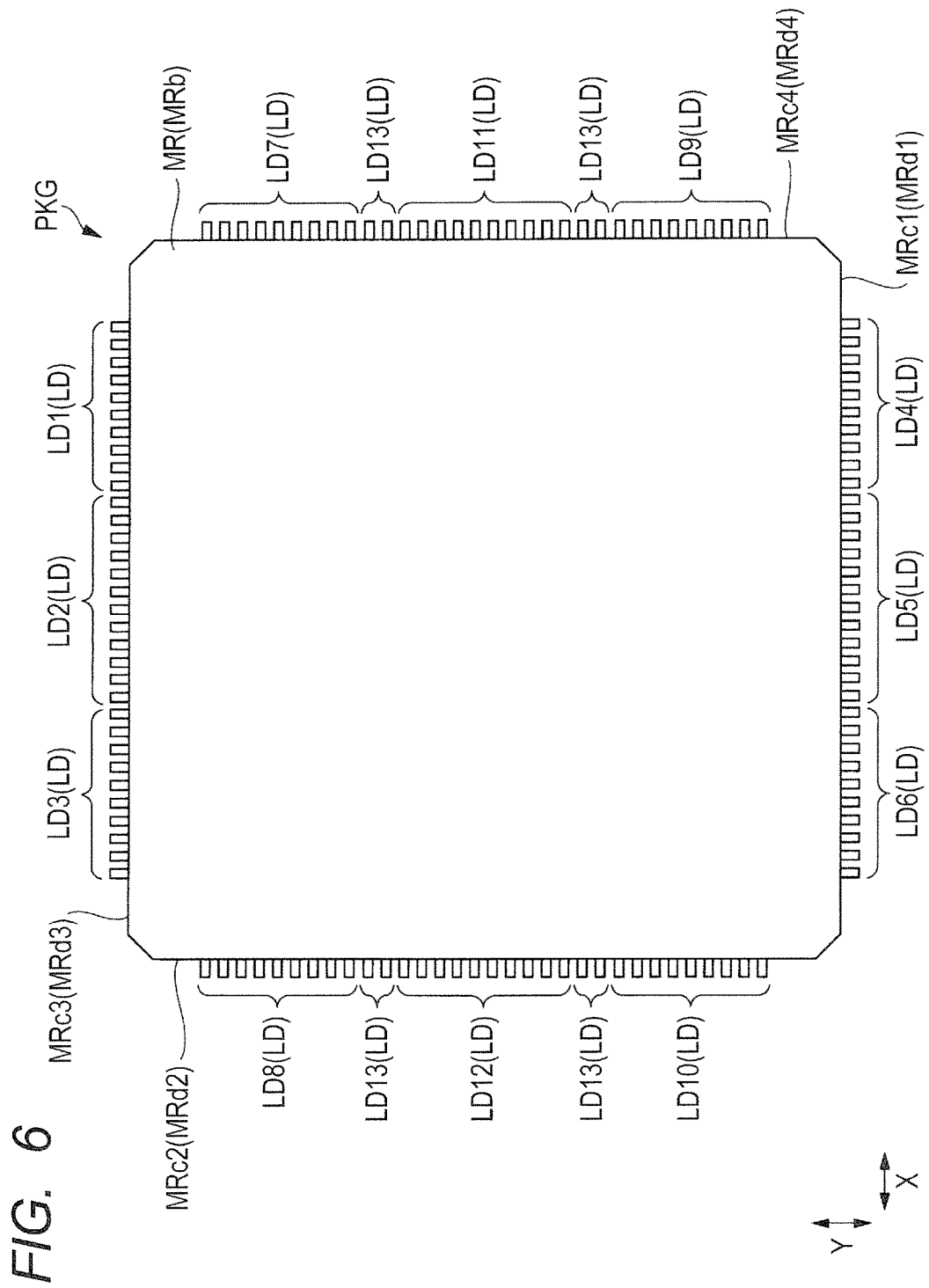
FIG. 6 is a bottom view of a semiconductor device in an embodiment.
Figure 7:
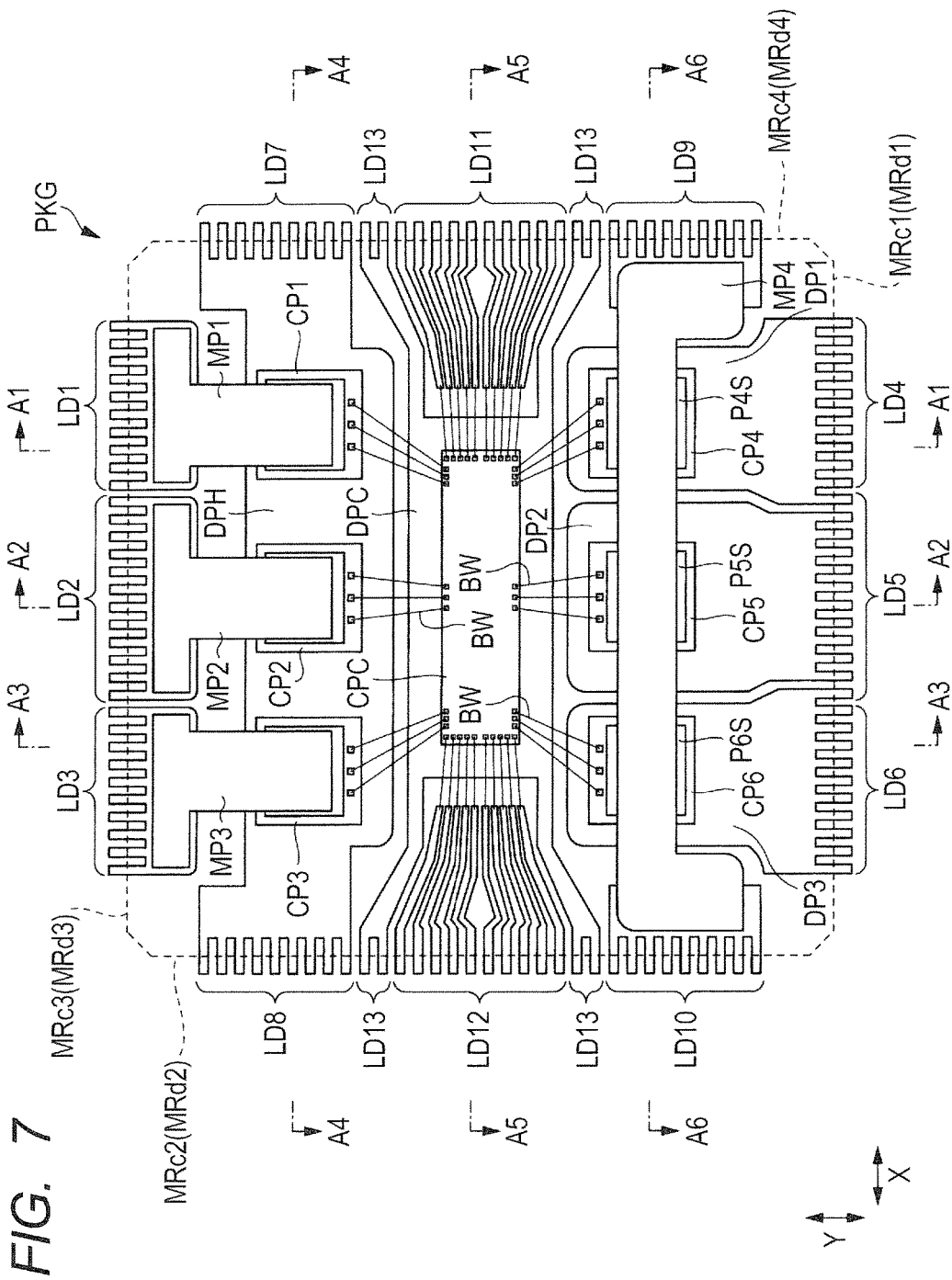
FIG. 7 is a planar perspective view of a semiconductor device in an embodiment.
Figure 8:
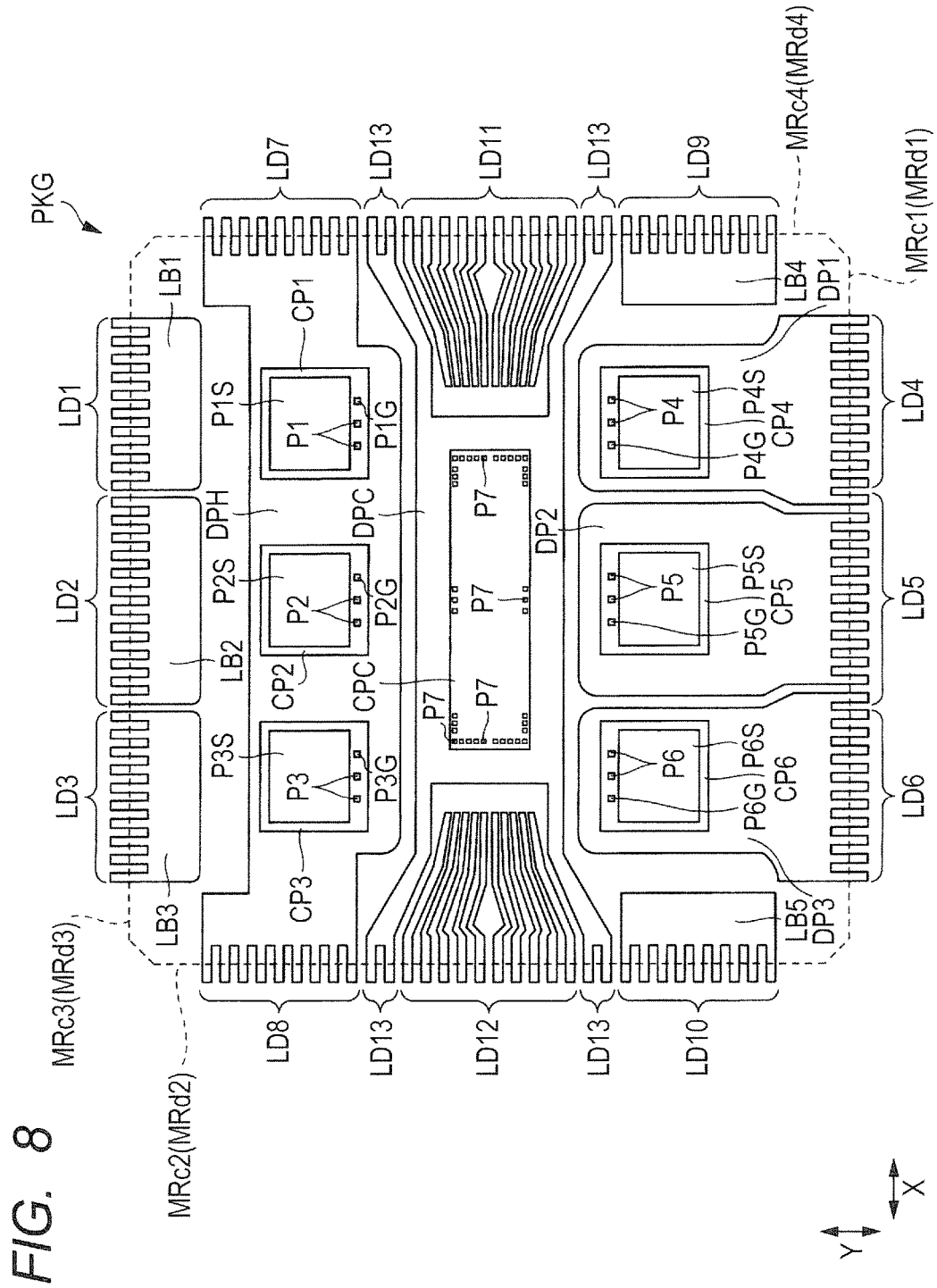
FIG. 8 is a planar perspective view of a semiconductor device in an embodiment.
Figure 9:
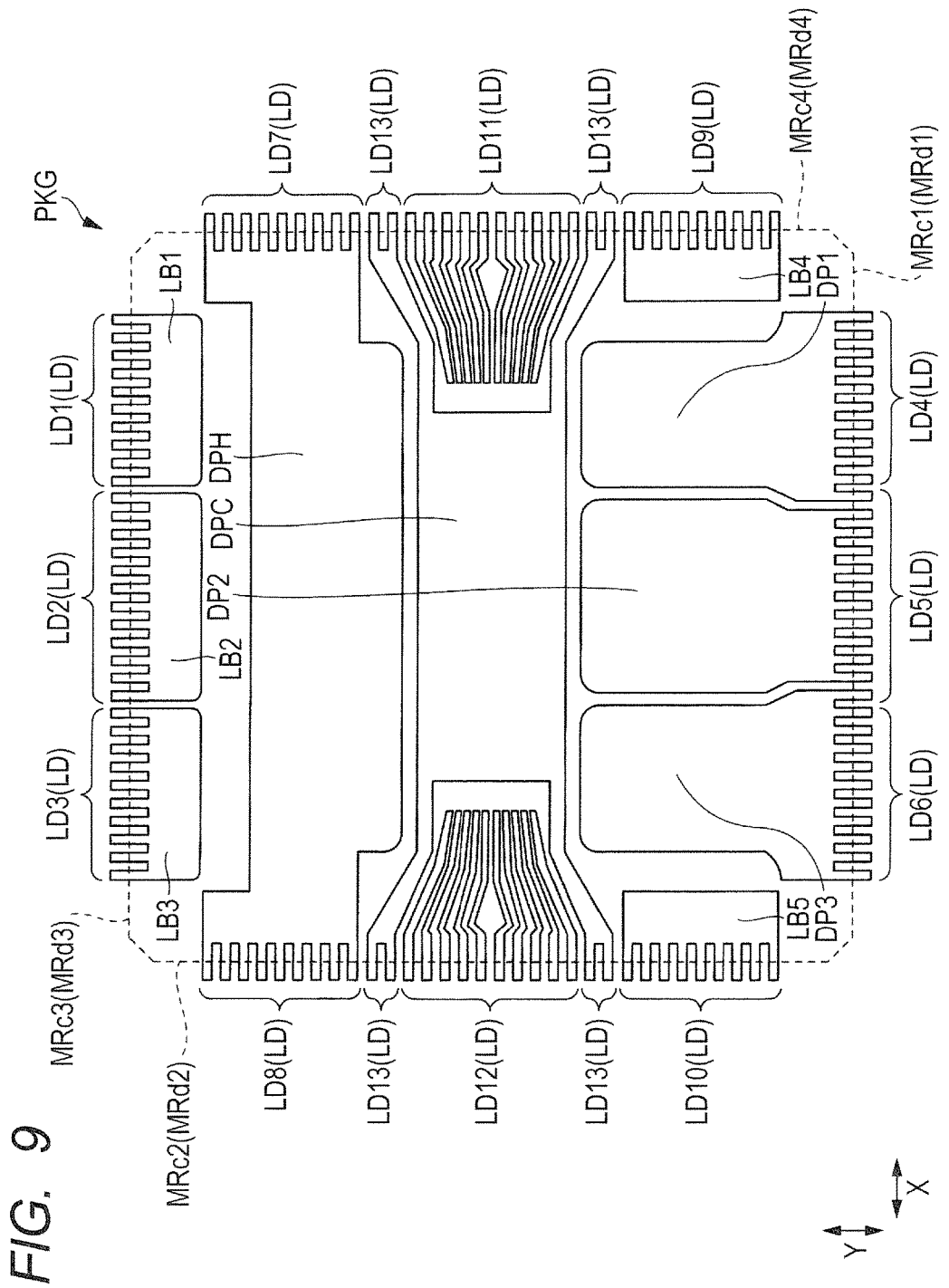
FIG. 9 is a planar perspective view of a semiconductor device in an embodiment.
Figure 10:
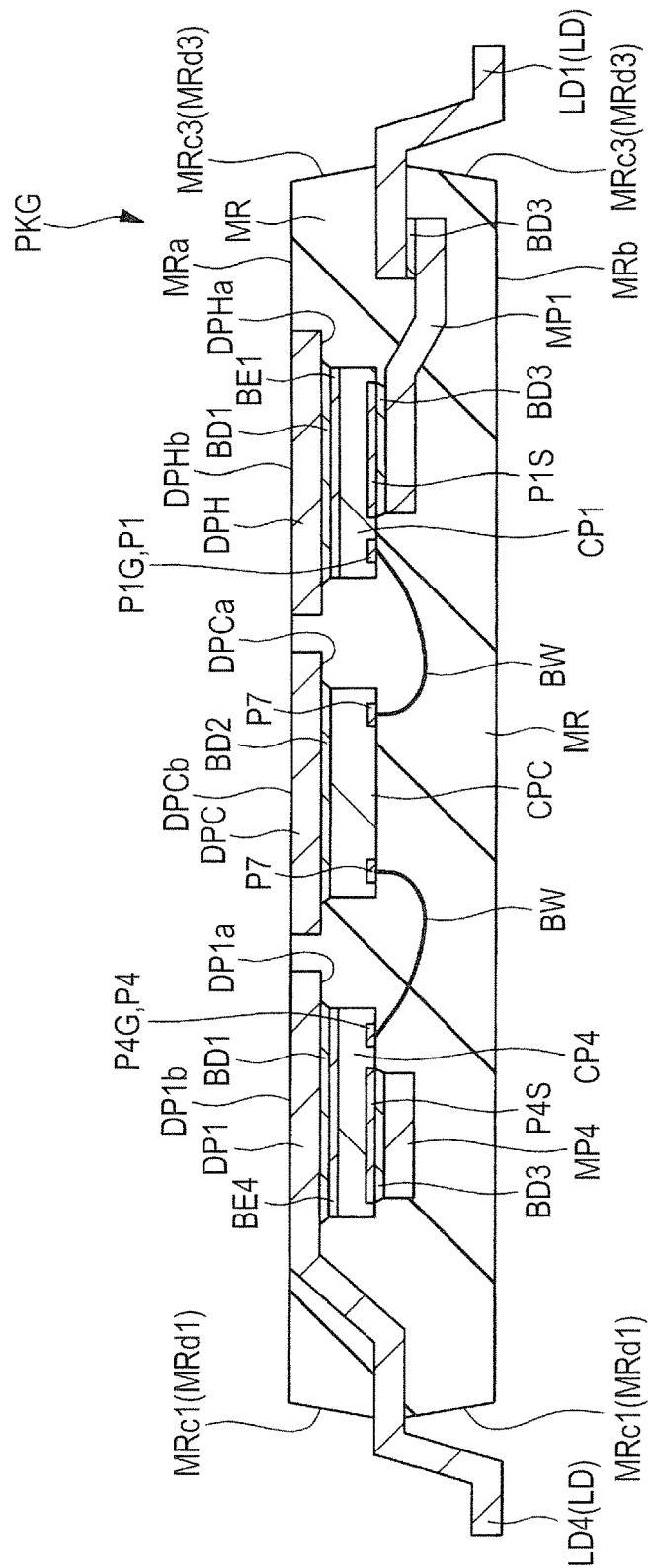
FIG. 10 is a sectional view of a semiconductor device in an embodiment.
Figure 11:
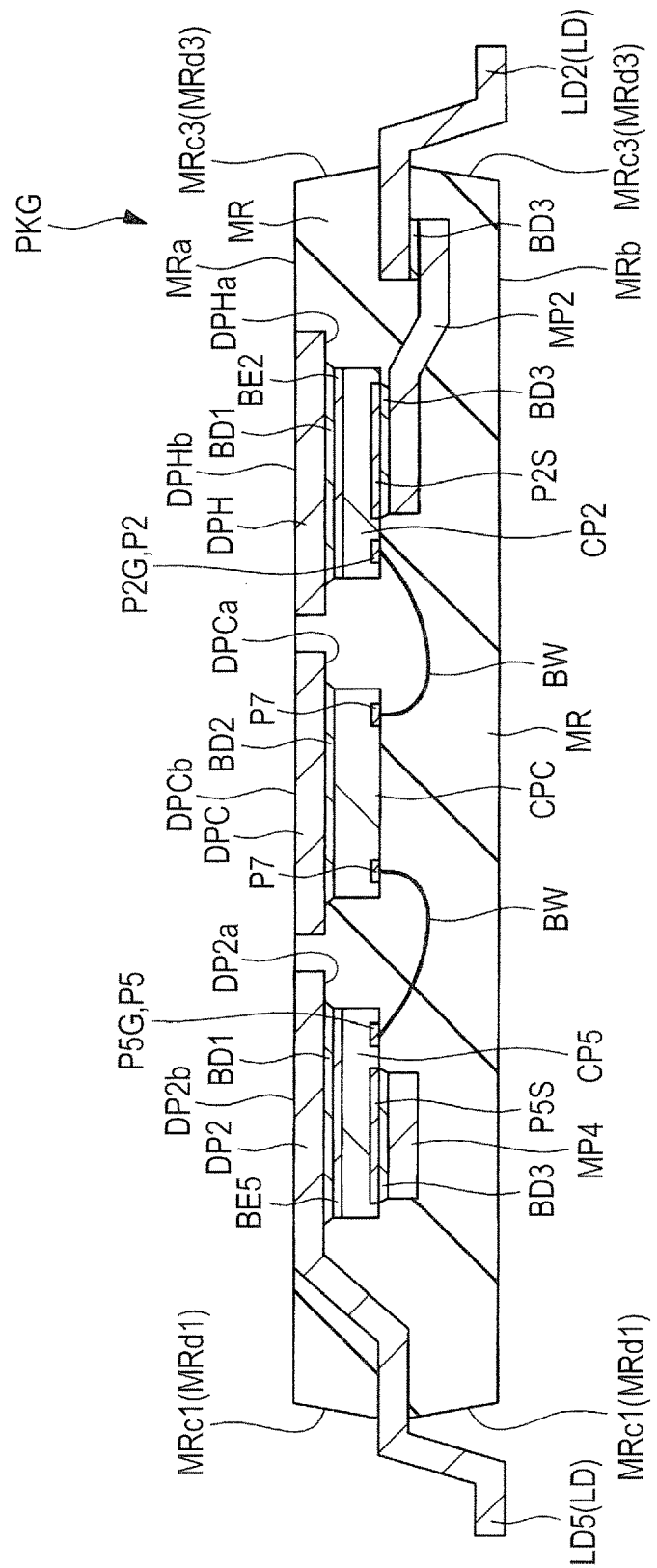
FIG. 11 is a sectional view of a semiconductor device in an embodiment.
Figure 12:
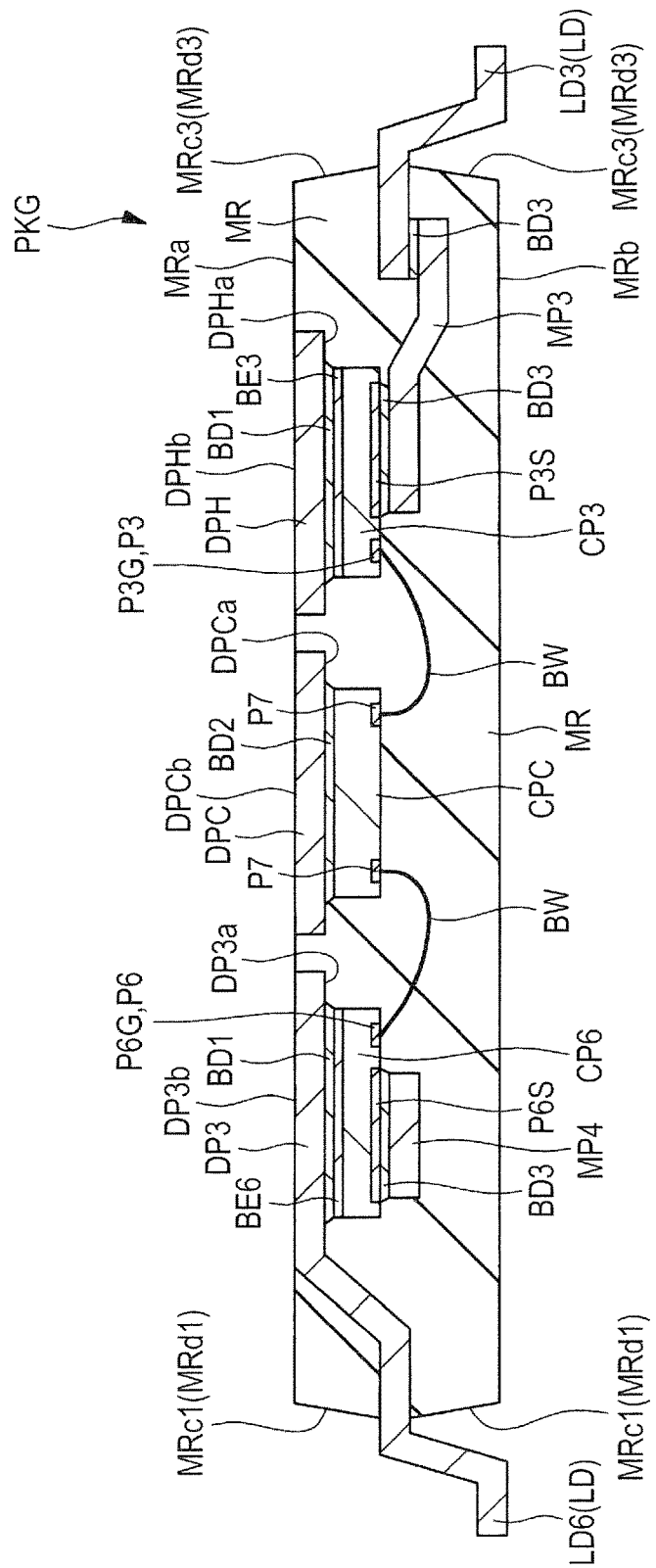
FIG. 12 is a sectional view of a semiconductor device in an embodiment.
Figure 13:
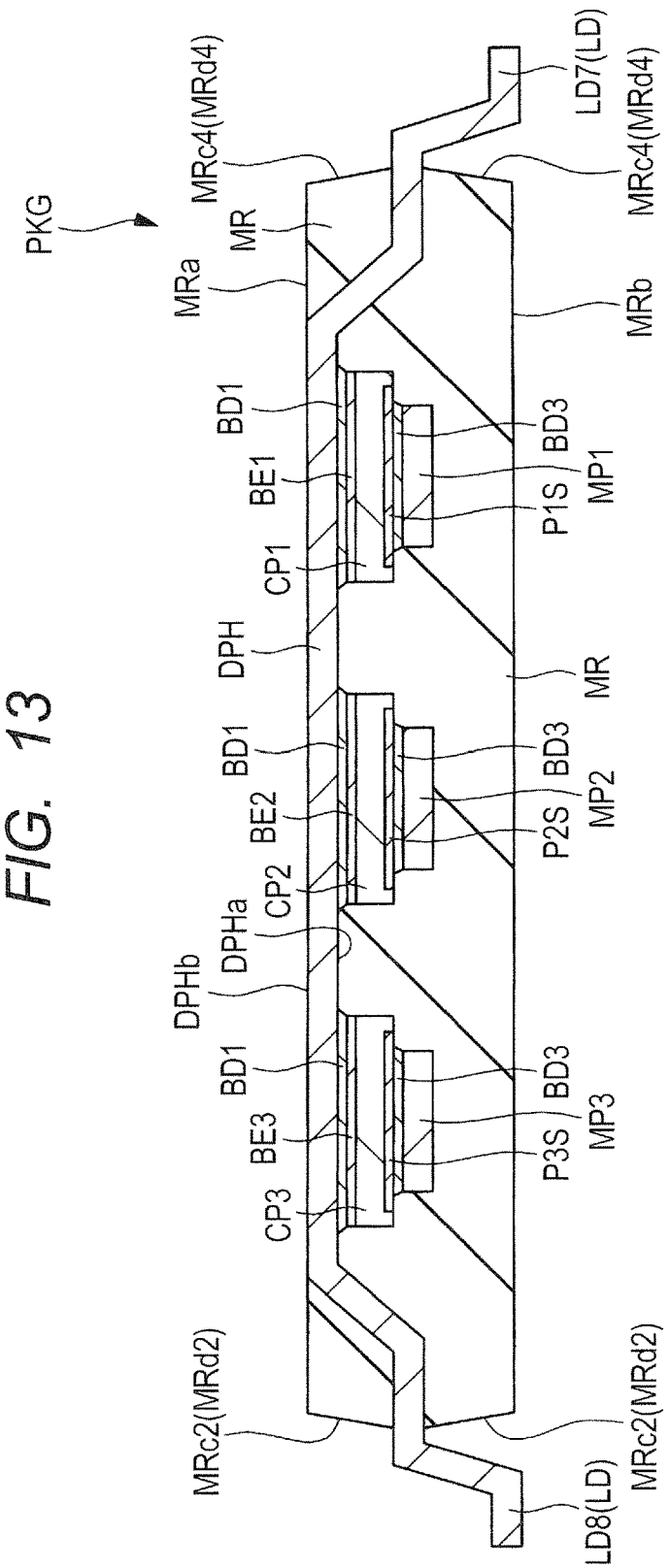
FIG. 13 is a sectional view of a semiconductor device in an embodiment.
Figure 14:
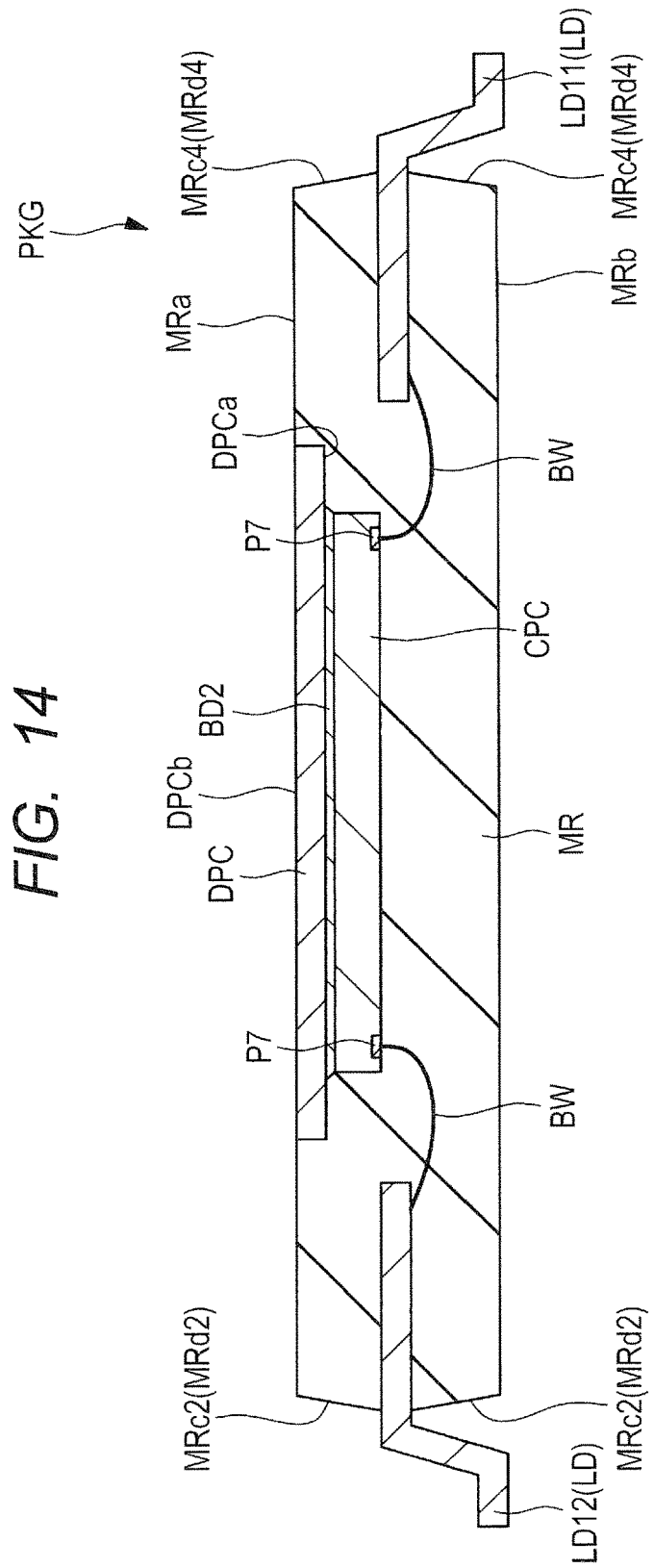
FIG. 14 is a sectional view of a semiconductor device in an embodiment.
Figure 15:
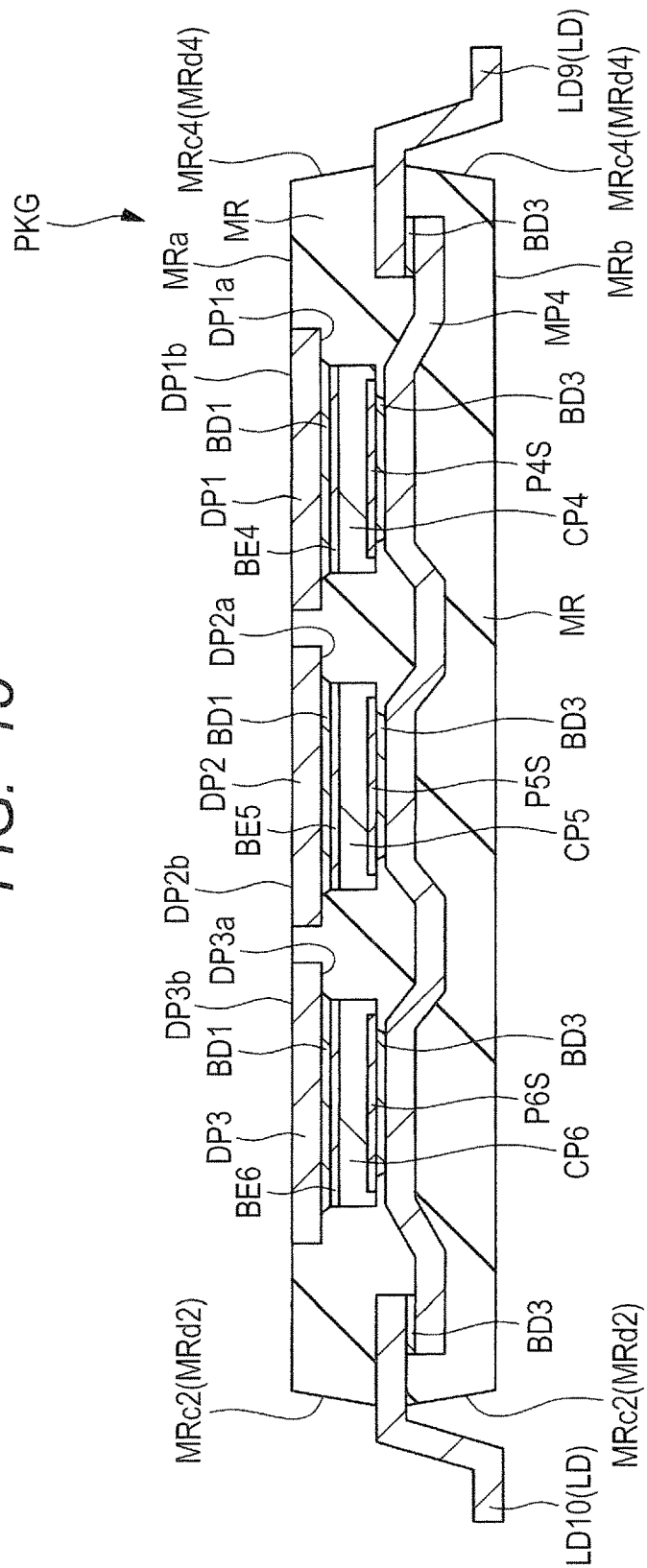
FIG. 15 is a sectional view of a semiconductor device in an embodiment.

FIG. 5 is a top view of a semiconductor device PKG in this embodiment; FIG. 6 is a bottom view of the semiconductor device PKG; FIG. 7 to FIG. 9 are planar perspective views of the semiconductor device PKG; and FIG. 10 to FIG. 15 are sectional views of the semiconductor device PKG. FIG. 7 is a planar perspective view of the semiconductor device PKG as viewed from the undersurface side with a sealing portion MR seen through. FIG. 8 shows the semiconductor device in FIG. 7 with wires BW and metal plates MP1, MP2, MP3, MP4 further seen through (omitted). FIG. 9 shows the semiconductor device in FIG. 8 with semiconductor chips CPC, CP1 to CP6 further seen through (omitted). Since in FIG. 6 to FIG. 9, the semiconductor devices PKG are identical in orientation, a position of each side face MRc1, MRc2, MRc3, MRc4 (side MRd1, MRd2, MRd3, MRd4) of the sealing portion MR is identical in FIG. 6 to FIG. 9. In FIG. 7 to FIG. 9, a position of the periphery of the sealing portion MR is indicated by a broken line. A section taken along line A1-A1 of FIG. 7 substantially corresponds to FIG. 10; a section taken along line A2-A2 of FIG. 7 substantially corresponds to FIG. 11; and a section taken along line A3-A3 of FIG. 7 substantially corresponds to FIG. 12. A section taken along line A4-A4 of FIG. 7 substantially corresponds to FIG. 13; a section taken along line A5-A5 of FIG. 7 substantially corresponds to FIG. 14; and a section taken along line A6-A6 of FIG. 7 substantially corresponds to FIG. 15. The symbol X shown in each plan view indicates a first direction and the symbol Y indicates a second direction intersecting with (more specifically, orthogonal to) the first direction. Hereafter, the first direction is referred to as an X direction and the second direction intersecting with (more specifically, orthogonal to) the X direction is referred to as a Y direction. That is, the X direction and the Y direction are directions intersecting with each other and, more specifically, directions orthogonal to each other.

In this embodiment, a semiconductor chip (controlling semiconductor chip) CPC with the above-mentioned control circuit CLC formed therein and semiconductor chips (power semiconductor chips) CP1, CP2, CP3, CP4, CP5, CP6 with the above-mentioned power MOSFETs 1, 2, 3, 4, 5, 6 respectively formed therein are integrated (packaged) into a single semiconductor package to configure one semiconductor device PKG. This makes it possible to reduce a size and a profile of an electronic device (for example, the above-mentioned control board PB), and in addition, reduce a wiring parasitic inductance, and this leads to higher frequencies and higher efficiency.

The semiconductor device (semiconductor package, semiconductor module, electronic device, SiP) PKG in this embodiment shown in FIG. 5 to FIG. 15 is a semiconductor device in a resin sealed semiconductor package, and in this example, a QFP (Quad Flat Package) semiconductor device. Hereafter, a description will be given to a configuration of the semiconductor device PKG with reference to FIG. 5 to FIG. 15.

The semiconductor device PKG in this embodiment shown in FIG. 5 to FIG. 15 includes: die pads (chip mounting portions) DPC, DPH, DP1, DP2, DP3; semiconductor chips CPC, CP1, CP2, CP3, CP4, CP5, CP6; metal plates MP1, MP2, MP3, MP4; a plurality of wires (bonding wires) BW; a plurality of leads LD; and a sealing portion (sealing body) MR sealing these items.

Hereafter, the semiconductor chips CP1, CP2, CP3, CP4, CP5, CP6 may be referred to as semiconductor chips CP1 to CP6, the metal plates MP1, MP2, MP3, MP4 may be referred to as metal plates MP1 to MP4, and the die pads DP1, DP2, DP3 may be referred to as die pads DP1 to DP3. This is the same with other members and the like.

The sealing portion MR as a resin sealing portion (resin sealing body) is formed of a resin material, such as a thermosetting resin material, and may contain filler or the like. The sealing portion MR can be formed using epoxy resin or the like containing filler. Aside from epoxy-based resin, for example, biphenyl-based thermosetting resin with a phenol-based curing agent, silicone rubber, filler, or the like added thereto may be used as a material of the sealing portion MR for stress reduction or the like.

The sealing portion MR includes a principal surface (top face) MRa, a back face (under surface, bottom face) MRb located on the opposite side to the principal surface MRa, and side faces MRc1, MRc2, MRc3, MRc4 intersecting with the principal surface MRa and the back face MRb.

That is, the appearance of the sealing portion MR is in the shape of a thin plate surrounded with the principal surface MRa, the back face MRb, and the side faces MRc1 to MRc4. Of the side faces MRc1 to MRc4 of the sealing portion MR, the side face MRc1 and the side face MRc3 are positioned on the opposite side to each other; the side face MRc2 and the side face MRc4 are positioned on the opposite side to each other; the side face MRc1 and the side faces MRc2, MRc4 intersect with each other; and the side face MRc3 and the side faces MRc2, MRc4 intersect with each other. The side faces MRc1, MRc3 are substantially parallel to the X direction and the side faces MRc2, MRc4 are substantially parallel to the Y direction. Each of the principal surface MRa and the back face MRb is parallel both to the X direction and to the Y direction.

As viewed in a plane, the sealing portion MR includes: a side MRd1 extending along the X direction; a side MRd3 extending along the X direction and positioned on the opposite side to the side MRd1; a side MRd2 extending along the Y direction; and a side MRd4 extending along the Y direction and positioned on the opposite side to the side MRd2. As viewed in a plane, each of the sides MRd2, MRd4 intersects with the sides MRd1, MRd3. In the sealing portion MR, the side MRd1 is a side corresponding to the side face MRc1, the side MRd2 is a side corresponding to the side face MRc2, the side MRd3 is a side corresponding to the side face MRc3, and the side MRd4 is a side corresponding to the side face MRc4. That is, as viewed in a plane, each side face MRc1 to MRc4 of the sealing portion MR can be considered as each side MRd1 to MRd4 of the sealing portion MR.

A planar shape of the sealing portion MR, that is, a planar shape of each of the principal surface MRa and the back face MRb of the sealing portion MR is, for example, rectangular (oblong). The rectangle configuring the planar shape of the sealing portion MR is a rectangle having a side parallel to the X direction and a side parallel to the Y direction.

A part of each of the leads LD is sealed in the sealing portion MR and another part is protruded from a side face of the sealing portion MR to outside the sealing portion MR. Hereafter, a portion of a lead LD positioned in the sealing portion MR will be referred to as an inner lead portion and a portion of a lead LD positioned outside the sealing portion MR will be referred to as an outer lead portion. On the outer lead portion of a lead LD, a plating layer (not shown) such as a solder plating layer may be formed. This makes it possible to facilitate mounting the semiconductor device PKG over a circuit board or the like.

The semiconductor device PKG in this embodiment has a structure in which a part (outer lead portion) of each lead LD is protruded from a side face of the sealing portion MR. The following description will be given based on this structure but the present invention is not limited to this structure. For example, a QFN (Quad Flat Nonleaded Package) configuration in which each lead LD is hardly protruded from a side face of the sealing portion MR and a part of each lead LD is exposed at the back face MRb of the sealing portion MR may be adopted. However, the QFP brings about an advantage that solder wettability is enhanced during mounting to a circuit board or the like as compared with the QFN.

The leads LD provided in the semiconductor device PKG are comprised of a plurality of leads LD disposed on the side face MRc1 side of the sealing portion MR, a plurality of leads LD disposed on the side face MRc2 side of the sealing portion MR, a plurality of leads LD disposed on the side face MRc3 side of the sealing portion MR, and a plurality of leads LD disposed on the side face MRc4 side of the sealing portion MR.

As viewed in a plane, the leads LD disposed on the side face MRc1 side of the sealing portion MR can be considered as leads LD intersecting with the side MRd1 of the sealing portion MR. As viewed in a plane, the leads LD disposed on the side face MRc2 side of the sealing portion MR can be considered as leads LD intersecting with the side MRd2 of the sealing portion MR. As viewed in a plane, the leads LD disposed on the side face MRc3 side of the sealing portion MR can be considered as leads LD intersecting with the side MRd3 of the sealing portion MR. As viewed in a plane, the leads LD disposed on the side face MRc4 side of the sealing portion MR can be considered as leads LD intersecting with the side MRd4 of the sealing portion MR.

As viewed in a plane, the leads LD (that is, the leads LD4, LD5, LD6) disposed on the side face MRc1 side of the sealing portion MR are extended in the Y direction and arranged at predetermined intervals in the X direction; and the outer lead portion of each of the leads LD (LD4, LD5, LD6) is protruded from the side face MRc1 of the sealing portion MR to outside the sealing portion MR. As viewed in a plane, the leads LD (that is, the leads LD8, LD10, LD12, LD13) disposed on the side face MRc2 side of the sealing portion MR are extended in the X direction and arranged at predetermined intervals in the Y direction; and the outer lead portion of each of the leads LD (LD8, LD10, LD12, LD13) is protruded from the side face MRc2 of the sealing portion MR to outside the sealing portion MR. As viewed in a plane, the leads LD (that is, the leads LD1, LD2, LD3) disposed on the side face MRc3 side of the sealing portion MR are extended in the Y direction and arranged at predetermined intervals in the X direction; and the outer lead portion of each of the leads LD (LD1, LD2, LD3) is protruded from the side face MRc3 of the sealing portion MR to outside the sealing portion MR. As viewed in a plane, the leads LD (that is, the leads LD7, LD9, LD11, LD13) disposed on the side face MRc4 side of the sealing portion MR are extended in the X direction and arranged at predetermined intervals in the Y direction; and the outer lead portion of each of the leads LD (LD7, LD9, LD11, LD13) is protruded from the side face MRc4 of the sealing portion MR to outside the sealing portion MR. The outer lead portion of each lead LD is folded such that the under surface in the vicinity of an end portion of the outer lead portion is substantially flush with the back face MRb of the sealing portion MR. The outer lead portion of each lead LD functions as an external terminal of the semiconductor device PKG.

The die pad DPC is a chip mounting portion for mounting the semiconductor chip CPC. The die pad DPH is a chip mounting portion for mounting the semiconductor chips CP1, CP2, CP3. The die pad DP1 is a chip mounting portion for mounting the semiconductor chip CP4. The die pad DP2 is a chip mounting portion for mounting the semiconductor chip CP5. The die pad DP3 is a chip mounting portion for mounting the semiconductor chip CP6. A planar shape of each of the die pads DPC, DPH, DP1 to DP3 is, for example, a rectangle having a side parallel to the X direction and a side parallel to the Y direction. The three semiconductor chips CP1, CP2, CP3 are disposed over the die pad DPH in line in the X direction and the die pad DPH is larger in size in the X direction than in the Y direction with this disposition reflected. The semiconductor chip CPC is larger in size in the X direction than in the Y direction and the die pad DPC is larger in size in the X direction than in the Y direction with this reflected. For this reason, a lengthwise direction of each of the die pad DPH, the die pad DPC, and the semiconductor chip CPC is the X direction.

In the semiconductor device PKG, the die pad DP1, the die pad DP2, and the die pad DP3 are lined in this order and disposed in the X direction and this set of the die pads DP1, DP2, DP3, the one die pad DPC, and the one die pad DPH are lined in this order and disposed in the Y direction. In the Y direction, the die pads DP1, DP2, DP3 are positioned on the side face MRc1 side of the sealing portion MR and the die pad DPH is positioned on the side face MRc3 side of the sealing portion MR; and the die pad DPC is disposed between the die pad DPH and the set of the die pads DP1, DP2, DP3.

With respect to the die pads DP1, DP2, DP3, in the X direction, the die pad DP1 is positioned on the side face MRc4 side of the sealing portion MR; the die pad DP3 is positioned on the side face MRc2 side of the sealing portion MR; and the die pad DP2 is positioned between the die pad DP1 and the die pad DP3. However, the die pad DPH, the die pad DPC, the die pad DP1, the die pad DP2, and the die pad DP3 are not in contact with one another and spaced at predetermined intervals from one another. A part of the sealing portion MR is located between these items.

The die pads DPC, DPH, DP1, DP2, DP3 and the leads LD are formed of a conductor and are preferably made of a metal material such as copper (Cu) or a copper alloy. The die pads DPC, DPH, DP1, DP2, DP3 and the leads LD are preferably formed of an identical material. This makes it easier to fabricate a leadframe in which the die pads DPC, DPH, DP1, DP2, DP3 and the leads LD coupled with each other and facilitates manufacture of the semiconductor device PKG using the leadframe.

The die pad DPC has a principal surface DPCa located on the side where the semiconductor chip CPC is mounted and a back face DPCb located on the opposite side thereto. The die pad DPH has a principal surface DPHa located on the side where the semiconductor chips CP1, CP2, CP3 are mounted and a back face DPHb located on the opposite side thereto. The die pad DP1 has a principal surface DP1*a* located on the side where the semiconductor chip CP4 is mounted and a back face DP1*b* located on the opposite side thereto. The die pad DP2 has a principal surface DP2*a* located on the side where the semiconductor chip CP5 is mounted and a back face DP2*b* located on the opposite side thereto. The die pad DP3 has a principal surface DP3*a* located on the side where the semiconductor chip CP6 is mounted and a back face DP3*b* located on the opposite side thereto.

At least a part of each die pad DPC, DPH, DP1 to DP3 is sealed in the sealing portion MR but in this embodiment, the back faces DPCb, DPHb, DP1*b*, DP2*b*, DP3*b* of the die pads DPC, DPH, DP1, DP2, DP3 are exposed from the principal surface MRa of the sealing portion MR. As a result, heat produced during operation of the semiconductor chips CPC, CP1 to CP6 can be dissipated mainly from the back faces of the semiconductor chips CPC, CP1 to CP6 to outside the semiconductor device PKG via the die pads DPC, DPH, DP1 to DP3.

Each of the semiconductor chips CPC, CP1 to CP6 has a front face (front face of each semiconductor chip) and a back face (back face of each semiconductor chip) that are principal surfaces positioned on the opposite side to each other. In the semiconductor chip CPC, the principal surface located on the side where a bonding pad (P7) is formed is the front face (front face of the semiconductor chip CPC) and the principal surface located on the opposite side thereto is the back face (back face of the semiconductor chip CPC). In the semiconductor chips CP1 to CP6, the principal surface on the side where source bonding pads (P1S to P6S) or gate bonding pads (P1G to P6G) are formed is the front face (front face of each semiconductor chip CP1 to CP6) and the principal surface located on the side where back electrodes (BE1 to BE6) are formed is the back face (back face of each semiconductor chip CP1 to CP6).

In the die pads DPC, DPH, DP1 to DP3, the leads LD, and lead coupling portions LB1 to LB5, a plating layer (not shown) comprised of silver (Ag) or the like may be formed in areas where the semiconductor chips CPC, CP1 to CP6 are mounted, areas where a wire BW is bonded, and areas where the metal plates MP1 to MP4 are coupled. This makes it possible to more appropriately couple the semiconductor chips CPC, CP1 to CP6, the metal plates MP1 to MP4, and the wires BW to the die pads DPC, DPH, DP1 to DP3, the leads LD, and the lead coupling portions LB1 to LB5.

Over the principal surface DPHa of the die pad DPH, the semiconductor chips CP1, CP2, CP3 are mounted with their back faces faced toward the die pad DPH. Each of the semiconductor chips CP1, CP2, CP3 is mounted over the principal surface DPHa of the die pad DPH via a conductive bonding material (adhesive layer) BD1. In the back face (entire back face) of the semiconductor chip CP1, a back electrode (electrode) BE1 is formed; in the back face (entire back face) of the semiconductor chip CP2, a back electrode (electrode) BE2 is formed; and in the back face (entire back face) of the semiconductor chip CP3, a back electrode (electrode) BE3 is formed. Each of these back electrodes BE1, BE2, BE3 is joined and electrically coupled to the die pad DPH via the conductive bonding material BD1. The bonding material BD1 is comprised of a conductive bonding material (adhesive material) and for example, a paste-type conductive adhesive material, such as silver paste, solder, or the like can be used for this purpose.

Over the principal surface DPHa of the die pad DPH, the semiconductor chip CP1, the semiconductor chip CP2, and the semiconductor chip CP3 are lined in this order and disposed in the X direction. In the X direction, the semiconductor chip CP1 is positioned on the side face MRc4 side of the sealing portion MR, the semiconductor chip CP3 is positioned on the side face MRc2 side of the sealing portion MR, and the semiconductor chip CP2 is disposed between the semiconductor chip CP1 and the semiconductor chip CP3.

Over the principal surface DP1a of the die pad DP1, the semiconductor chip CP4 is mounted with its back face faced toward the die pad DP1. The semiconductor chip CP4 is mounted over the principal surface DP1a of the die pad DP1 via the conductive bonding material BD1. In the back face (entire back face) of the semiconductor chip CP4, a back electrode (electrode) BE4 is formed and this back electrode BE4 is joined and electrically coupled to the die pad DP1 via the conductive bonding material BD1.

Over the principal surface DP2a of the die pad DP2, the semiconductor chip CP5 is mounted with its back face faced toward the die pad DP2. The semiconductor chip CP5 is mounted over the principal surface DP2a of the die pad DP2 via the conductive bonding material BD1. In the back face (entire back face) of the semiconductor chip CP5, a back electrode (electrode) BE5 is formed and this back electrode BE5 is joined and electrically coupled to the die pad DP2 via the conductive bonding material BD1.

Over the principal surface DP3a of the die pad DP3, the semiconductor chip CP6 is mounted with its back face faced toward the die pad DP3. The semiconductor chip CP6 is mounted over the principal surface DP3a of the die pad DP3 via the conductive bonding material BD1. In the back face (entire back face) of the semiconductor chip CP6, a back electrode (electrode) BE6 is formed and this back electrode BE6 is joined and electrically coupled to the die pad DP3 via the conductive bonding material BD1.

Over the principal surface DPCa of the die pad DPC, the semiconductor chip CPC is mounted with its back face faced toward the die pad DPC. The semiconductor chip CPC is mounted over the principal surface DPCa of the die pad DPC via a bonding material (adhesive layer) BD2 and this bonding material BD2 may be conductive or may be insulative.

A planar shape of each of the semiconductor chips CPC, CP1 to CP6 is, for example, a rectangle and, more specifically, a rectangle having a side parallel to the X direction and a side parallel to the Y direction. The flat dimensions of the semiconductor chip CPC are, for example, approximately 8.4 mm×2.3 mm and the flat dimensions of each semiconductor chip CP1 to CP6 are, for example, approximately 2.8 mm×2.8 mm. As viewed in a plane, the semiconductor chips CP1, CP2, CP3 are embraced in the principal surface DPHa of the die pad DPH and the semiconductor chip CPC is embraced in the principal surface DPCa of the die pad DPC. As viewed in a plane, the semiconductor chip CP4 is embraced in the principal surface DP1a of the die pad DP1, the semiconductor chip CP5 is embraced in the principal surface DP2a of the die pad DP2, and the semiconductor chip CP6 is embraced in the principal surface DP3a of the die pad DP3. The semiconductor chips CPC, CP1 to CP6 are sealed in the sealing portion MR and none of them is exposed from the sealing portion MR.

Each of the back electrodes BE1 to BE6 of the semiconductor chip CP1 to CP6 is electrically coupled to a drain of a power MOSFET formed in the relevant semiconductor chip. For this reason, the back electrode BE1 functions as a drain electrode of the power MOSFET 1, the back electrode BE2 functions as a drain electrode of the power MOSFET 2, and the back electrode BE3 functions as a drain electrode of the power MOSFET 3. The back electrode BE4 functions as a drain electrode of the power MOSFET 4, the back electrode BE5 functions as a drain electrode of the power MOSFET 5, and the back electrode BE6 functions as a drain electrode of the power MOSFET 6.

In each of the semiconductor chips CPC, CP1 to CP6, an uppermost-layer protective film (uppermost-layer insulating film) has an opening for exposing a bonding pad and a bonding pad is exposed from an opening in the uppermost-layer protective film. Specifically, in the front face of the semiconductor chip CP1, a gate bonding pad P1G, a source bonding pad P1S, and other bonding pads P1 are exposed from the uppermost-layer protective film of the semiconductor chip CP1. In the front face of the semiconductor chip CP2, a gate bonding pad P2G, a source bonding pad P2S, and other bonding pads P2 are exposed from the uppermost-layer protective film of the semiconductor chip CP2. In the front face of the semiconductor chip CP3, a gate bonding pad P3G, a source bonding pad P3S, and other bonding pads P3 are exposed from the uppermost-layer protective film of the semiconductor chip CP3. In the front face of the semiconductor chip CP4, a gate bonding pad P4G, a source bonding pad P4S, and other bonding pads P4 are exposed from the uppermost-layer protective film of the semiconductor chip CP4. In the front face of the semiconductor chip CP5, a gate bonding pad P5G, a source bonding pad P5S, and other bonding pads P5 are exposed from the uppermost-layer protective film of the semiconductor chip CP5. In the front face of the semiconductor chip CP6, a gate bonding pad P6G, a source bonding pad P6S, and other bonding pads P6 are exposed from the uppermost-layer protective film of the semiconductor chip CP6. In the front face of the semiconductor chip CPC, a plurality of bonding pads P7 are exposed from the uppermost-layer protective film of the semiconductor chip CPC. Hereafter, a "bonding pad," "bonding pad electrode," "pad electrode," "electrode" will be simply referred to as a "pad."

The pads P7 of the semiconductor chip CPC are electrically coupled to the above-mentioned control circuit CLC formed in the semiconductor chip CPC through internal wiring of the semiconductor chip CPC. Each of the gate pads P1G, P2G, P3G, P4G, P5G, P6G of the semiconductor chips CP1, CP2, CP3, CP4, CP5, CP6 is electrically coupled to a gate electrode of the power MOSFET formed in the relevant semiconductor chip. Each of the source pads P1S, P2S, P3S, P4S, P5S, P6S of the semiconductor chips CP1, CP2, CP3, CP4, CP5, CP6 is electrically coupled to a source of the power MOSFET formed in the relevant semiconductor chip. For this reason, the gate pads P1G, P2G, P3G, P4G, P5G, P6G function as a respective gate pad of the above-mentioned power MOSFETs 1, 2, 3, 4, 5, 6 and the source pads P1S, P2S, P3S, P4S, P5S, P6S function as a respective source pad of the power MOSFETs 1, 2, 3, 4, 5, 6. In each of the semiconductor chips CP1 to CP6, a plane area of each source pad (P1S to P6S) is larger than a plane area of each of the other pads (P1G to P6G, P1 to P6).

A description will be given to a concrete structure of the semiconductor chips CP1 to CP6 with the semiconductor chip CP1 taken as an example. In a semiconductor substrate configuring the semiconductor chip CP1, a plurality of unit transistor cells configuring the power MOSFET (1) are formed. The power MOSFET (1) is formed by coupling these unit transistor cells in parallel. Each unit transistor cell is comprised of, for example, a trench gate MISFET. The source regions of the unit transistor cells for the power MOSFET (1), formed in the front face of the semiconductor substrate configuring the semiconductor chip CP1, are electrically coupled to a common source electrode formed over an interlayer insulating film located over the semiconductor substrate. This source electrode is exposed from an opening in the uppermost-layer protective film and the source pad (P1S) is thereby formed. The uppermost-layer protective film of the semiconductor chip CP1 is formed over the interlayer insulating film located over the semiconductor substrate configuring the semiconductor chip CP1 so as to cover the source electrode but has an opening at least partly exposing the source electrode. The semiconductor substrate configuring the semiconductor chip CP1 has a function of a drain region common to the unit transistor cells for the power MOSFET (1) and the back electrode (BE1) is formed in the entire back face of the semiconductor substrate. In the semiconductor chip CP1, a current between the source and drain of the power MOSFET (1) flows in a direction of the thickness of the semiconductor substrate configuring the semiconductor chip CP1. That is, a current between the source and drain of the power MOSFET (1) flows between the source pad (P1S) and the back electrode (BE1) of the semiconductor chip CP1. The gate pad (P1G) functions as a controlling terminal (controlling electrode) controlling continuity between the source pad (P1S) formed on the front face side of the semiconductor chip (CP1) and the drain back electrode (BE1) formed on the back face side of the semiconductor chip (CP1). The power MOSFET (1) is preferably of an n-channel type. The structure of each of the semiconductor chips CP2, CP3, CP4, CP5, CP6 is substantially identical with that of the semiconductor chip CP1; therefore, a repetitive description thereof will be omitted here.

In the front face of each semiconductor chip CP1 to CP6, the other pads (P1G to P6G, P1 to P6) than the source pads (P1S to P6S) are disposed along a side on the opposite side to the semiconductor chip CPC and respectively electrically coupled to pads P7 of the semiconductor chip CPC via a wire BW. That is, one end of a wire BW is coupled to each of the pads P1G to P6G, P1 to P6 of the semiconductor chips CP1 to CP6 and the other end of that wire BW is coupled to a pad P7 of the semiconductor chip CPC. Each of the pads P1G to P6G, P1 to P6 of the semiconductor chips CP1 to CP6 is electrically coupled to a pad P7 of the semiconductor chip CPC via a wire BW and is further electrically coupled to the above-mentioned control circuit CLC in the semiconductor chip CPC through internal wiring of the semiconductor chip CPC.

A wire (bonding wire) BW is a conductive coupling member and more specifically a conductive wire. Since the wire BW is formed of metal, the wire can also be considered as a metal wire (thin metallic wire). For the wire BW, a gold (Au) wire, a silver (Ag) wire, a copper (Cu) wire, an aluminum (Al) wire, or the like can be favorably used. Each wire BW is sealed in the sealing portion MR and is not exposed from the sealing portion MR. In each lead LD, a point of wire BW bond is an inner lead portion positioned within the sealing portion MR.

The source pad P1S of the semiconductor chip CP1 is electrically coupled with the lead coupling portion (lead wiring portion) LB1 via the metal plate MP1. That is, the metal plate MP1 is joined and electrically coupled to the source pad P1S of the semiconductor chip CP1 and to the lead coupling portion LB1 respectively via the conductive bonding material BD3.

The source pad P2S of the semiconductor chip CP2 is electrically coupled with the lead coupling portion (lead wiring portion) LB2 via the metal plate MP2. That is, the metal plate MP2 is joined and electrically coupled to the source pad P2S of the semiconductor chip CP2 and to the lead coupling portion LB2 respectively via the conductive bonding material BD3.

The source pad P3S of the semiconductor chip CP3 is electrically coupled to the lead coupling portion (lead wiring portion) LB3 via the metal plate MP3. That is, the metal plate MP3 is joined and electrically coupled to the source pad P3S of the semiconductor chip CP3 and to the lead coupling portion LB3 respectively via the conductive bonding material BD3.

The source pads P4S, P5S, P6S of the semiconductor chips CP4, CP5, CP6 are electrically coupled with the lead coupling portions (lead wiring portions) LB4, LB5 via the common metal plate MP4. That is, the metal plate MP4 is joined and electrically coupled to the source pad P4S of the semiconductor chip CP4, to the source pad P5S of the semiconductor chip CP5, to the source pad P6S of the semiconductor chip CP6, to the lead coupling portion LB4, and to the lead coupling portion LB5 respectively via the conductive bonding material BD3.

Use of the metal plates MP1 to MP4 to electrically couple the source pads P1S to P6S of the semiconductor chips CP1 to CP6 to leads LD instead of a wire can reduce on-resistance of the power MOSFETs 1 to 6. This makes it possible to reduce package resistance and reduce a conduction loss.

The bonding material BD3 is comprised of a conductive bonding material (adhesive material) and a paste-type conductive adhesive material such as silver paste, solder, or the like can be used for this purpose. To couple the metal plates MP1 to MP4 to the source pads P1S to P6S of the semiconductor chips CP1 to CP6, these items may be directly coupled by crimping or the like without use of the conductive bonding material BD3.

The metal plates MP1 to MP4 are conductor plates comprised of a conductor and are preferably formed of a metal (metal material) high in conductivity and thermal conductivity, such as copper (Cu), a copper (Cu) alloy, aluminum (Al), or an aluminum (Al) alloy. The sizes (widths) in the X direction and in the Y direction of each metal plate MP1 to MP4 are both larger than a diameter of the wire BW.

Heat produced in the semiconductor chips CP1 to CP6 is dissipated from the back faces of the semiconductor chips CP1 to CP6 via the die pads DPH, DP1, DP2, DP3. In addition, the heat can be dissipated from the front faces of the semiconductor chips CP1 to CP6 via the metal plates MP1 to MP4. This makes it possible to enhance dissipation of heat produced in the semiconductor chips CP1 to CP6.

Of a plurality of the pads P7 of the semiconductor chip CPC, pads P7 that are not coupled to any pad of the semiconductor chips CP1 to CP6 are electrically coupled to leads LD11, LD12 of a plurality of the leads LD provided in the semiconductor device PKG. Each lead LD11, LD12 can function as a signal transmission path between the semiconductor chip CPC in the semiconductor device PKG and the above-mentioned control circuit CT external to the semiconductor device PKG.

Of the leads LD11, LD12, the leads LD11 are disposed on the side face MRc4 side of the sealing portion MR in opposition to the die pad DPC (semiconductor chip CPC) in the X direction; and the leads LD12 are disposed on the side face MRc2 side of the sealing portion MR in opposition to the die pad DPC (semiconductor chip CPC) in the X direction. In the front face of the semiconductor chip CPC, the pads P7 disposed (arranged) along a side on the side face MRc4 side of the sealing portion MR are respectively electrically coupled with the leads LD11 disposed on the side face MRc4 side of the sealing portion MR via the wire BW. In the front face of the semiconductor chip CPC, the pads P7 disposed (arranged) along a side on the side face MRc2 side of the sealing portion MR are respectively electrically coupled with the leads LD12 disposed on the side face MRc2 side of the sealing portion MR via the wire BW. Each lead LD11, LD12 is not tied to any of the die pads DPC, DPH, DP1, DP2, DP3, the leads LD1, LD2, LD3, LD4, LD5, LD6, LD7, LD8, LD9, LD10, LD13, and the lead coupling portions LB1, LB2, LB3, LB4, LB5 via a conductor and is an isolated lead.

Each of the lead coupling portions LB1, LB2, LB3 adjoins to the die pad DPH in the Y direction and is extended in the X direction in the sealing portion MR along the side face MRc3. However, the lead coupling portion LB1, the lead coupling portion LB2, and the lead coupling portion LB3 are lined in the X direction. Of the lead coupling portions LB1, LB2, LB3, the lead coupling portion LB1 is positioned on the side face MRc4 side of the sealing portion MR, the lead coupling portion LB3 is positioned on the side face MRc2 side of the sealing portion MR, and the lead coupling portion LB2 is positioned between the lead coupling portion LB1 and the lead coupling portion LB3. For this reason, as viewed in a plane, the semiconductor chip CP1 and the lead coupling portion LB1 are opposed to each other in the Y direction; the semiconductor chip CP2 and the lead coupling portion LB2 are opposed to each other in the Y direction; and the semiconductor chip CP3 and the lead coupling portion LB3 are opposed to each other in the Y direction. The lead coupling portion LB1, the lead coupling portion LB2, the lead coupling portion LB3, and the die pad DPH are spaced from one another and a part of the sealing portion MR is located between these items.

The lead coupling portion LB4 adjoins to the die pad DP1 in the X direction and is extended in the Y direction in the sealing portion MR along the side face MRc4. The lead coupling portion LB5 adjoins to the die pad DP3 in the X direction and is extended in the Y direction in the sealing portion MR along the side face MRc2. However, the lead coupling portion LB4 and the die pad DP1 are spaced from each other and a part of the sealing portion MR is located between these items. The lead coupling portion LB5 and the die pad DP3 are spaced from each other and another part of the sealing portion MR is located between these times. The lead coupling portions LB1 to LB5 are sealed in the sealing portion MR and none of them is exposed from the sealing portion MR.

Of the leads LD provided in the semiconductor device PKG, the leads LD1 are integrally coupled to the lead coupling portion LB1. That is, the lead coupling portion LB1 and the leads LD1 are integrally formed. Each lead LD1 is disposed on the side face MRc3 side of the sealing portion MR and is extended in the Y direction as viewed in a plane. The leads LD1 adjoin to one another in the X direction and the inner lead portions of the leads LD1 are coupled together by the lead coupling portion LB1. For this reason, the lead coupling portion LB1 can be considered as a coupling portion coupling together the inner lead portions of the leads LD1. The leads LD1 and the lead coupling portion LB1 are electrically coupled to the source pad P1S of the semiconductor chip CP1 via the metal plate MP1. The leads LD1 correspond to the above-mentioned terminal TE1.

Of the leads LD provided in the semiconductor device PKG, the leads LD2 are integrally coupled to the lead coupling portion LB2. That is, the lead coupling portion LB2 and the leads LD2 are integrally formed. Each lead LD2 is disposed on the side face MRc3 side of the sealing portion MR and is extended in the Y direction as viewed in a plane. The leads LD2 adjoin to one another in the X direction and the inner lead portions of the leads LD2 are coupled together by the lead coupling portion LB2. For this reason, the lead coupling portion LB2 can be considered as a coupling portion coupling together the inner lead portions of the leads LD2. The leads LD2 and the lead coupling portion LB2 are electrically coupled to the source pad P2S of the semiconductor chip CP2 via the metal plate MP2. The leads LD2 correspond to the above-mentioned terminal TE2.

Of the leads LD provided in the semiconductor device PKG, the leads LD3 are integrally coupled to the lead coupling portion LB3. That is, the lead coupling portion LB3 and the leads LD3 are integrally formed. Each lead LD3 is disposed on the side face MRc3 side of the sealing portion MR and is extended in the Y direction as viewed in a plane. The leads LD3 adjoin to one another in the X direction and the inner lead portions of the leads LD3 are coupled together by the lead coupling portion LB3. For this reason, the lead coupling portion LB3 can be considered as a coupling portion coupling together the inner lead portions of the leads LD3. The leads LD3 and the lead coupling portion LB3 are electrically coupled to the source pad P3S of the semiconductor chip CP3 via the metal plate MP3. The leads LD3 correspond to the above-mentioned terminal TE3.

Of the leads LD provided in the semiconductor device PKG, the leads LD9 are integrally coupled to the lead coupling portion LB4. That is, the lead coupling portion LB4 and the leads LD9 are integrally formed. Each lead L9 is disposed on the side face MRc4 side of the sealing portion MR and is extended in the X direction as viewed in a plane. The leads LD9 adjoin to one another in the Y direction and the inner lead portions of the leads LD9 are coupled together by the lead coupling portion LB4. For this reason, the lead coupling portion LB4 can be considered as a coupling portion coupling together the inner lead portions of the leads LD9. The leads LD9 and the lead coupling portion LB4 are electrically coupled to the source pads P4S, P5S, P6S of the semiconductor chips CP4, CP5, CP6 via the metal plate MP4. The leads LD9 correspond to the above-mentioned terminal TE9.

Of the leads LD provided in the semiconductor device PKG, the leads LD10 are integrally coupled to the lead coupling portion LB5. That is, the lead coupling portion LB5 and the leads LD10 are integrally formed. Each lead L10 is disposed on the side face MRc2 side of the sealing portion MR and is extended in the X direction as viewed in a plane. The leads LD10 adjoin to one another in the Y direction and the inner lead portions of the leads LD10 are coupled together by the lead coupling portion LB5. For this reason, the lead coupling portion LB5 can be considered as a coupling portion coupling together the inner lead portions of the leads LD10. The leads LD10 and the lead coupling portion LB5 are electrically coupled to the source pads P4S, P5S, P6S of the semiconductor chips CP4, CP5, CP6 via the metal plate MP4. The leads LD10 correspond to the above-mentioned terminal TE10.

The leads LD1 are coupled in a lump to the lead coupling portion LB1; the leads LD2 are coupled in a lump to the lead coupling portion LB2; the leads LD3 are coupled in a lump to the lead coupling portion LB3; the leads LD9 are coupled in a lump to the lead coupling portion LB4; and the leads LD10 are coupled in a lump to the lead coupling portion LB5. This makes it possible to reduce resistance and reduce a conduction loss in the power MOSFETs 1, 2, 3, 4, 5, 6.

The lead coupling portion LB1 and the leads LD1 coupled thereto, the lead coupling portion LB2 and the leads LD2 coupled thereto, and the lead coupling portion LB3 and the leads LD3 coupled thereto are disposed on the side face MRc3 side of the sealing portion MR so as to adjoin to the die pad DPH in the Y direction. The lead coupling portion LB4 and the leads LD9 coupled thereto are disposed on the side face MRc4 side of the sealing portion MR so as to adjoin to the die pad DP1 in the X direction; and the lead coupling portion LB5 and the leads LD10 coupled thereto are disposed on the side face MRc2 side of the sealing portion MR so as to adjoin to the die pad DP3 in the X direction.

Of the leads LD provided in the semiconductor device PKG, the leads LD4 are integrally formed with the die pad DP1. For this reason, the leads LD4 are electrically coupled with the die pad DP1 and are electrically coupled to the back electrode BE4 of the semiconductor chip CP4 via the die pad DP1 and the conductive bonding material BD1. The leads LD4 correspond to the above-mentioned terminal TE4. As viewed in a plane, the leads LD4 are disposed on the side face MRc1 side of the sealing portion MR so as to be opposed to the die pad DP1 (semiconductor chip CP4) in the Y direction. Each lead LD4 is extended in the Y direction as viewed in a plane and the leads LD4 adjoin to one another in the X direction.

Of the leads LD provided in the semiconductor device PKG, the leads LD5 are integrally formed with the die pad DP2. For this reason, the leads LD5 are electrically coupled with the die pad DP2 and are electrically coupled to the back electrode BE5 of the semiconductor chip CP5 via the die pad DP2 and the conductive bonding material BD1. The leads LD5 correspond to the above-mentioned terminal TE5. As viewed in a plane, the leads LD5 are disposed on the side face MRc1 side of the sealing portion MR so as to be opposed to the die pad DP2 (semiconductor chip CP5) in the Y direction. Each lead LD5 is extended in the Y direction as viewed in a plane and the leads LD5 adjoin to one another in the X direction.

Of the leads LD provided in the semiconductor device PKG, the leads LD6 are integrally formed with the die pad DP3. For this reason, the leads LD6 are electrically coupled with the die pad DP3 and are electrically coupled to the back electrode BE6 of the semiconductor chip CP6 via the die pad DP3 and the conductive bonding material BD1. The leads LD6 correspond to the above-mentioned terminal TE6. As viewed in a plane, the leads LD6 are disposed on the side face MRc1 side of the sealing portion MR so as to be opposed to the die pad DP3 (semiconductor chip CP6) in the Y direction. Each lead LD6 is extended in the Y direction as viewed in a plane and the leads LD6 adjoin to one another in the X direction.

When only the semiconductor device PKG is brought into focus, the leads LD1 and the leads LD4 are not tied with each other through a conductor and are thus not electrically coupled with each other; the leads LD2 and the leads LD5 are not tied with each other through a conductor and are thus not electrically coupled with each other; and the leads LD3 and the leads LD6 are not tied with each other through a conductor and are thus not electrically coupled with each other. However, when the semiconductor device PKG is mounted over a circuit board or the like to form inverter circuits of the semiconductor device PKG, through wiring or the like of that circuit board, the leads LD1 and the leads LD4 of the semiconductor device PKG are electrically coupled with each other; the leads LD2 and the leads LD5 are electrically coupled with each other; and the leads LD3 and the leads LD6 are electrically coupled with each other.

Of the leads LD provided in the semiconductor device PKG, the leads LD7 and the leads LD8 are integrally formed with the die pad DPH. For this reason, the leads LD7 and the leads LD8 are electrically coupled with the die pad DPH and are electrically coupled to the back electrodes BE1, BE2, BE3 of the semiconductor chips CP1, CP2, CP3 via the die pad DPH and the conductive bonding material BD1. The leads LD7 correspond to the above-mentioned terminal TE7 and the leads LD8 correspond to the above-mentioned terminal TE8. As viewed in a plane, the leads LD7 are disposed on the side face MRc4 side of the sealing portion MR so as to be opposed to the die pad DPH (semiconductor chip CP1) in the X direction and the leads LD8 are disposed on the side face MRc2 side of the sealing portion MR so as to be opposed to the die pad DPH (semiconductor chip CP3) in the X direction. Each lead LD7 is extended in the X direction as viewed in a plane and the leads LD7 adjoin to one another in the Y direction. Each lead LD8 is extended in the X direction as viewed in a plane and the leads LD8 adjoin to one another in the Y direction.

In the semiconductor device PKG in this embodiment, the leads LD1, the leads LD2, and the leads LD3 are disposed on the side face MRc3 side of the sealing portion MR. The leads LD4, the leads LD5, and the leads LD6 are disposed on the side face MRc1 side of the sealing portion MR. The leads LD9, the leads LD11, and the leads LD7 are disposed on the side face MRc4 side of the sealing portion MR. The leads LD10, the leads LD12, and the leads LD8 are disposed on the side face MRc2 side of the sealing portion MR. The leads LD1 and the leads LD4 are located on the opposite side to each other in the Y direction; the leads LD2 and the leads LD5 are located on the opposite side to each other in the Y direction; and the leads LD3 and the leads LD6 are located on the opposite side to each other in the Y direction. The leads LD9 and the leads LD10 are located on the opposite side to each other in the X direction; the leads LD11 and the leads LD12 are located on the opposite side to each other in the X direction; and the leads LD7 and the leads LD8 are located on the opposite side to each other in the X direction.

For this reason, a lead group comprised of the leads LD1, a lead group comprised of the leads LD2, and a lead group comprised of the leads LD3 are identically disposed on the side face MRc3 side of the sealing portion MR. As viewed in the X direction, however, the lead group comprised of the leads LD1 is located in a position close to the side face MRc4 of the sealing portion MR; the lead group comprised of the leads LD3 is located in a position close to the side face MRc2 of the sealing portion MR; and the lead group comprised of the leads LD2 is located between the lead group comprised of the leads LD1 and the lead group comprised of the leads LD3.

A lead group comprised of the leads LD4, a lead group comprised of the leads LD5, and a lead group comprised of the leads LD6 are identically disposed on the side face MRc1 side of the sealing portion MR. As viewed in the X direction, however, the lead group comprised of the leads LD4 is located in a position close to the side face MRc4 of the sealing portion MR; the lead group comprised of the leads LD6 is located in a position close to the side face MRc2 of the sealing portion MR; and the lead group comprised of the leads LD5 is located between the lead group comprised of the leads LD4 and the lead group comprised of the leads LD6.

A lead group comprised of the leads LD9, a lead group comprised of the leads LD11, and a lead group comprised of the leads LD7 are identically disposed on the side face MRc4 side of the sealing portion MR. As viewed in the Y direction, however, the lead group comprised of the leads LD9 is located in a position close to the side face MRc1 of the sealing portion MR; the lead group comprised of the leads LD7 is located in a position close to the side face MRc3 of the sealing portion MR; and the lead group comprised of the leads LD11 is located between the lead group comprised of the leads LD9 and the lead group comprised of the leads LD7.

A lead group comprised of the leads LD10, a lead group comprised of the leads LD12, and a lead group comprised of the leads LD8 are identically disposed on the side face MRc2 side of the sealing portion MR. As viewed in the Y direction, however, the lead group comprised of the leads LD10 is located in a position close to the side face MRc1 of the sealing portion MR; the lead group comprised of the leads LD8 is located in a position close to the side face MRc3 of the sealing portion MR; and the lead group comprised of the leads LD12 is located between the lead group comprised of the leads LD10 and the lead group comprised of the leads LD8.

For this reason, on the side face MRc3 side of the sealing portion MR, the lead group comprised of the leads LD1, the lead group comprised of the leads LD2, and the lead group comprised of the leads LD3 are lined in this order in a direction from the side face MRc4 toward the side face MRc2. On the side face MRc1 side of the sealing portion MR, the lead group comprised of the leads LD4, the lead group comprised of the leads LD5, and the lead group comprised of the leads LD6 are lined in this order in a direction from the side face MRc4 toward the side face MRc2. On the side face MRc4 side of the sealing portion MR, the lead group comprised of the leads LD9, the lead group comprised of the leads LD11, and the lead group comprised of the leads LD7 are lined in this order in a direction from the side face MRc1 toward the side face MRc3. On the side face MRc2 side of the sealing portion MR, the lead group comprised of the leads LD10, the lead group comprised of the leads LD12, and the lead group comprised of the leads LD8 are lined in this order in a direction from the side face MRc1 toward the side face MRc3.

In the semiconductor device PKG, as mentioned above, the source leads LD1, LD2, LD3 of the power MOSFETs 1, 2, 3 for high side are disposed on the side face MRc3 side of the sealing portion MR and the drain leads LD7, LD8 of the power MOSFETs 1, 2, 3 for high side are disposed on the sides of the side faces MRc2, MRc4 of the sealing portion MR. The drain leads LD4, LD5, LD6 of the power MOSFETs 4, 5, 6 for low side are disposed on the side face MRc1 side of the sealing portion MR and the source leads LD9, LD10 of the power MOSFETs 4, 5, 6 for low side are disposed on the sides of the side faces MRc2, MRc4 of the sealing portion MR.

The die pad DPC has a plurality of leads LD13 integrally coupled thereto. When the semiconductor device PKG is manufactured, these leads LD13 are used to support the die pad DPC on a framework of the leadframe LF described later. For this reason, none of the leads LD13 is electrically coupled to any pad on the semiconductor chips CPC, CP1 to CP6 or to any back electrode BE1, BE2, BE3, BE4, BE5, BE6 of the semiconductor chips CP1 to CP6. For this reason, any lead LD13 does not function as a signal transmission path between the semiconductor chip CPC within the semiconductor device PKG and the above-mentioned control circuit CT or does not function as a current path between the semiconductor chips CP1 to CP6 within the semiconductor device PKG and the above-mentioned motor MOT. The leads LD13 are disposed both on the side face MRc4 side and on the side face MRc2 side of the sealing portion MR.

Specifically, on the side face MRc4 side of the sealing portion MR, one or more leads LD13 are disposed between the lead group comprised of the leads LD9 and the lead group comprised of the leads LD11 and one or more leads LD13 are disposed between the lead group comprised of the leads LD7 and the lead group comprised of the leads LD11. On the side face MRc2 side of the sealing portion MR, one or more leads LD13 are disposed between the lead group comprised of the leads LD10 and the lead group comprised of the leads LD12 and one or more leads LD13 are disposed between the lead group comprised of the leads LD8 and the lead group comprised of the leads LD12. Some or all of the leads LD13 may be omitted as long as the semiconductor device PKG can be manufactured.

In the semiconductor device PKG, when the power MOSFET 1 is on, a current flows from the leads LD7, LD8 to the leads LD1 through the power MOSFET 1 in the semiconductor chip CP1. When the power MOSFET 2 is on, a current flows from the leads LD7, LD8 to the leads LD2 through the power MOSFET 2 in the semiconductor chip CP2. When the power MOSFET 3 is on, a current flows from the leads LD7, LD8 to the leads LD3 through the power MOSFET 3 in the semiconductor chip CP3. When the power MOSFET 4 is on, a current flows from the leads LD4 to the leads LD9, LD10 through the power MOSFET 4 in the semiconductor chip CP4. When the power MOSFET 5 is on, a current flows from the leads LD5 to the leads LD9, LD10 through the power MOSFET 5 in the semiconductor chip CP5. When the power MOSFET 6 is on, a current flows from the leads LD6 to the leads LD9, LD10 through the power MOSFET 6 in the semiconductor chip CP6.

Manufacturing Process of Semiconductor Device

A description will be given to a manufacturing process (assembling process) of the semiconductor device PKG shown in FIG. 5 to FIG. 15. FIG. 16 to FIG. 22 are plan views (FIG. 16 to FIG. 21) or a sectional view (FIG. 22) of the semiconductor device PKG in this embodiment in the manufacturing process.

To manufacture the semiconductor device PKG, the leadframe LF is provided and the semiconductor chips CPC, CP1 to CP6 are provided. The leadframe LF may be provided first, the semiconductor chips CPC, CP1 to CP6 may be provided first, or both items may be provided at the same time.

Figure 16:
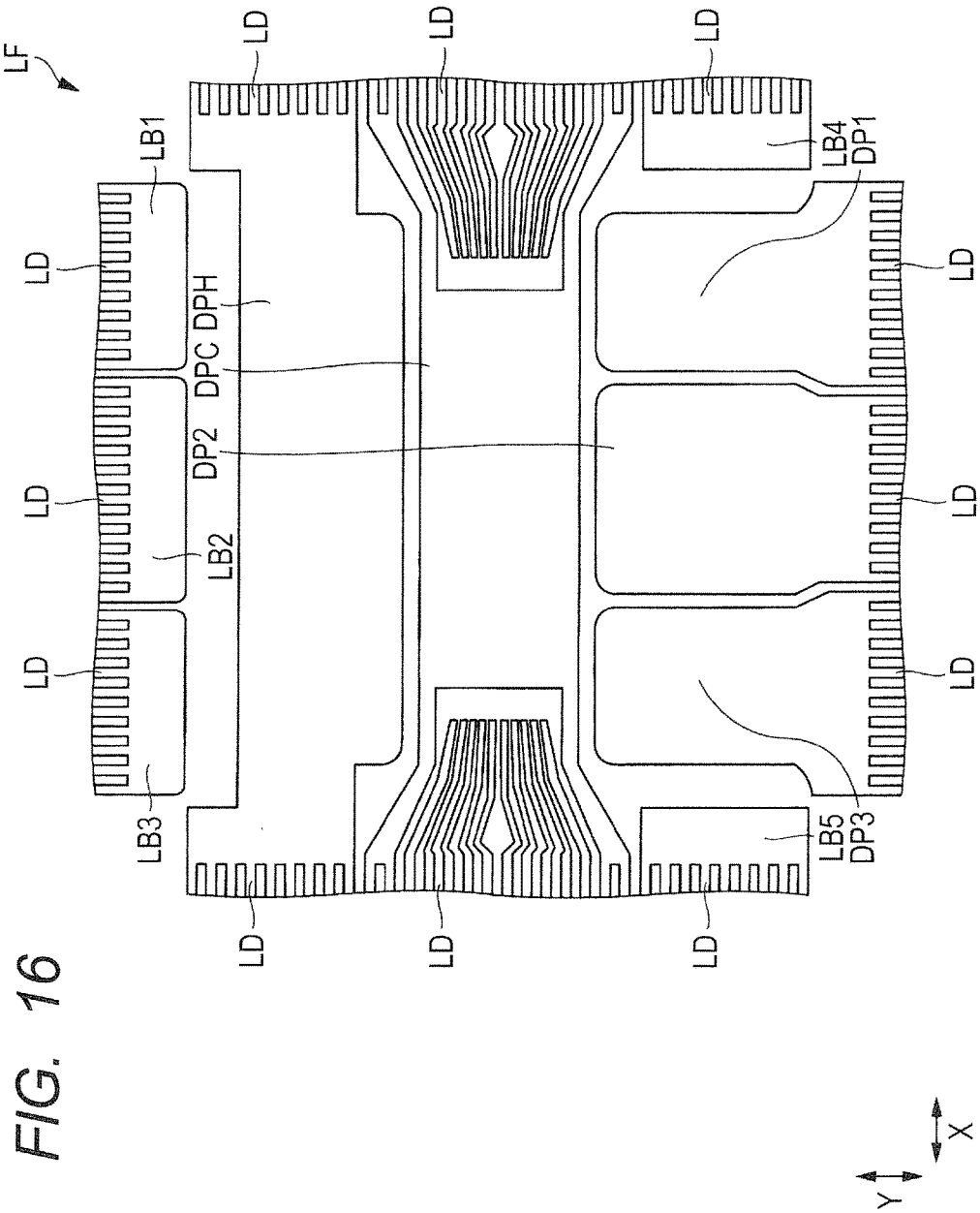
FIG. 16 is a plan view of a semiconductor device in an embodiment in a manufacturing process.

As illustrated in FIG. 16, the leadframe LF integrally includes a framework (not shown), the die pads DPC, DPH, DP1, DP2, DP3, the leads LD, and the lead coupling portions LB1 to LB5. One end of each lead LD is coupled to the framework. Each die pad DPC, DPH, DP1, DP2, DP3 is coupled to the framework via leads LD integrally formed with the die pad. The leadframe LF is formed of, for example, a metal material containing copper (Cu) as a main ingredient, specifically, copper (Cu) or a copper (Cu) alloy. FIG. 16 shows an area in the leadframe LF from which one semiconductor device PKG will be manufactured.

The leadframe LF is set with the principal surfaces DPCa, DPHa, DP1a, DP2a, DP3a of the die pads DPC, DPH, DP1, DP2, DP3 facing upward during the following manufacturing process (assembling process) until a molding step is performed to form the sealing portion MR.

Figure 17:
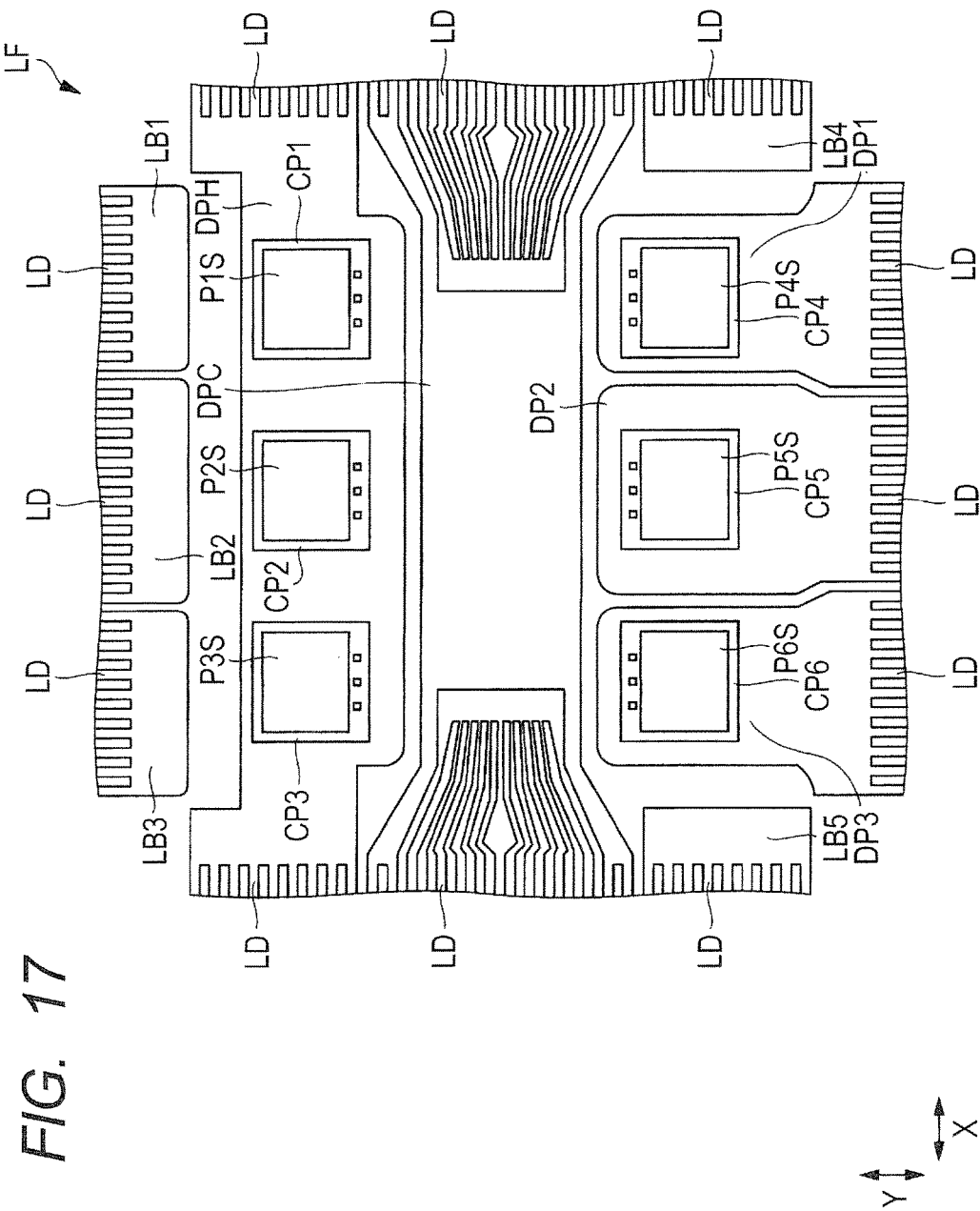
FIG. 17 is a plan view of the semiconductor device in the manufacturing process, following FIG. 16.

Subsequently, as shown in FIG. 17, a die bonding step is performed for the semiconductor chips CP1 to CP6. First, the semiconductor chips CP1, CP2, CP3 are mounted over the principal surface DPHa of the die pad DPH of the leadframe LF; the semiconductor chip CP4 is mounted over the principal surface DP1a of the die pad DP1; the semiconductor chip CP5 is mounted over the principal surface DP2a of the die pad DP2; and the semiconductor chip CP6 is mounted over the principal surface DP3a of the die pad DP3. These chips are mounted over the relevant dies pads via the conductive bonding material BD1 (face up bonding). For example, silver paste can be used for the bonding material BD1. Thereafter, a treatment for curing the conductive bonding material BD1 (heat treatment) is conducted. As a result, the semiconductor chips CP1 to CP6 are joined and secured to the die pads DPH, DP1, DP2, DP3 by the cured conductive bonding material BD1. Thereafter, a cleaning step by plasma (plasma cleaning step) may be performed. This plasma cleaning step cleans the pads P1S to P6S on the semiconductor chips CP1 to CP6 and makes it easier to join the metal plates MP1 to MP4 later.

Figure 18:
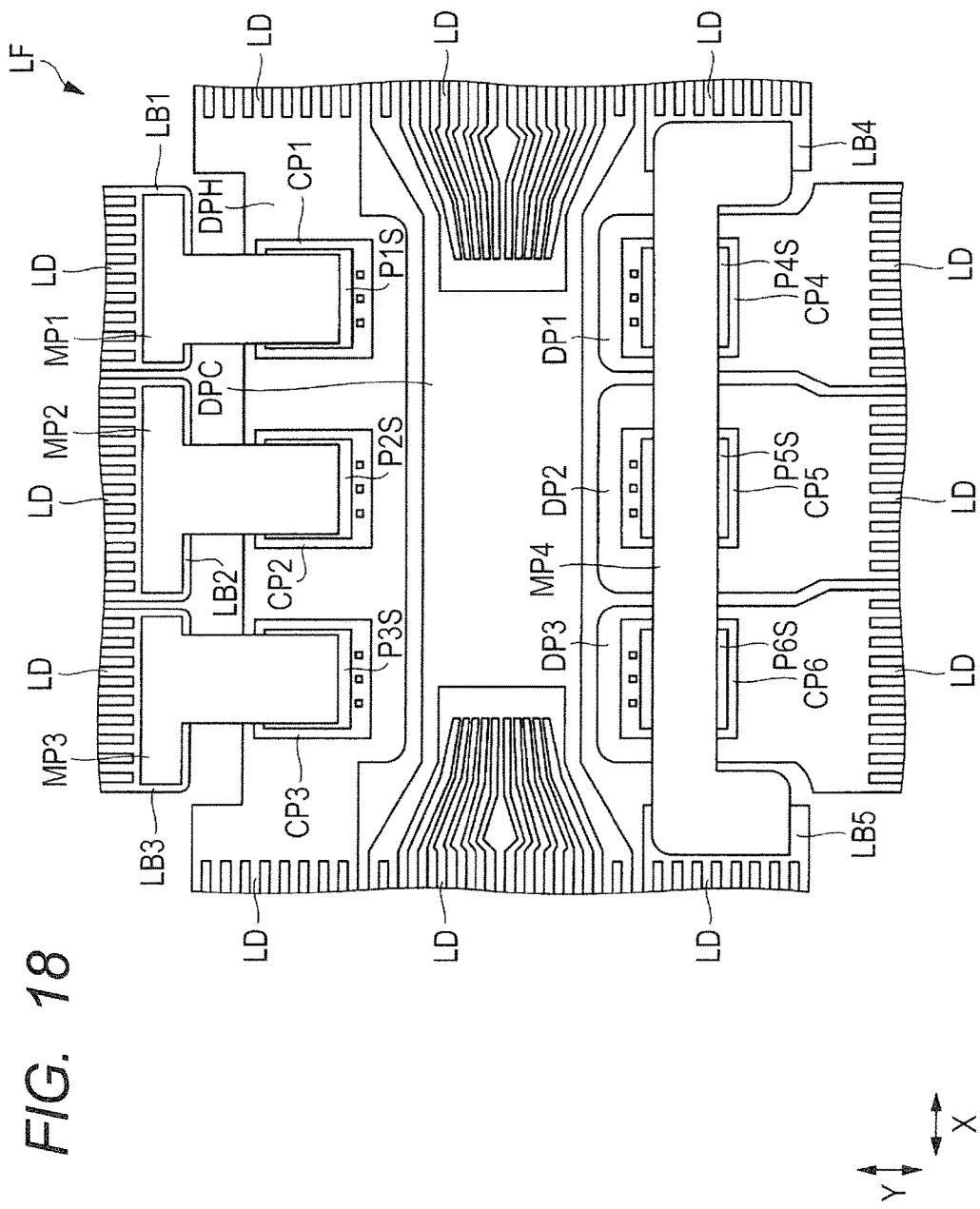
FIG. 18 is a plan view of the semiconductor device in the manufacturing process, following FIG. 17.

Subsequently, illustrated in FIG. 18, the source pad P1S of the semiconductor chip CP1 and the lead coupling portion LB1 of the leadframe LF are coupled with each other via the metal plate MP1. Further, the source pad P2S of the semiconductor chip CP2 and the lead coupling portion LB2 of the leadframe LF are coupled with each other via the metal plate MP2. Furthermore, the source pad P3S of the semiconductor chip CP3 and the lead coupling portion LB3 of the leadframe LF are coupled with each other via the metal plate MP3. In addition, the source pads P4S, P5S, P6S of the semiconductor chips CP4, CP5, CP6 and the lead coupling portions LB4, LB5 of the leadframe LF are coupled with each other via the common metal plate MP4.

The metal plate MP1 is joined to the source pad P1S of the semiconductor chip CP1 and to the lead coupling portion LB1 respectively via the conductive bonding material BD3. The metal plate MP2 is joined to the source pad P2S of the semiconductor chip CP2 and to the lead coupling portion LB2 respectively via the conductive bonding material BD3. The metal plate MP3 is joined to the source pad P3S of the semiconductor chip CP3 and to the lead coupling portion LB3 respectively via the conductive bonding material BD3. The metal plate MP4 is joined to the source pads P4S, P5S, P6S of the semiconductor chips CP4, CP5, CP6 and to the lead coupling portions LB4, LB5 respectively via the conductive bonding material BD3. For example, silver paste or solder can be used for the bonding material BD3.

In the case described here, a bonding step for the metal plates MP1 to MP4 is performed before the semiconductor chip CPC is mounted over the die pad DPC. The reason why a bonding step for the metal plates MP1 to MP4 is performed before the semiconductor chip CPC is mounted over the die pad DPC is to prevent the semiconductor chip CPC from being exposed to a heat treatment (curing step for the bonding material BD3 and the like) involved in the bonding step for the metal plates MP1 to MP4. This enables further enhancement of reliability of the semiconductor chip CPC.

Figure 19:
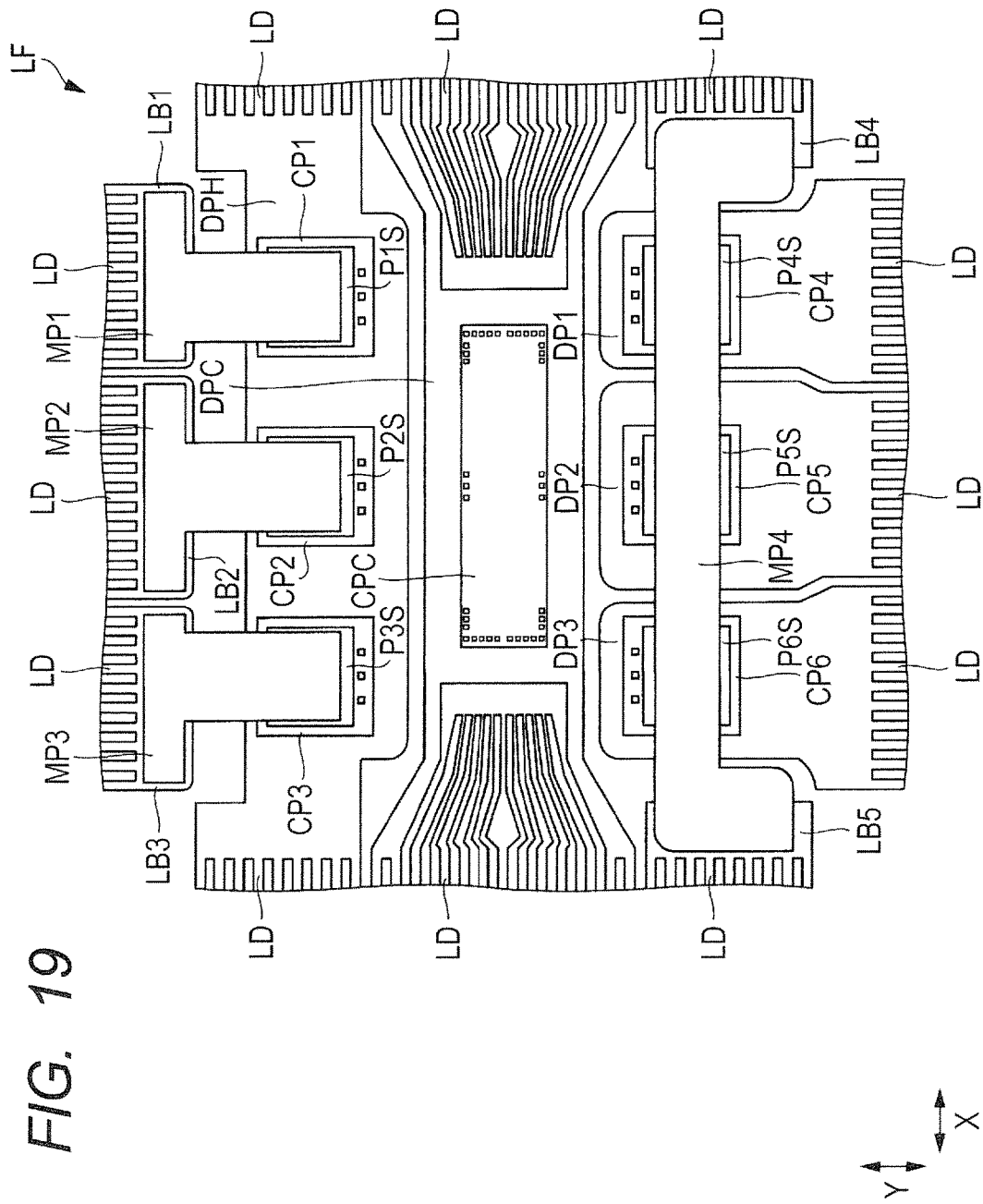
FIG. 19 is a plan view of the semiconductor device in the manufacturing process, following FIG. 18.

Subsequently, as illustrated in FIG. 19, a die bonding step for the semiconductor chip CPC is performed to mount the semiconductor chip CPC over the principal surface DPCa of the die pad DPC of the leadframe LF via the bonding material BD2 (face up bonding). For example, silver paste or insulative paste can be used for the bonding material BD2. Thereafter, a treatment for curing the bonding material BD2 (heat treatment) is conducted. As a result, the semiconductor chip CPC is joined and secured to the die pad DPC by the cured conductive bonding material BD2. Thereafter, a plasma cleaning step may be performed. This plasma cleaning step cleans the pads of the semiconductor chips CPC, CP1 to CP6 and makes it easier to bond a wire BW.

Figure 20:
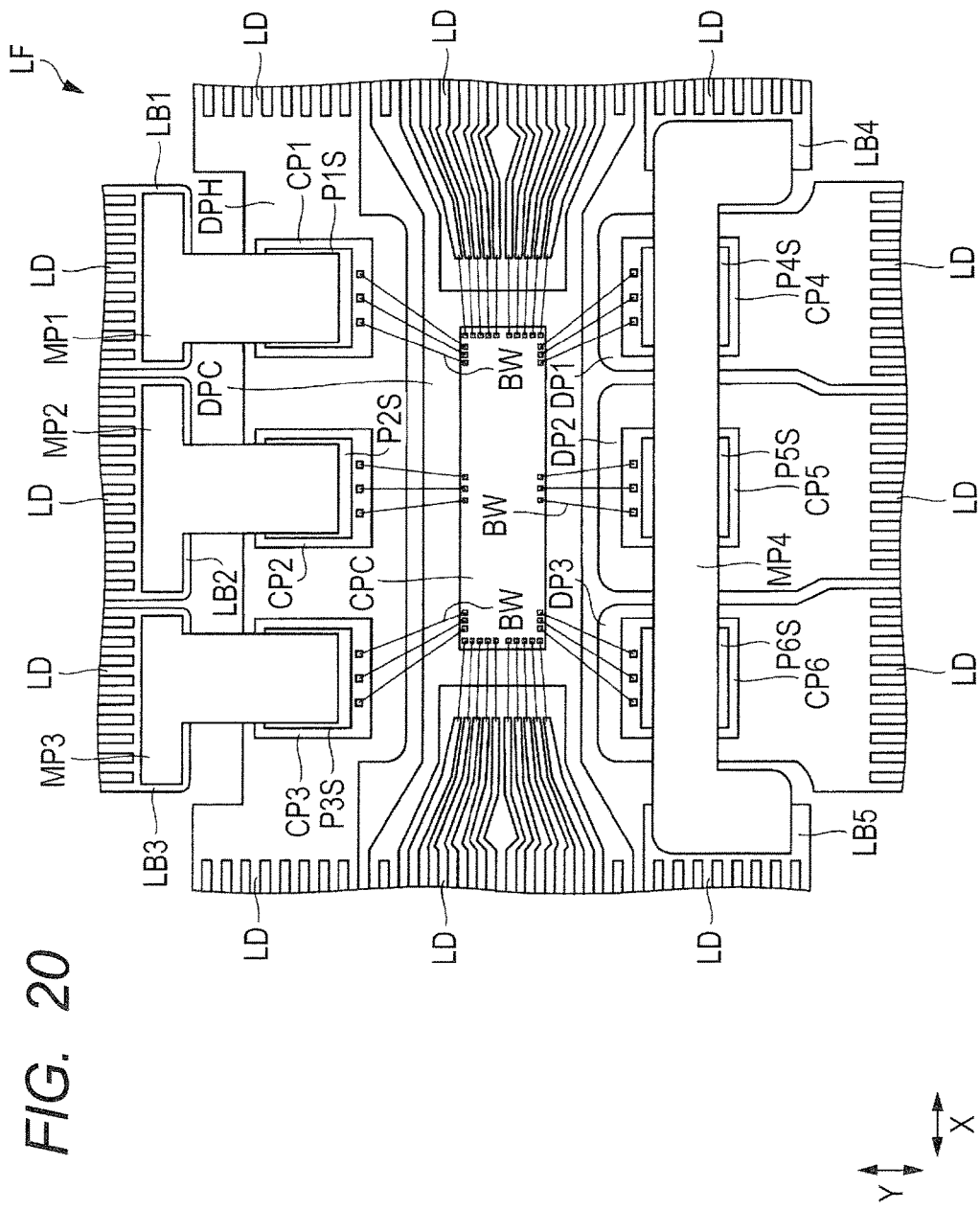
FIG. 20 is a plan view of the semiconductor device in the manufacturing process, following FIG. 19.

Subsequently, as illustrated in FIG. 20, a wire bonding step is performed. Specifically, the pads (P1G to P6G, P1 to P6) of the semiconductor chips CP1 to CP6 and pads (P7) of the semiconductor chip CPC are electrically coupled with each other via a wire BW. Further, pads (P7) of the semiconductor chip CPC and the leads (LD11, LD12) of the leadframe LF are electrically coupled with each other via a wire BW.

A plurality of different types of wires made of different materials may be used for the wire BW. For example, pads (P7) of the semiconductor chip CPC and the leads (LD11, LD12) of the leadframe LF are electrically coupled with each other via a wire BW made of copper (Cu). The pads (P1G to P6G, P1 to P6) of the semiconductor chips CP1 to CP6 and pads (P7) of the semiconductor chip CPC are electrically coupled with each other via a wire BW made of gold (Au).

Figure 21:
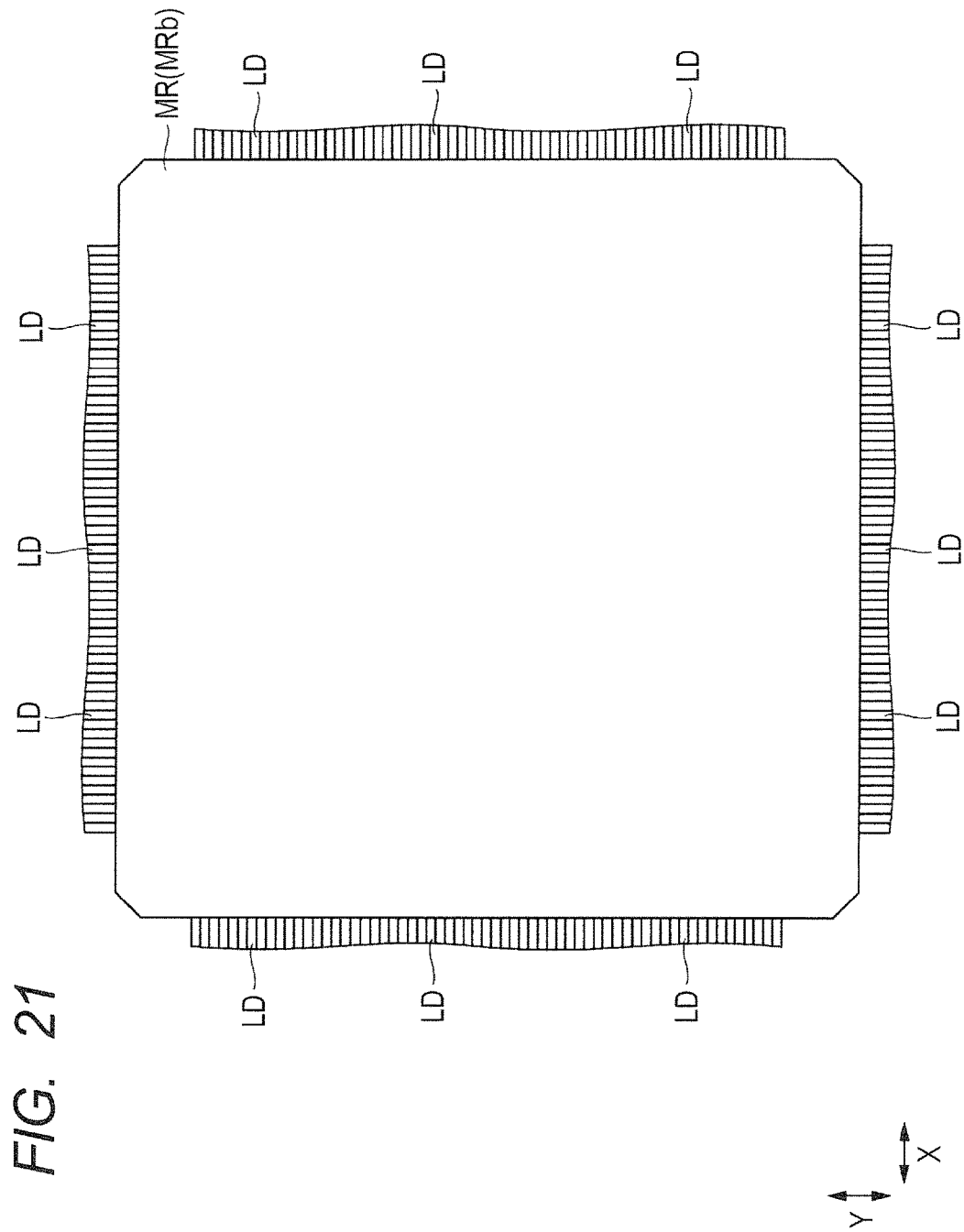
FIG. 21 is a plan view of the semiconductor device in the manufacturing process, following FIG. 20.
Figure 22:
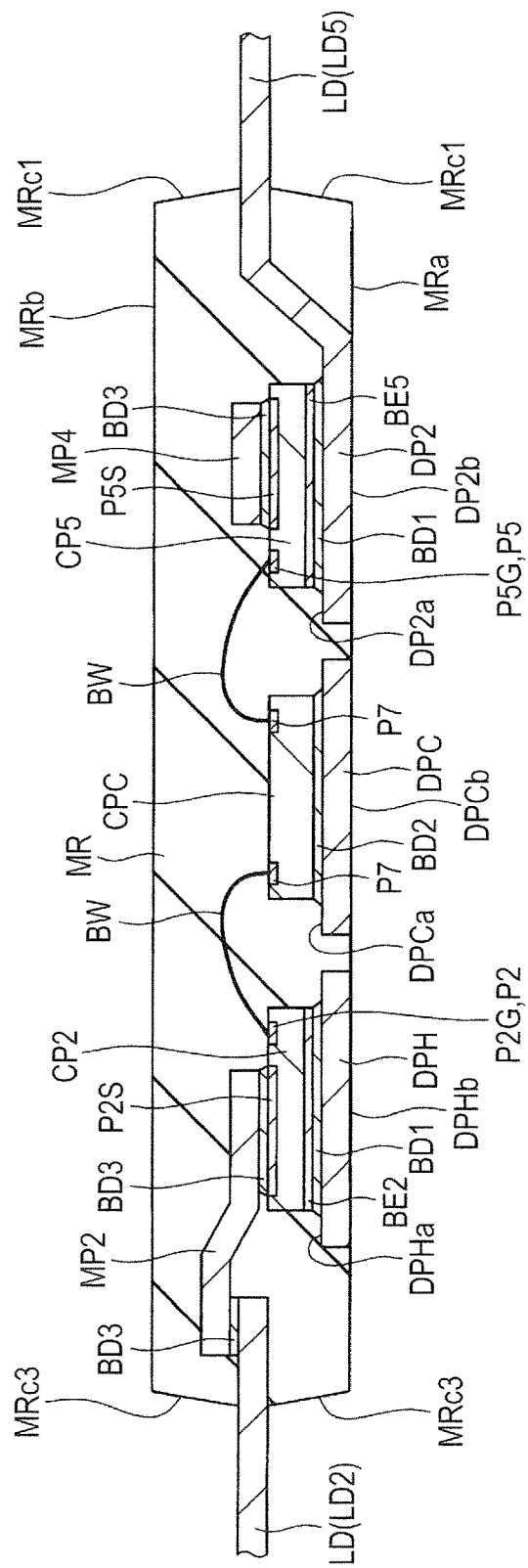
FIG. 22 is a sectional view of the same semiconductor device in the manufacturing process as in FIG. 21.

Subsequently, resin molding is performed by a molding step (resin molding step) to seal the semiconductor chips CPC, CP1 to CP6 and a plurality of wires BW and the metal plates MP1 to MP4 bonded thereto with the sealing portion MR as illustrated in FIG. 21 and FIG. 22. FIG. 22 shows a section equivalent to FIG. 10. This molding step forms the sealing portion MR sealing the semiconductor chips CPC, CP1 to CP6, the die pads DPC, DPH, DP1 to DP3, the wires BW, the metal plates MP1 to MP4, the lead coupling portions LB1 to LB5, and the inner lead portions of the leads LD. As also seen from FIG. 22, at the molding step, the sealing portion MR is formed such that the respective back faces DPCb, DPHb, DP1$b$, DP2$b$, DP3$b$ of the die pads DPC, DPH, DP1, DP2, DP3 are exposed from the principal surface MRa of the sealing portion MR.

Each step up to this molding step is performed with the principal surfaces DPCa, DPHa, DP1$a$, DP2$a$, DP3$a$ of the die pads DPC, DPH, DP1, DP2, DP3 facing upward. For this reason, when the sealing portion MR has been formed by the molding step, the back face MRb of the sealing portion MR faces upward. However, when the manufactured semiconductor device PKG is mounted over a circuit board or the like, the back face MRb of the sealing portion MR is opposed to the circuit board or the like.

Subsequently, a plating layer (not shown) is formed over the outer lead portions of the leads LD exposed from the sealing portion MR as required. Thereafter, the leadframe LF is turned upside down (reversed back to front) together with the sealing portion MR and then the leads LD are cut in position outside the sealing portion MR and separated from the framework of the leadframe LF.

Subsequently, the outer lead portions of the leads LD protruded from the sealing portion MR are subjected to folding (lead processing, lead forming).

The semiconductor device PKG shown in FIG. 5 to FIG. 15 is thus manufactured.

Implementation of Semiconductor Device PKG

FIG. 23 to FIG. 29 are a plan view (FIG. 23) or sectional views (FIG. 24 to FIG. 29) illustrating implementations of the semiconductor device PKG.

Figure 23:
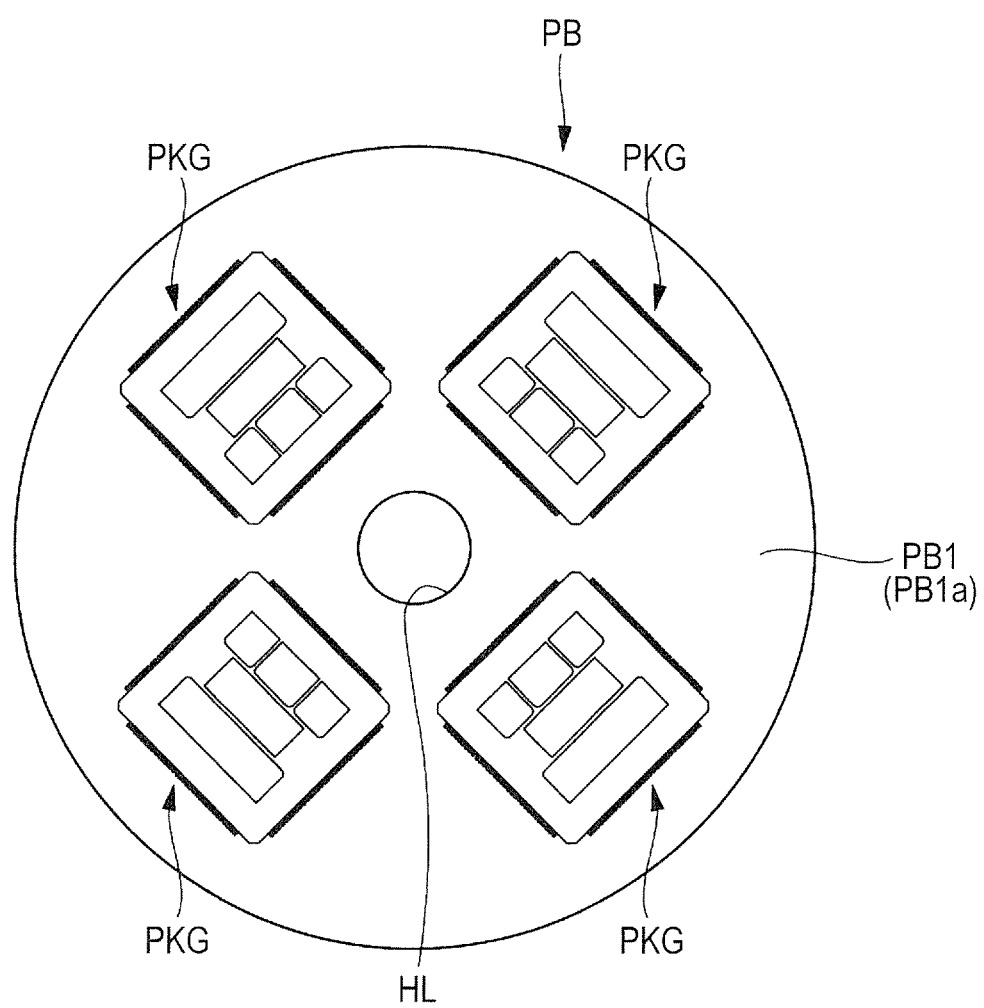
FIG. 23 is a plan view illustrating an implementation of a semiconductor device in an embodiment.

The semiconductor device PKG in this embodiment is a semiconductor device configuring an inverter circuit and three inverter circuits INV can be formed of one semiconductor device PKG. To control the above-mentioned motor MOT as a 12-phase BLDC motor, 12 inverter circuits INV are required and thus four semiconductor devices PKG are required. As illustrated in FIG. 23, four semiconductor devices PKG are mounted over a common circuit board (mount board, PCB (Printed circuit board) board) PB1.

The circuit board PB1 and the four semiconductor devices PKG implemented (mounted) over the circuit board PB1 configure the above-mentioned control board PB. For this reason, a planar shape of the circuit board PB1 becomes a planar shape of the control board PB. Since a planar shape of the control board PB is circular, a planar shape of the circuit board PB1 is also circular.

In the case shown in FIG. 23, a plurality of (four in this example) semiconductor devices PKG are annularly arranged and disposed over the principal surface (top face) PB1$a$ of the circular circuit board PB1 along the rim (edge, periphery) of the circuit board PB1. In the case shown in FIG. 23, as viewed in a plane, a distance between each of the (four) semiconductor devices PKG disposed over the circular circuit board PB1 and the center of the circular circuit board PB1 is identical. The four semiconductor devices PKG are symmetrically disposed over the principal surface PB1$a$ of the circular circuit board PB1. If the assumption is made that the circular circuit board PB1 is rotated through 90°, the four semiconductor devices PKG would overlap one another before and after the rotation.

The circuit board PB1 is provided with a hole (through hole, opening) HL for the above-mentioned steering shaft SF to penetrate. As viewed in a plane, this hole HL is formed substantially in the center of the circular circuit board PB1 and penetrates the circuit board PB1. A planar shape of the hole HL is substantially identical with a sectional shape of the above-mentioned steering shaft SF (shape of a section substantially perpendicular to the axial direction of the steering shaft SF) and is, for example, substantially circular. Provision of the hole HL in the circuit board PB1 makes it possible to dispose the circuit board PB1 (that is, the above-mentioned control board PB) mounted with the four semiconductor devices PKG such that the above-mentioned steering shaft SF penetrates the hole HL in the circuit board PB1. (Refer to FIG. 2.)

In the case described here, a plurality of (more specifically, four) semiconductor devices PKG are mounted over a circuit board PB1 whose planar shape is circular and which is provided with a hole HL. In another embodiment, a plurality of (more specifically, four) semiconductor device PKG may be mounted over a circuit board PB1 that is circular in planar shape but is not provided with a hole HL.

Figure 24:
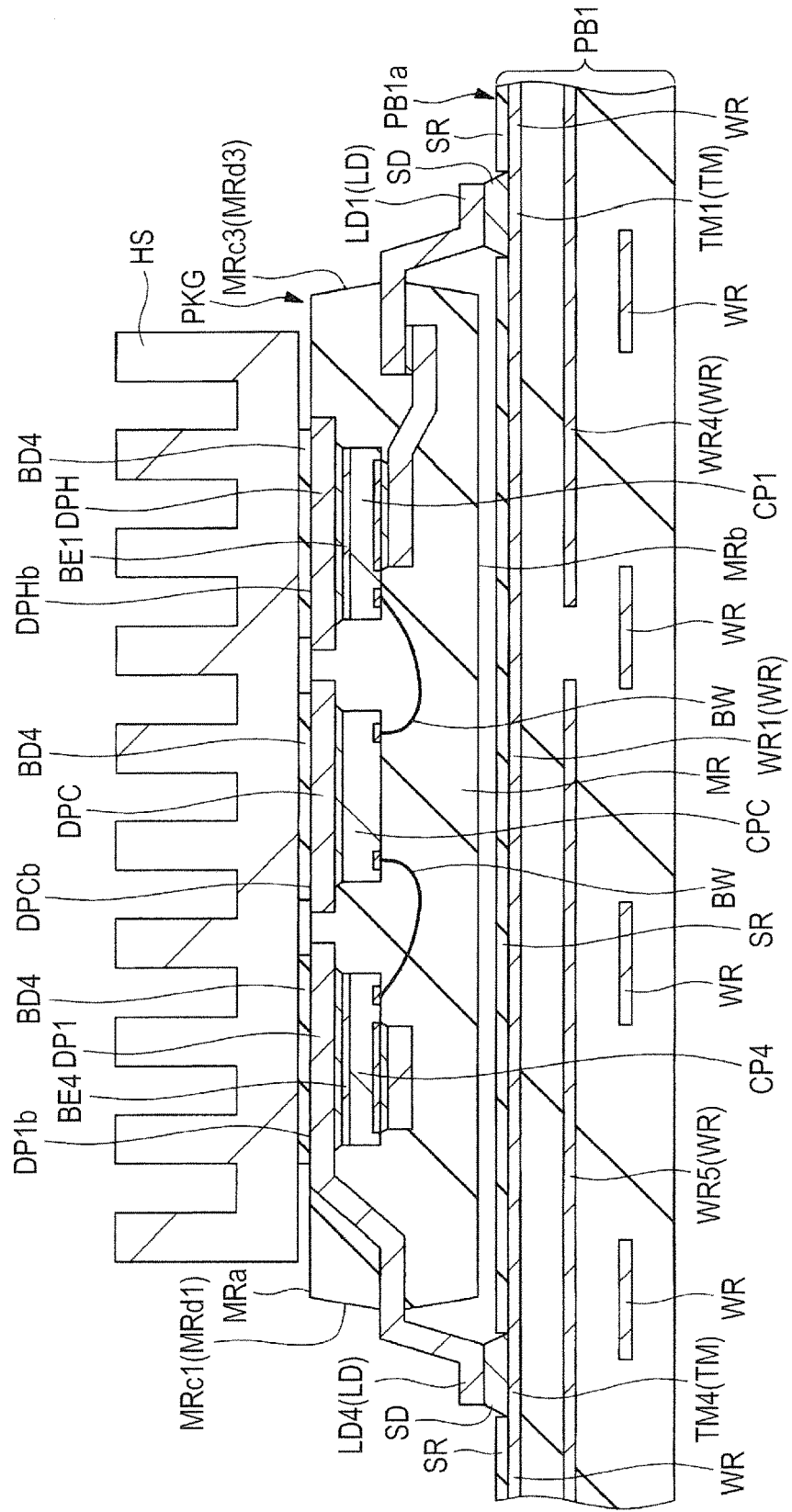
FIG. 24 is a sectional view illustrating an implementation of a semiconductor device in an embodiment.
Figure 25:
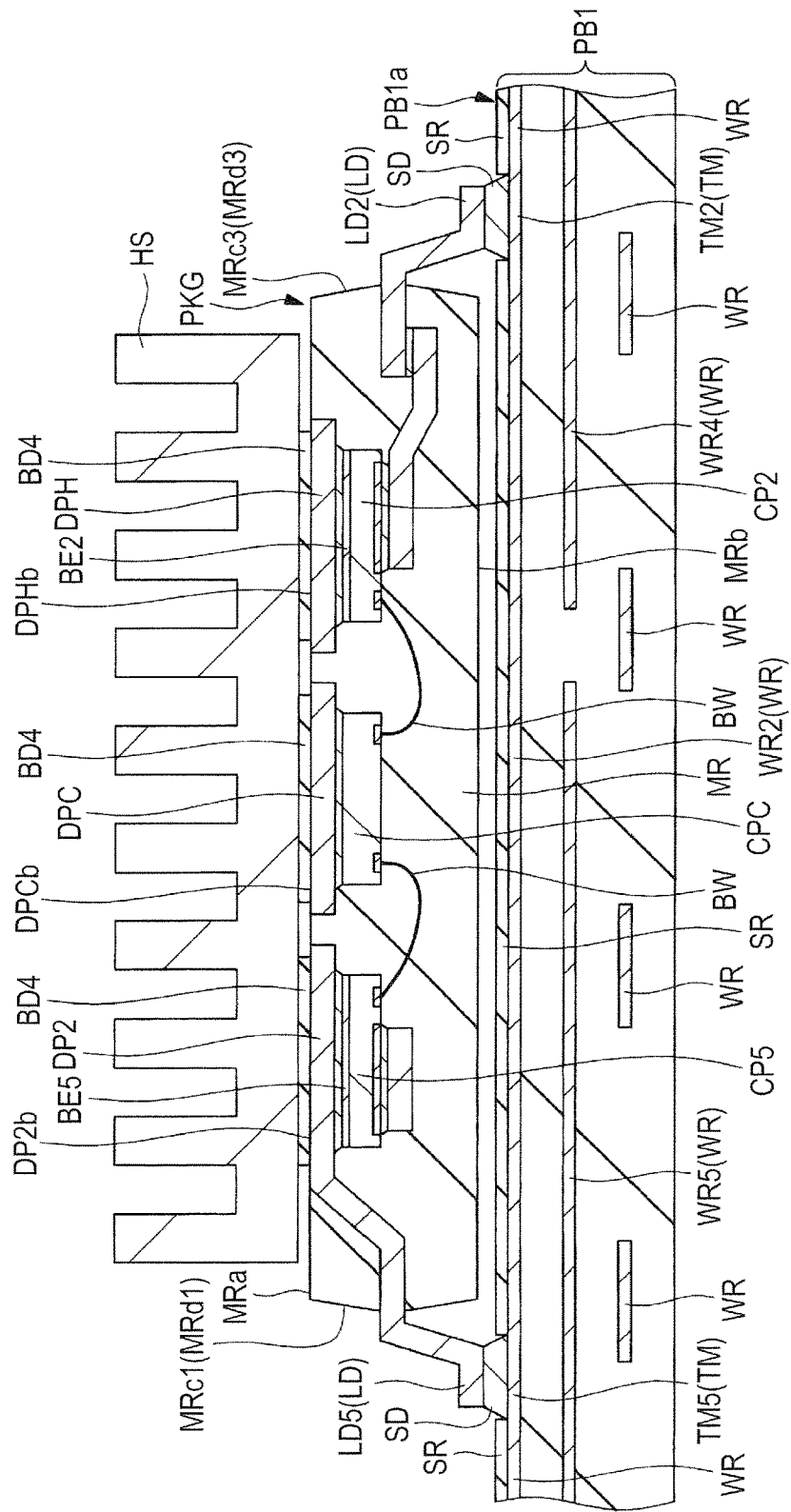
FIG. 25 is a sectional view illustrating an implementation of a semiconductor device in an embodiment.
Figure 26:
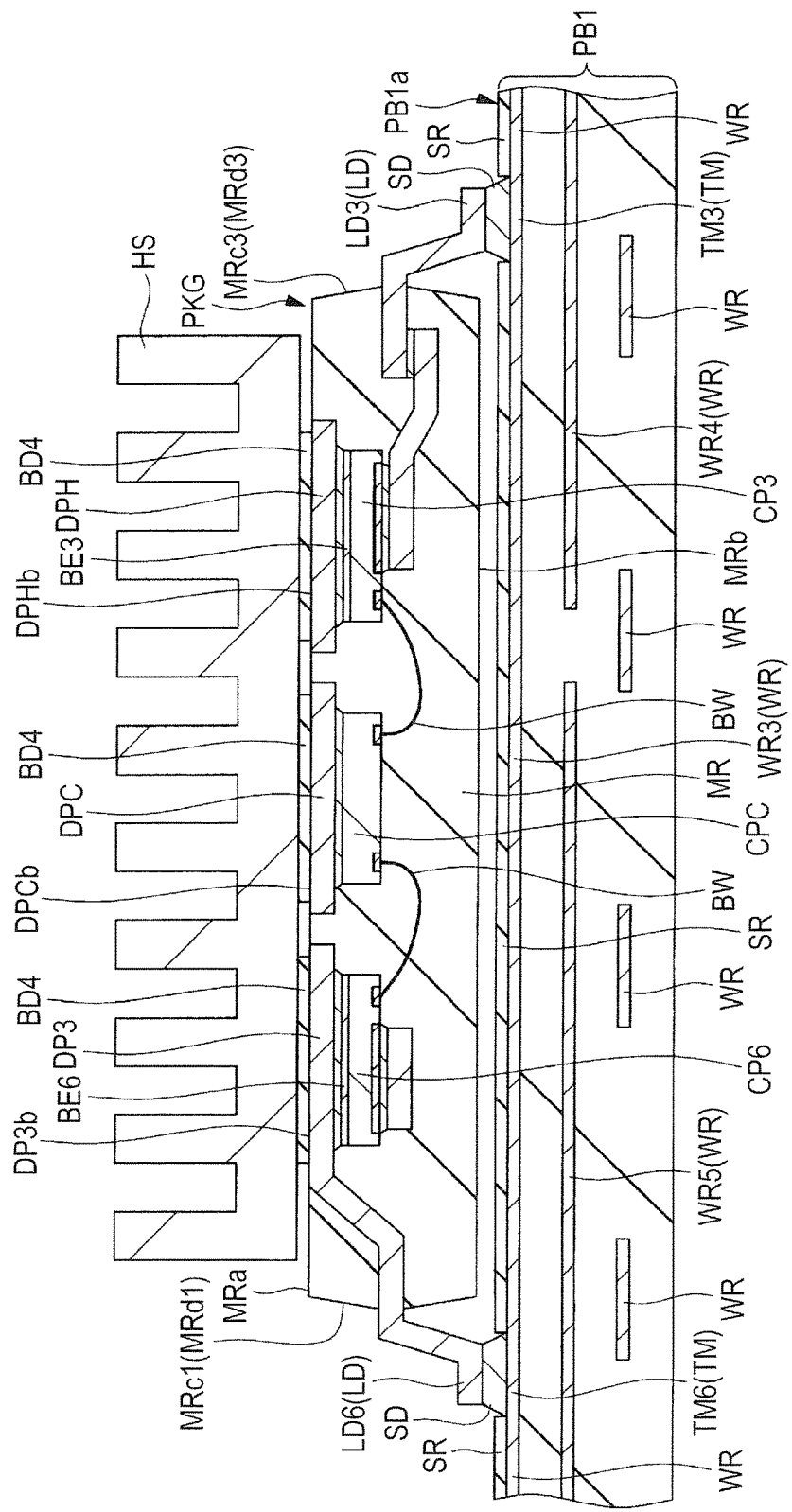
FIG. 26 is a sectional view illustrating an implementation of a semiconductor device in an embodiment.
Figure 27:
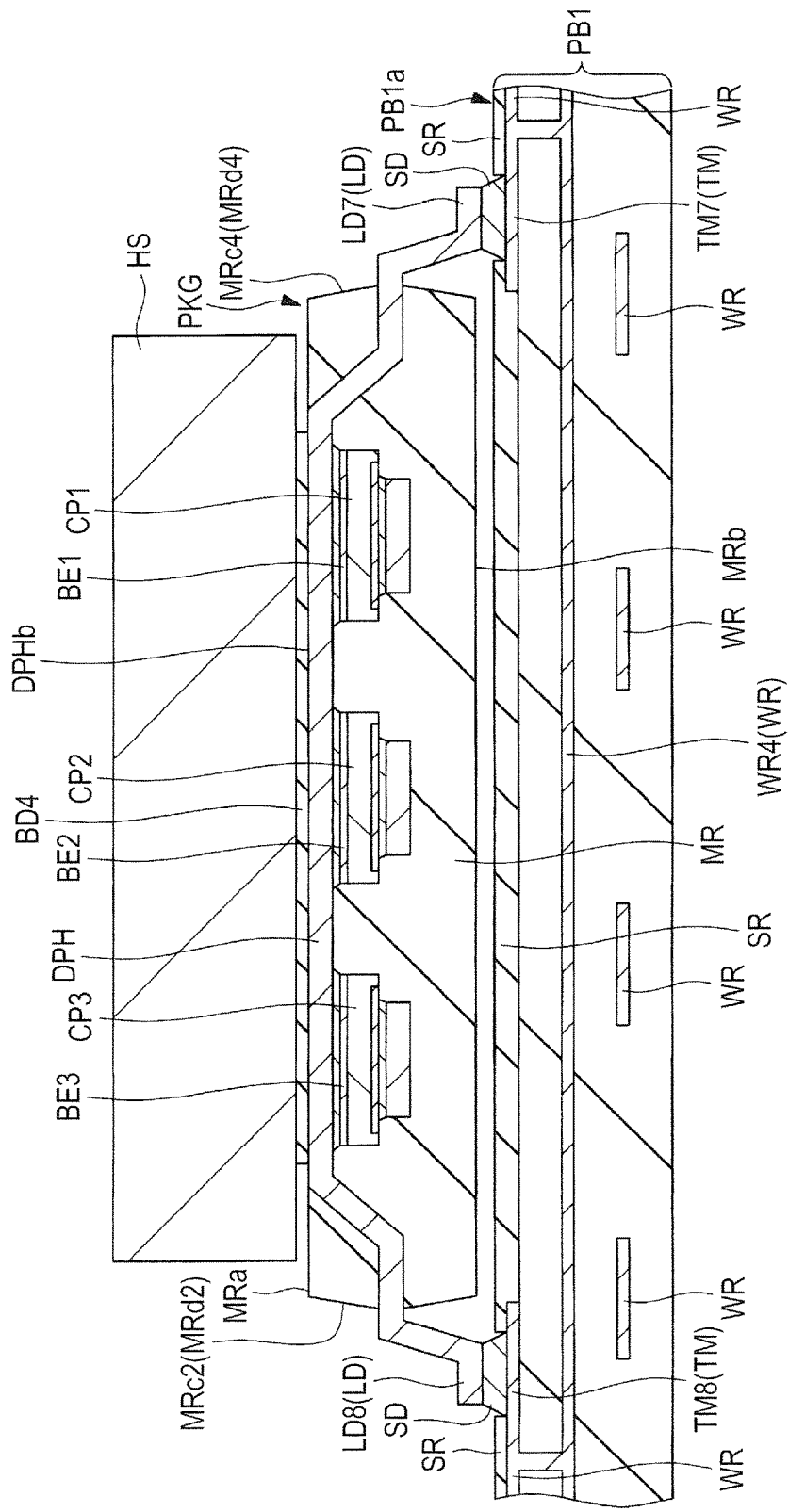
FIG. 27 is a sectional view illustrating an implementation of a semiconductor device in an embodiment.
Figure 28:
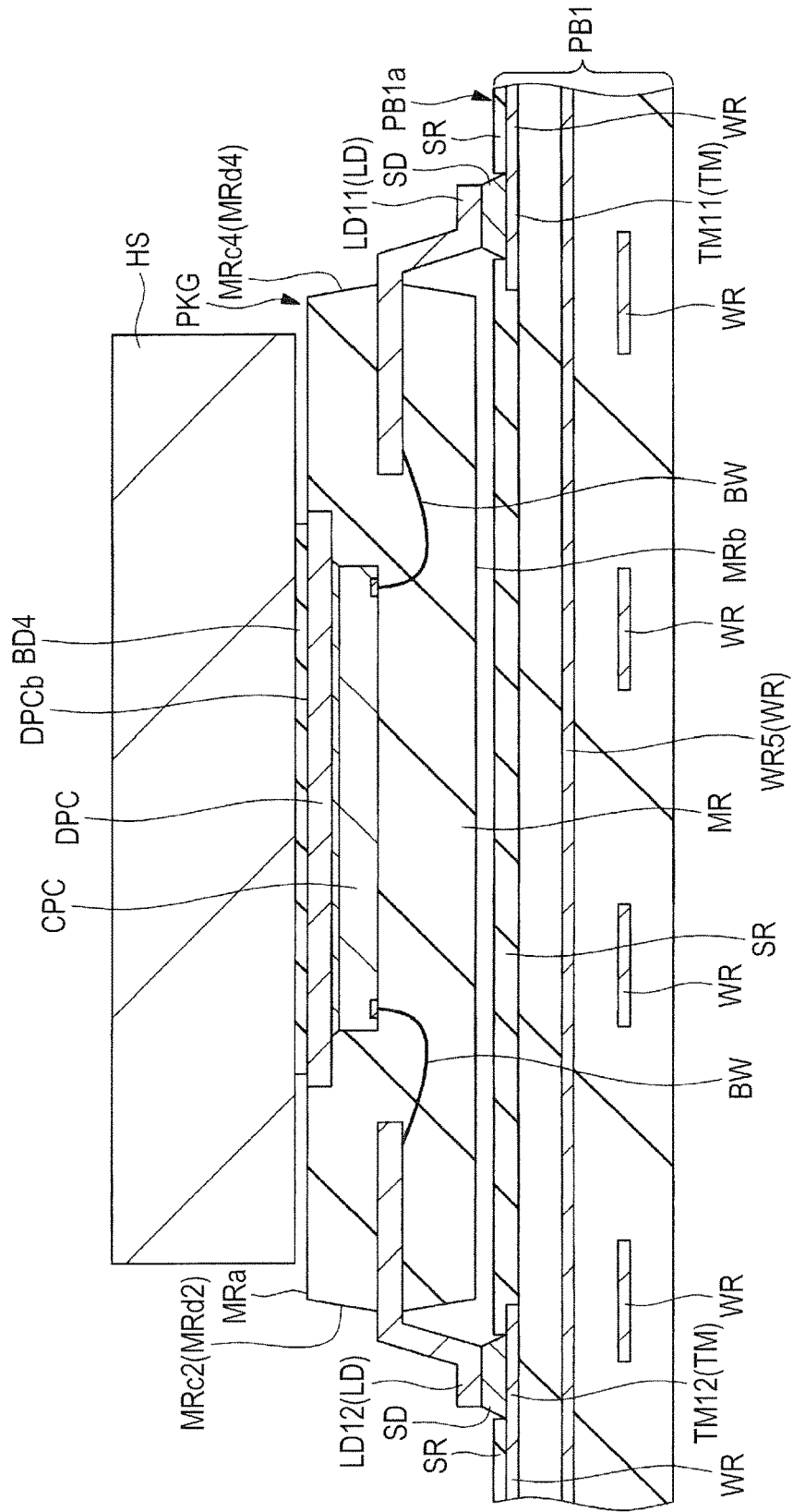
FIG. 28 is a sectional view illustrating an implementation of a semiconductor device in an embodiment.
Figure 29:
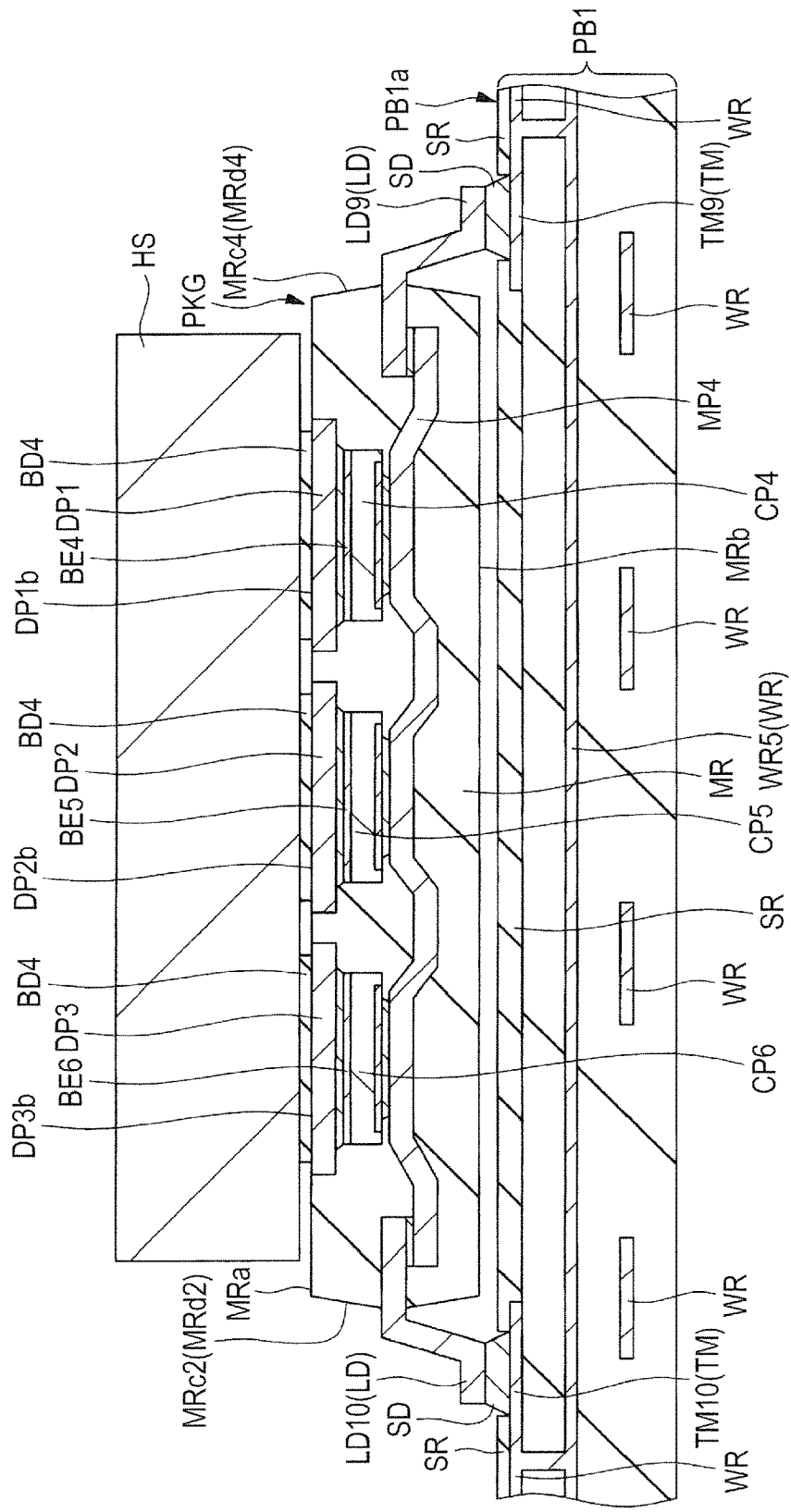
FIG. 29 is a sectional view illustrating an implementation of a semiconductor device in an embodiment.

FIG. 24 to FIG. 29 correspond to a sectional view of a principal part of FIG. 23. FIG. 24 is a sectional view taken in a position corresponding to FIG. 10 (that is, a position corresponding to line A1-A1 of FIG. 7) and FIG. 25 is a sectional view taken in a position corresponding to FIG. 11 (that is, a position corresponding to line A2-A2 of FIG. 7). FIG. 26 is a sectional view taken in a position corresponding to FIG. 12 (that is, a position corresponding to line A3-A3 of FIG. 7) and FIG. 27 is a sectional view taken in a position corresponding to FIG. 13 (that is, a position corresponding to line A4-A4 of FIG. 7). FIG. 28 is a sectional view taken in a position corresponding to FIG. 14 (that is, a position corresponding to line A5-A5 of FIG. 7) and FIG. 29 is a sectional view taken in a position corresponding to FIG. 15 (that is, a position corresponding to line A6-A6 of FIG. 7).

As also shown in FIG. 24 to FIG. 29, each semiconductor device PKG is mounted over the principal surface (top face) PB1$a$ of the circuit board PB1 such that the back face MRb of the sealing portion MR thereof is opposed to the principal surface PB1$a$ of the circuit board PB1. Each of the leads LD of each semiconductor device PKG is joined and electrically coupled to a terminal (electrode) TM formed in the principal surface PB1$a$ of the circuit board PB1 via a conductive bonding material (solder) SD such as solder.

The terminals TM provided in the circuit board PB1 includes: a plurality of terminals TM1 for coupling with the leads LD1; a plurality of terminals TM2 for coupling with the leads LD2; a plurality of terminals TM3 for coupling with the leads LD3; a plurality of terminals TM4 for coupling with the leads LD4; a plurality of terminals TM5 for coupling with the leads LD5; and a plurality of terminals TM6 for coupling with the lead LD6. The terminals TM provided in the circuit board PB1 further include: a plurality of terminals TM7 for coupling with the leads LD7; a plurality of terminals TM8 for coupling with the leads LD8; a plurality of terminals TM9 for coupling with the leads LD9; a plurality of terminals TM10 for coupling with the leads LD10; a plurality of terminals TM11 for coupling with the leads LD11; a plurality of terminals TM12 for coupling with the leads LD12; and a plurality of terminals (not shown) for coupling with the leads LD13.

The circuit board PB1 has a plurality of wiring layers and the wiring layers are formed in both the principal surfaces of the circuit board and in the interior of the circuit board. A so-called multilayer circuit board can be favorably used for the circuit board PB1. Each terminal TM (TM1 to TM12) is provided in the uppermost wiring layer (wiring layer on the principal surface PB1a side of the circuit board PB1) among the wiring layers provided in the circuit board PB1 but is exposed from an opening provided in a solder resist layer SR configuring the uppermost layer of the circuit board PB1. Each terminal TM is electrically coupled with a wiring WR of the circuit board PB1. The wirings WR provided in the circuit board PB1 include the wirings WR1, WR2, WR3, WR4, WR5 described later.

Each lead LD1 of each semiconductor device PKG is joined and electrically coupled to a terminal TM1; each lead LD2 is joined and electrically coupled to a terminal TM2; each lead LD3 is joined and electrically coupled to a terminal TM3; each lead LD4 is joined and electrically coupled to a terminal TM4; each lead LD5 is joined and electrically coupled to a terminal TM5; and each lead LD6 is joined and electrically coupled to a terminal TM6. These leads are respectively joined and electrically coupled via a conductive bonding material SD. Each lead LD7 is joined and electrically coupled to a terminal TM7; each lead LD8 is joined and electrically coupled to a terminal TM8; each lead LD9 is joined and electrically coupled to a terminal TM9; each lead LD10 is joined and electrically coupled to a terminal TM10; each lead LD11 is joined and electrically coupled to a terminal TM11; and each lead LD12 is joined and electrically coupled to a terminal TM12. These leads are respectively joined and electrically coupled via the conductive bonding material SD.

The terminals TM7, TM8 are terminals supplied with the above-mentioned potential VIN through a wiring WR of the circuit board PB1 and the like. As a result, the above-mentioned potential VIN is supplied from the terminals TM7, TM8 of the circuit board PB1 to the leads LD7, LD8 of each semiconductor device PKG and this potential VIN is further supplied to the back electrodes BE1, BE2, BE3 of the semiconductor chips CP1, CP2, CP3 via the die pad DPH within the semiconductor device PKG.

The terminals TM9, T10 are terminals supplied with ground potential GND through a wiring WR of the circuit board PB1 and the like. As a result, the ground potential GND is supplied from the terminals TM9, TM10 of the circuit board PB1 to the leads LD9, LD10 of each semiconductor device PKG and this ground potential GND is further supplied to the source pads P4S, P5S, P6S of the semiconductor chips CP4, CP5, CP6 via the metal plate MP4 within the semiconductor device PKG.

The terminals TM11, TM12 are terminals electrically coupled to the above-mentioned control circuit CT through a wiring WR of the circuit board PB1 and the like. As a result, the control circuit CLC in each semiconductor chip CPC can communicate signals to and from the above-mentioned control circuit CT through the pads P7, the wires BW, and the leads LD11, LD12 of the semiconductor chip CPC, the terminals TM11, TM12 and a wiring WR of the circuit board PB1, and the like. In the circuit board PB1, a wiring coupled to each terminal TM11, TM12 need not be disposed below each semiconductor device PKG.

Figure 30:
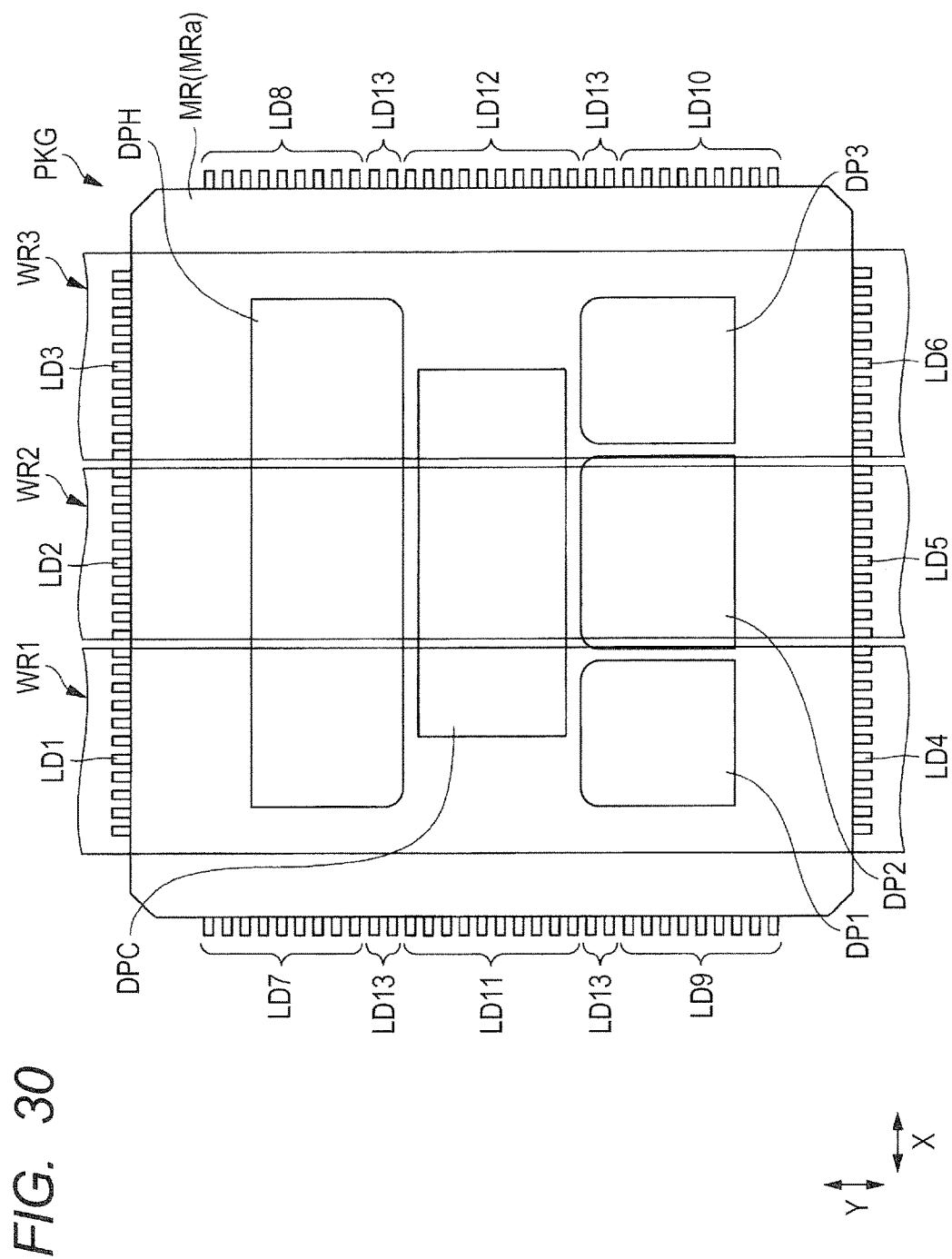
FIG. 30 is a plan view of the semiconductor device in FIG. 5 with the wiring of a circuit board superposed thereon.

The terminals TM1, TM2, TM3, TM4, TM5, TM6 are terminals coupled to the above-mentioned motor MOT (coil CL) via a wiring WR of the circuit board PB1. In the circuit board PB1, the terminals TM1 and the terminals TM4 are electrically coupled with each other through the wiring WR1 of the circuit board PB1; the terminals TM2 and the terminals TM5 are electrically coupled with each other through the wiring WR2 of the circuit board PB1; and the terminals TM3 and the terminals TM6 are electrically coupled with each other through the wiring WR3 of the circuit board PB1. These wirings WR1, WR2, WR3 are provided in the same layer as the terminals TM and are disposed below each semiconductor device PKG with the semiconductor device PKG mounted over the circuit board PB1. The wiring WR1 is extended in the Y direction below each semiconductor device PKG so as to tie the terminals TM1 and the terminals TM4 together; the wiring WR2 is extended in the Y direction below each semiconductor device PKG so as to tie the terminals TM2 and the terminals TM5 together; and the wiring WR3 is extended in the Y direction below each semiconductor device PKG so as to tie the terminals TM3 and the terminals TM6 together. FIG. 30 is a plan view of the wirings WR1, WR2, WR3 as superposed on FIG. 5 (top view of the semiconductor device PKG) for making the plane positions of the wirings WR1, WR2, WR3 understandable.

For this reason, with each semiconductor device PKG mounted over the circuit board PB1, the leads LD1 and the leads LD4 of the semiconductor device PKG are electrically coupled with each other through the terminals TM1, TM4 and the wiring WR1 of the circuit board PB1 and are further electrically coupled to the above-mentioned motor MOT (coil CL) through a wiring WR of the circuit board PB1 and the like. The leads LD2 and the leads LD5 of each semiconductor device PKG are electrically coupled with each other through the terminals TM2, TM5 and the wiring WR2 of the circuit board PB1 and are further electrically coupled to the above-mentioned motor MOT (coil CL) through a wiring WR of the circuit board PB1 and the like. The leads LD3 and the leads LD6 of each semiconductor device PKG are electrically coupled with each other through the terminals TM3, TM6 and the wiring WR3 of the circuit board PB1 and are further electrically coupled to the above-mentioned motor MOT (coil CL) through a wiring WR of the circuit board PB1 and the like.

The above-mentioned wirings WR1, WR2, WR3 are provided in the uppermost wiring layer among the wiring layers provided in the circuit board PB1. In the uppermost wiring layer of the circuit board PB1, the wirings WR1, WR2, WR3 are disposed below each semiconductor device PKG. As a result, the leads LD1, LD4 of the semiconductor device PKG can be coupled with each other with low resistance; the leads LD2, LD5 of the semiconductor device PKG can be coupled with each other with low resistance; and the leads LD3, LD6 of the semiconductor device PKG can be coupled with each other with low resistance. This enables reduction of a conduction loss. In the circuit board PB1, the wirings WR1, WR2, WR3 are separated from one another and any one of them is not electrically coupled with another.

The terminals TM7 and the terminals TM8 of the circuit board PB1 are electrically coupled with each other through the wiring (power supply wiring) WR4 of the circuit board PB1. The terminals TM9 and the terminals TM10 of the circuit board PB1 are electrically coupled with each other through the wiring (ground wiring) WR5 of the circuit board PB1. For this reason, with each semiconductor device PKG mounted over the circuit board PB1, the wiring WR4 can be considered as a wiring electrically coupling the leads LD7 and the leads LD8 of the semiconductor device PKG with each other; and the wiring WR5 can be considered as a wiring electrically coupling the leads LD9 and the leads LD10 of the semiconductor device PKG with each other. In the circuit board PB1, the wirings WR4, WR5 can be provided in a wiring layer lower than a wiring layer where the wirings WR1, WR2, WR3 are formed. That is, the wirings WR4, WR5 can be provided below the wirings WR1, WR2, WR3. As viewed from a different standpoint, in the circuit board PB1, the wirings WR4, WR5 can be provided in a wiring layer different from a wiring layer where the wirings WR1, WR2, WR3 are formed. As a result, in the circuit board PB1, the terminals TM7, TM8 can be electrically coupled with each other through the wiring WR4 and the terminals TM9, TM10 can be electrically coupled with each other through the wiring WR5 without being obstructed by the wirings WR1, WR2, WR3. This makes it possible to reduce a conduction loss and enables impedance reduction.

Further, the wirings WR4, WR5 can be increased in wiring width and made larger in wiring width than each of the wirings WR1, WR2, WR3, for example. That is, the wirings WR4, WR5 can be formed as a pattern with a large area (for example, a pattern with an area larger than that of each of the wirings WR1, WR2, WR3). This makes it possible to reduce a conduction loss and enables impedance reduction.

The above-mentioned leads LD13 of the semiconductor device PKG are electrically unnecessary leads LD but it is desirable to couple the leads LD13 to a ground terminal (a terminal supplied with ground potential GND) in the circuit board PB1 for noise resistance enhancement. In this case, the die pad DPC of the semiconductor device PKG can be supplied with ground potential from the ground terminal of the circuit board PB1 via the leads LD13.

In the case shown in FIG. 24 to FIG. 29, a heat sink (enclosure) HS is disposed (mounted) over the principal surface MRa of the sealing portion MR of each semiconductor device PKG mounted over the circuit board PB1 through an insulative adhesive material BD4. For example, insulative, thermally conductive grease or the like can be used for the adhesive material BD4. For example, a fin-type heat sink or the like can be used for the heat sink HS.

In the semiconductor device PKG, the back faces DPCb, DPHb, DP1b, DP2b, DP3b of the die pads DPC, DPH, DP1, DP2, DP3 are exposed from the principal surface MRa of the sealing portion MR. These back faces DPCb, DPHb, DP1b, DP2b, DP3b are joined to a heat sink HS via the insulative adhesive material BD4. That is, the insulative adhesive material BD4 is located between the back faces DPCb, DPHb, DP1b, DP2b, DP3b of the die pads DPC, DPH, DP1, DP2, DP3 of the semiconductor device PKG and the heat sink HS. As a result, heat produced in the semiconductor chips CPC, CP1 to CP6 within the semiconductor device PKG can be dissipated to the heat sink HS via the die pads DPC, DPH, DP1, DP2, DP3 and the adhesive material BD4 (thermally conductive grease).

Use of an insulative adhesive material BD4 instead of a conductive one makes it possible to prevent the die pads DPC, DPH, DP1, DP2, DP3 of the semiconductor device PKG from being electrically coupled with one another through an adhesive material BD4 or a heat sink HS and attach a heat sink HS large in thermal capacity (large in volume) to the semiconductor device PKG.

Investigated Example

Figure 31:
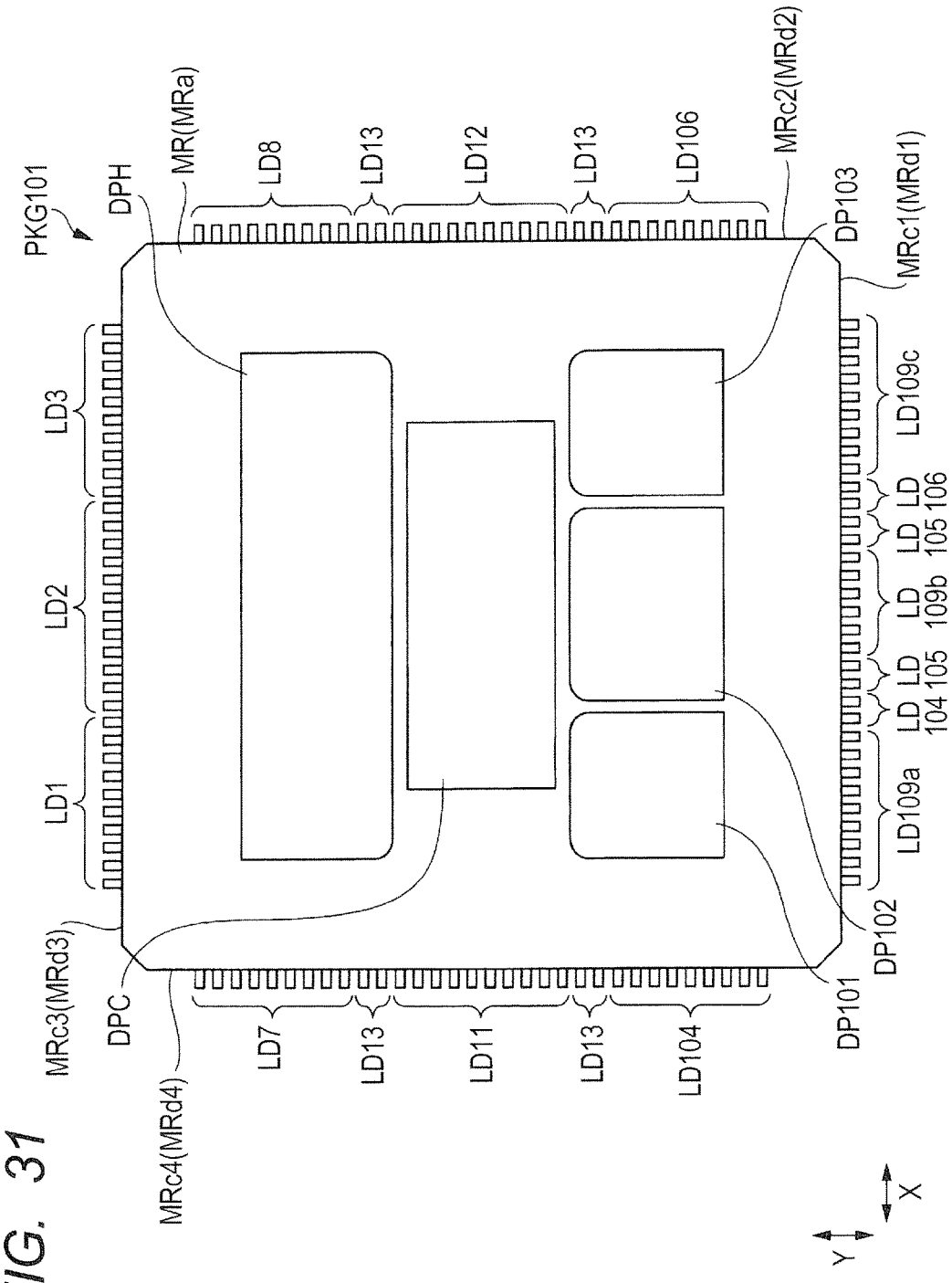
FIG. 31 is a top view of a semiconductor device in an investigated example.
Figure 32:
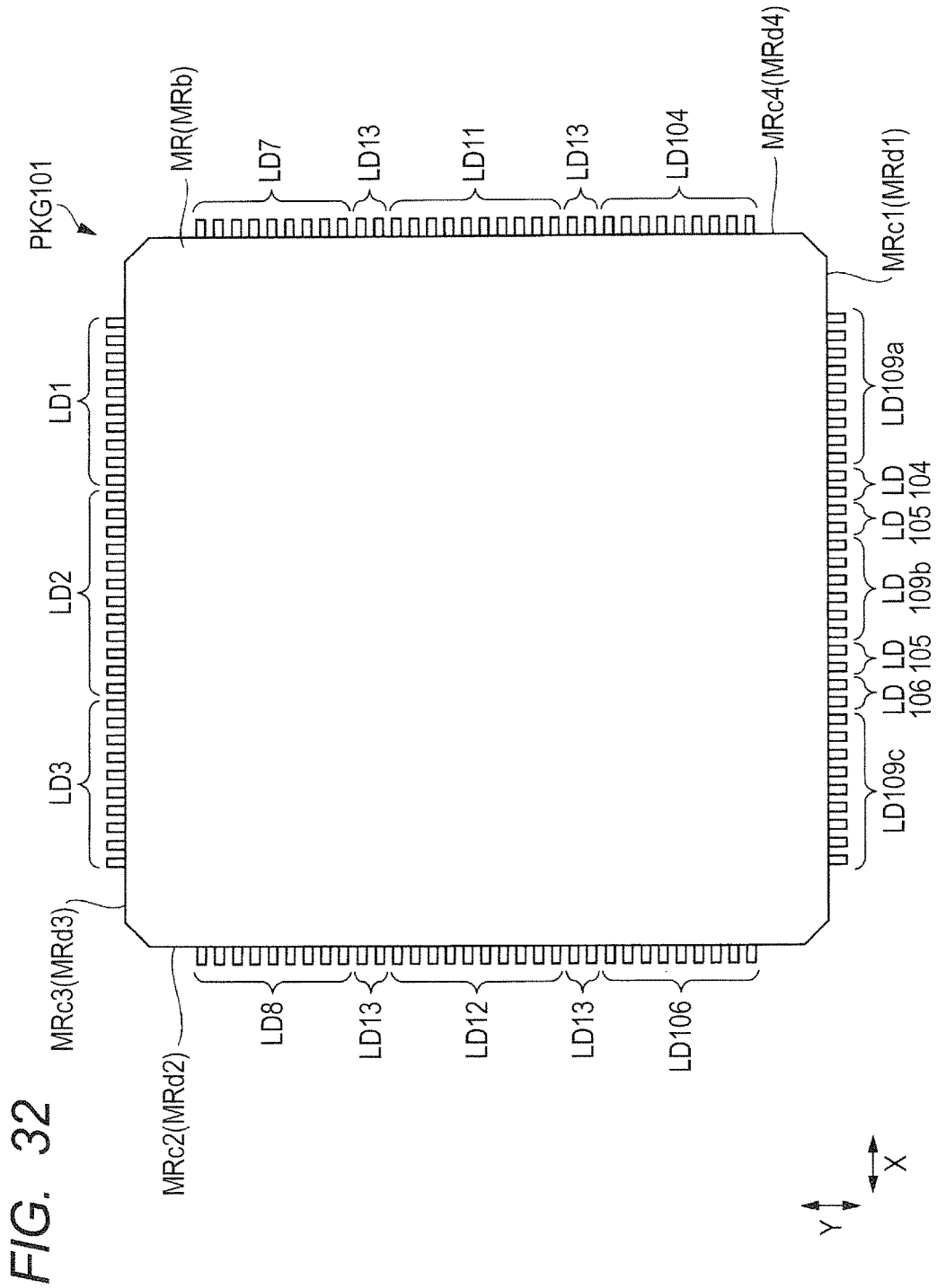
FIG. 32 is a bottom view of a semiconductor device in an investigated example.
Figure 33:
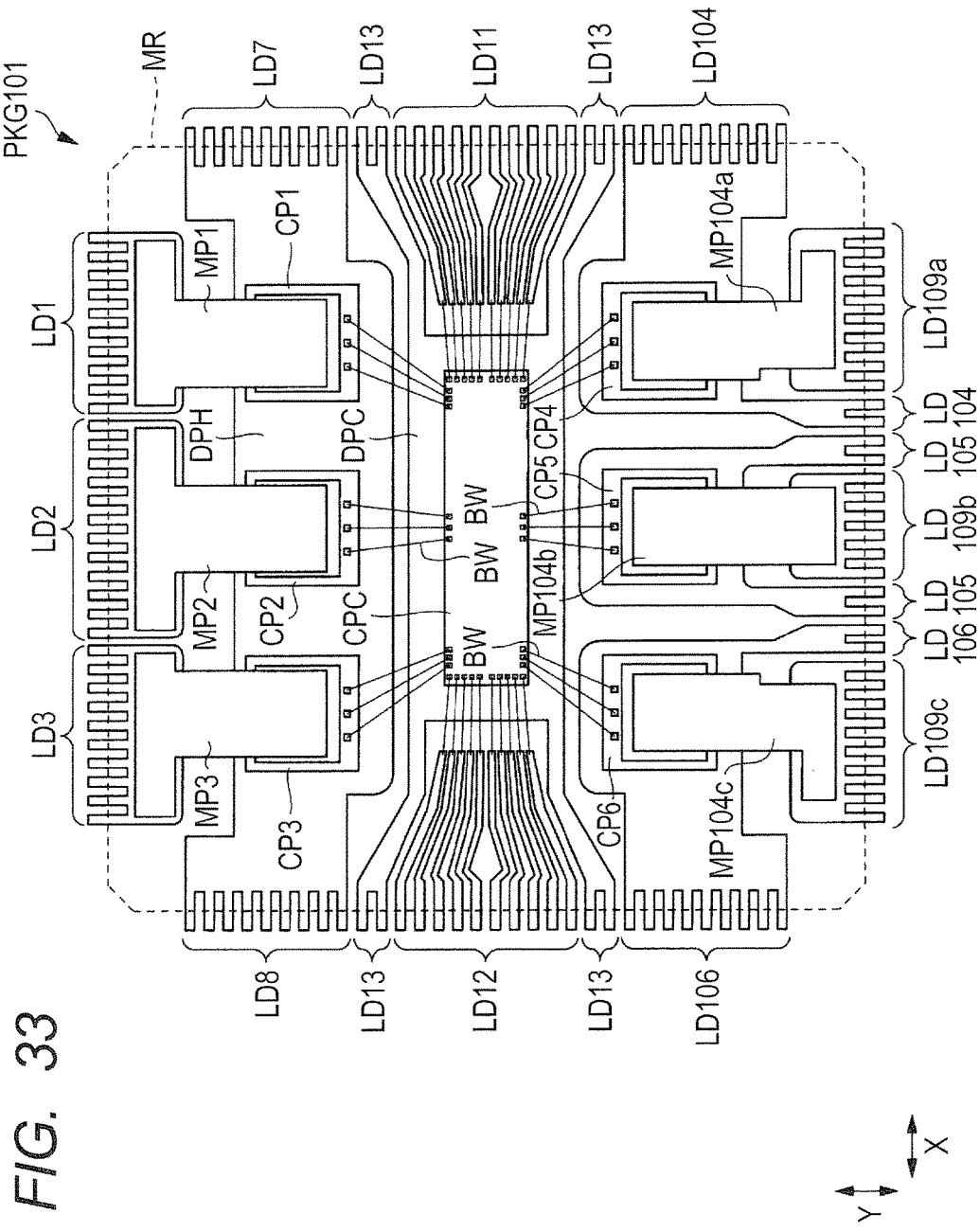
FIG. 33 is a planar perspective view of a semiconductor device in an investigated example.
Figure 34:
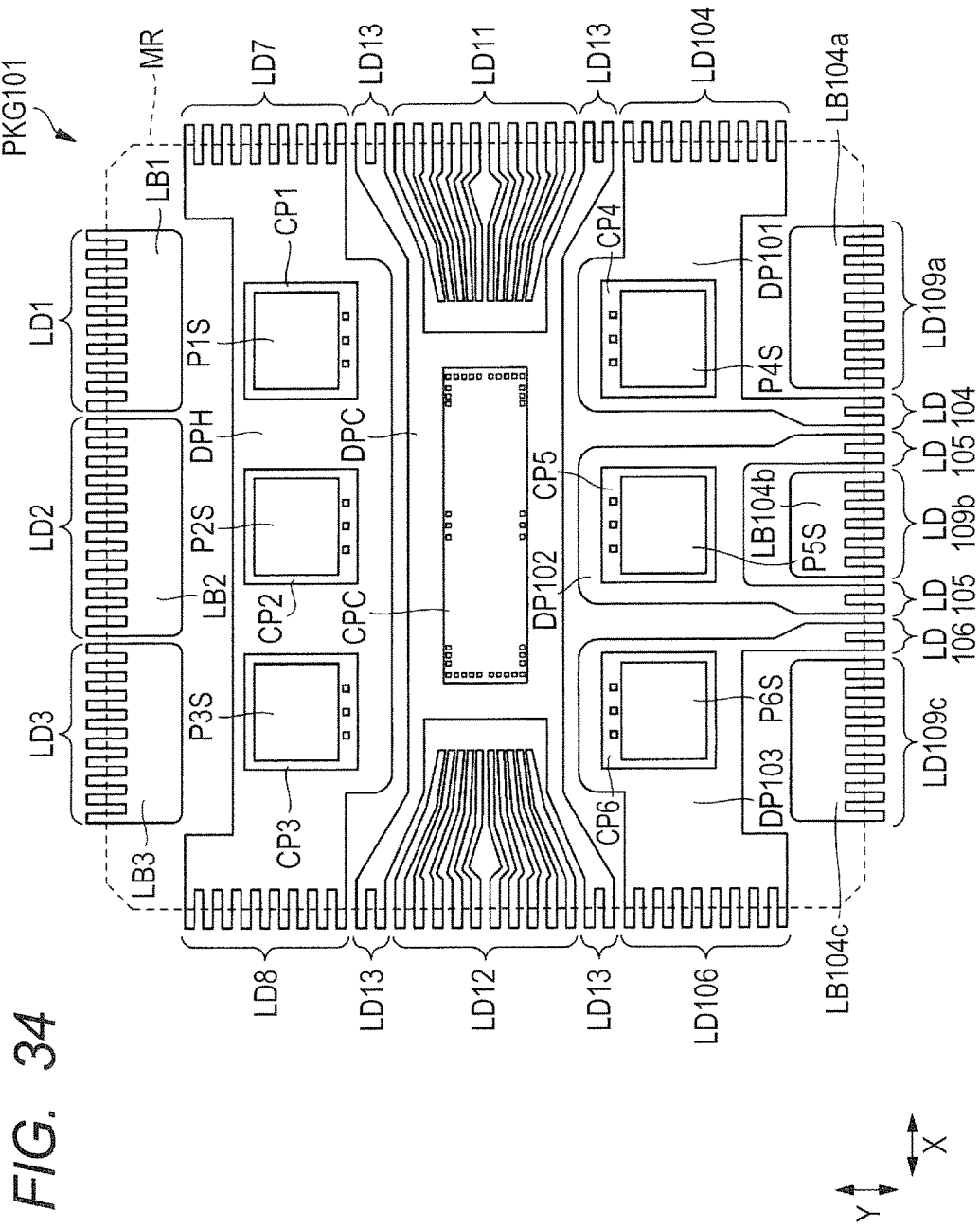
FIG. 34 is a planar perspective view of a semiconductor device in an investigated example.
Figure 35:
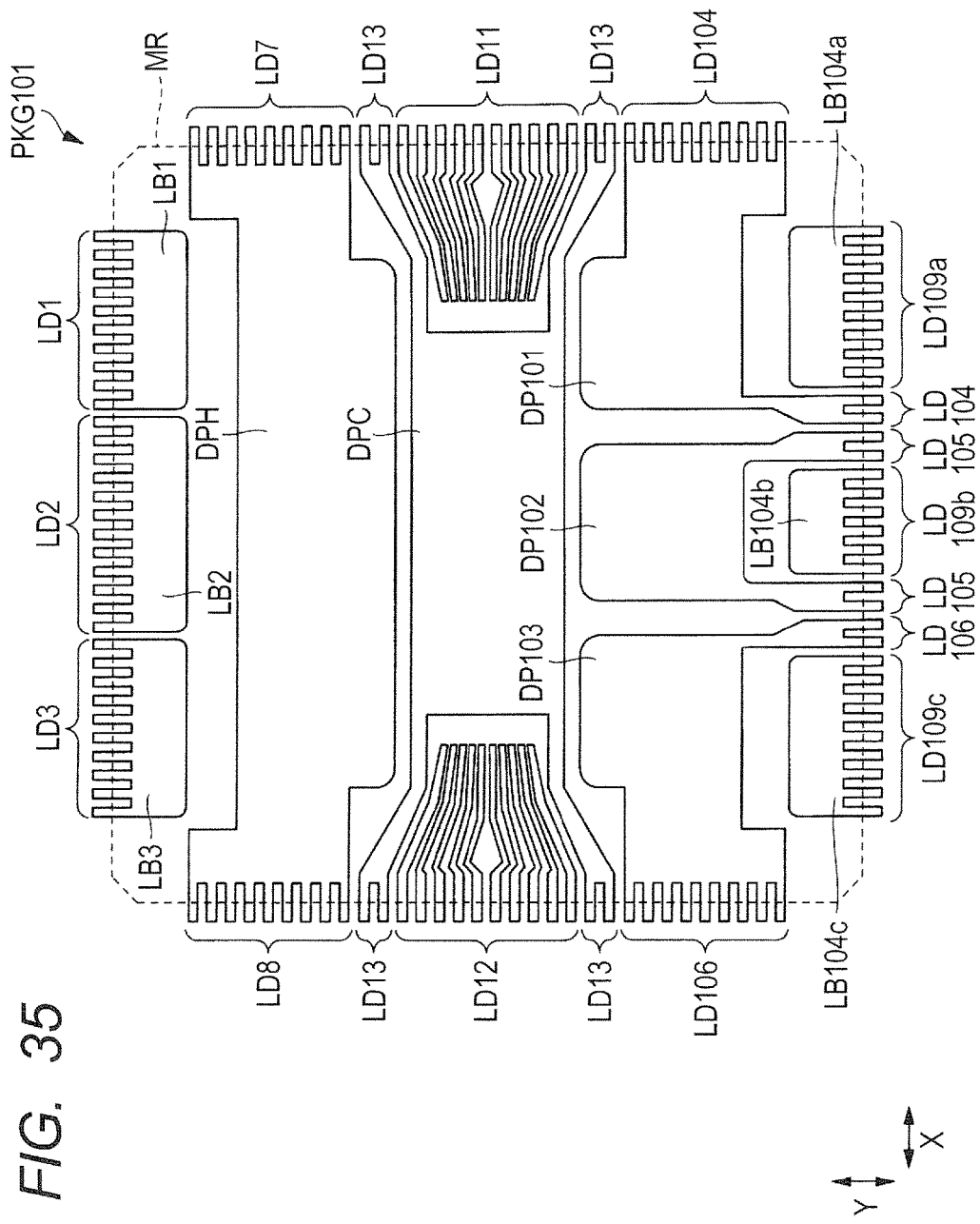
FIG. 35 is a planar perspective view of a semiconductor device in an investigated example.

FIG. 31 to FIG. 35 are a top view (FIG. 31), a bottom view (FIG. 32), or planar perspective views (FIG. 33 to FIG. 35) illustrating a semiconductor device PKG101 in an investigated example investigated by the present inventors. FIG. 31 corresponds to FIG. 5; FIG. 32 corresponds to FIG. 6; FIG. 33 corresponds to FIG. 7; FIG. 34 corresponds to FIG. 8; and FIG. 35 corresponds to FIG. 9.

In the semiconductor device PKG101 in the investigated example shown in FIG. 31 to FIG. 35, the die pads DPH, DPC, the semiconductor chips CPC, CP1, CP2, CP3, the lead coupling portions LB1, LB2, LB3, the leads LD1, LD2, LD3, LD7, LD8, LD11, LD12, and the metal plates MP1, MP2, MP3 are substantially identical with those of the semiconductor device PKG. However, the semiconductor device PKG101 in the investigated example shown in FIG. 31 to FIG. 35 is different from the above-mentioned semiconductor device PKG in the following respects:

In the semiconductor device PKG101 in the investigated example, the semiconductor chips CP4, CP5, CP6 are respectively mounted over die pads DP101, DP102, DP103 equivalent to the die pads DP1, DP2, DP3. None of the source pads P4S, P5S, P6S of the semiconductor chips CP4, CP5, CP6 is coupled to a common metal plate. Specifically, the source pad P4S of the semiconductor chip CP4 is coupled to a lead coupling portion LB104a via a metal plate MP104a and a plurality of leads LD109a are integrally coupled to the lead coupling portion LB104a. The source pad P5S of the semiconductor chip CP5 is coupled to a lead coupling portion LB104b via a metal plate MP104b and a plurality of leads LD109b are integrally coupled to the lead coupling portion LB104b. The source pad P6S of the semiconductor chip CP6 is coupled to a lead coupling portion LB104c via a metal plate MP104c and a plurality of leads LD109c are integrally coupled to the lead coupling portion LB104c. The leads LD109a, LD109b, LD109c for the sources of the low-side power MOSFETs (4, 5, 6) are disposed on the side face MRc1 side of the sealing portion MR.

In the semiconductor device PKG101 in the investigated example, a plurality of leads LD104 formed integrally with the die pad DP101 are disposed on the side face MRc4 side and the side face MRc1 side of the sealing portion MR. A plurality of leads LD105 formed integrally with the die pad DP102 are disposed on the side face MRc1 side of the sealing portion MR. A plurality of leads LD106 formed integrally with the die pad DP103 are disposed on the side face MRc2 side and the side face MRc1 side of the sealing portion MR. Therefore, of these leads LD104, LD105, LD106 for the drains of the low-side power MOSFETs (4, 5, 6), the leads LD104 are disposed on the side face MRc4 side and the side face MRc1 side of the sealing portion MR; the leads LD106 are disposed on the side face MRc2 side and the side face MRc1 side of the sealing portion MR; and the leads LD105 are disposed only on the side face MRc1 side of the sealing portion MR.

It was found through investigation by the present inventors that in such a semiconductor device PKG101 in the investigated example, the following problems would arise:

Since the die pad DP102 is sandwiched between the die pad DP101 and the die pad DP103, the leads LD105 formed integrally with the die pad DP102 must be inevitably disposed in a position opposite the die pad DP102 (semiconductor chip CP5) on the side face MRc1 side of the sealing portion MR. Meanwhile, the leads LD109b electrically coupled to the source pad P5S of the semiconductor chip CP5 via the metal plate MP104b must also be inevitably disposed in a position opposite the die pad DP102 (semiconductor chip CP5) on the side face MRc1 side of the sealing portion MR. This is because the metal plate MP104b is coupled to the source pad P5S of the semiconductor chip CP5 but is not coupled to the source pad P4S, P6S of each of the semiconductor chips CP4, CP6; therefore, the metal plate MP104*b* must be disposed so as not to overlap with each of the die pads DP101, DP103 and the semiconductor chips CP4, CP6 as viewed in a plane. For this reason, it turns out that the leads LD109*b* are disposed in a position opposite the die pad DP102 (semiconductor chip CP5) on the side face MRc1 side of the sealing portion MR and further the leads LD109*b* and the source pad P5S of the semiconductor chip CP5 are electrically coupled with each other via the metal plate MP104*b* extending in the Y direction.

Therefore, in the semiconductor device PKG101 in the investigated example, the leads LD109*b* for the source of the semiconductor chip CP5 (power MOSFET 5) and the leads LD105 for the drain must be both disposed in a narrow area opposite the die pad DP102 (semiconductor chip CP5) on the side face MRc1 side of the sealing portion MR. That is, an area where the leads LD109*b* for the source of the semiconductor chip CP5 (power MOSFET 5) can be disposed and an area where the leads LD105 for the drain can be disposed are limited to a narrow area opposite the die pad DP102 (semiconductor chip CP1) on the side face MRc1 side of the sealing portion MR. This incurs increase in resistance of a current path passing through the source pad P5S of the semiconductor chip CP5, the metal plate MP104*b*, and the leads LD109*b* or incurs increase in resistance of a current path passing through the back electrode BE5 of the semiconductor chip CP5, the die pad DP102, and the leads LD105. These leads to increase in on-resistance (resistance during conduction) of the semiconductor chip CP5 (power MOSFET 5). This will degrade performance of the semiconductor device PKG101.

For example, in the case shown in FIG. 31 to FIG. 35, the die pad DP102 and the leads LD105 are integrally coupled with each other via a narrow conductor; therefore, resistance of a current path passing through the back electrode BE5 of the semiconductor chip CP5, the die pad DP102, and the leads LD105 is increased. In this case, resistance of a current path passing through the back electrode BE5 of the semiconductor chip CP5 and the leads LD105 becomes larger than resistance of a current path passing through the back electrode BE4 of the semiconductor chip CP4 and the leads LD104 and resistance of a current path passing through the back electrode BE6 of the semiconductor chip CP6 and the leads LD106. As a result, there is a possibility that elements configuring the inverter circuit formed of the semiconductor devices PKG101 get out of balance. For example, in the above-mentioned motor MOT, there is a possibility of occurrence of a phenomenon in which torque is increased only when a current flows to a coil CL (for example, a V-phase coil CL2) of the motor MOT by way of the back electrode BE5 of the semiconductor chip CP5, the die pad DP102, and the leads LD105. Meanwhile, to increase a width (width in the X direction) of a conductor coupling the die pad DP102 and the leads LD105 with each other, a width (width in the X direction) of the lead coupling portion LB104*b* must be in turn reduced. This leads to increase resistance of a current path passing through the source pad P5S of the semiconductor chip CP5, the metal plate MP104*b*, and the leads LD109*b*.

To increase both a width (width in the X direction) of a conductor coupling the die pad DP102 and the leads LD105 with each other and a width (width in the X direction) of the lead coupling portion LB104*b*, a spacing between the die pad DP101 and the die pad DP102 and a spacing between the die pad DP103 and the die pad DP102 must be increased but this leads to increase in size in the X direction of the sealing portion MR. For this reason, increase in size of the semiconductor device PKG101 is incurred.

Consequently, in the semiconductor device PKG101 in the investigated example, increase in resistance of a current path passing through the source pad P5S of the semiconductor chip CP5 and the source leads LD109*b* is incurred; increase in resistance of a current path passing through the drain back electrode BE5 of the semiconductor chip CP5 and the drain leads LD105 is incurred; or increase in size of the semiconductor device PKG101 is incurred. Further, since thermal resistance between the die pad DP102 and the leads LD105 is increased, the semiconductor chip CP5 is prone to rise in temperature as compared with the semiconductor chips CP4, CP6.

The present inventors have been considering a semiconductor device obtained by packaging the semiconductor chips CP1, CP2, CP3 incorporating a power transistor for high-side switch, the semiconductor chips CP4, CP5, CP6 incorporating a power transistor for low-side switch, and the semiconductor chip CPC incorporating a control circuit controlling these ships. In such a semiconductor device, degradation in performance of the semiconductor device or increase in size of the semiconductor device will be incurred without adding some contrivance to how to couple each semiconductor chip and each lead with each other, how to dispose leads, and the like.

Major Features and Effects

The semiconductor device PKG in this embodiment is a semiconductor device obtained by sealing the semiconductor chips CP1, CP2, CP3 each incorporating a power transistor for high-side switch, the semiconductor chips CP4, CP5, CP6 each incorporating a power transistor for low-side switch, and the semiconductor chip CPC incorporating a control circuit controlling these chips in the sealing portion MR (sealing body). The semiconductor chips CP1, CP2, CP3 (first, second, and third semiconductor chips) are mounted over the common die pad DPH (first chip mounting portion) and the semiconductor chips CP4, CP5, CP6, CPC (fourth, fifth, sixth, and seventh semiconductor chips) are respectively mounted over the die pads DP1, DP2, DP3, DPC (second, third, fourth, and fifth chip mounting portion).

One of the major features of the semiconductor device PKG in this embodiment is that the controlling semiconductor chip CPC is disposed between a first chip group comprised of the semiconductor chips CP1, CP2, CP3 for high side and a second chip group comprised of the semiconductor chips CP4, CP5, CP6 for low side in the Y direction (second direction).

The semiconductor chips CP1, CP2, CP3 for high side and the semiconductor chips CP4, CP5, CP6 for low side are controlled by one semiconductor chip CPC. For this reason, disposing the semiconductor chip CPC between the semiconductor chips CP1, CP2, CP3 (first chip group) and the semiconductor chips CP4, CP5, CP6 (second chip group) makes it easier to control the semiconductor chips CP1 to CP6 by the semiconductor chip CPC and enables enhancement of performance of the semiconductor device PKG. For example, since it is possible to make a distance from each semiconductor chip CP1 to CP6 to the semiconductor chip CPC substantially identical, the pads of each semiconductor chip CP1 to CP6 and the pads of the semiconductor chip CPC can be easily coupled with each other through a wire BW and further coupling resistance can be easily uniformized. As a result, the semiconductor chips CP1 to CP6 can be controlled by the semiconductor chip CPC in well balance.

Power transistors for high-side switch and power transistors for low-side switch must be coupled in series. For this reason, it is necessary to electrically couple the source pad P1S of the semiconductor chip CP1 and the back electrode BE4 of the semiconductor chip CP4 with each other and this is the same with the semiconductor chips CP2, CP5 and the semiconductor chips CP3, CP6.

In this embodiment, as mentioned above, the semiconductor chip CPC is disposed between the semiconductor chips CP1, CP2, CP3 (first chip group) and the semiconductor chips CP4, CP5, CP6 (second chip group). For this reason, to couple the source pad P1S of the semiconductor chip CP1 and the back electrode BE4 of the semiconductor chip CP4 with each other within the sealing portion MR via a conductor, the semiconductor chip CPC obstructs and it is difficult to couple these items with each other. This is also the same with the semiconductor chips CP2, CP5 and the semiconductor chips CP3, CP6.

Consequently, in this embodiment, the leads LD1 (first leads) electrically coupled to the pad P1S of the semiconductor chip CP1 (via the metal plate MP1) and the leads LD2 (second leads) electrically coupled to the pad P2S of the semiconductor chip CP2 (via the metal plate MP2) are provided in the semiconductor device PKG. Further, the leads LD3 (third leads) electrically coupled to the pad P3S of the semiconductor chip CP3 (via the metal plate MP3) and the leads LD4 (fourth leads) integrally formed with the die pad DP1 and electrically coupled to the back electrode BE4 of the semiconductor chip CP4 are provided in the semiconductor device PKG. Furthermore, the leads LD5 (fifth leads) integrally formed with the die pad DP2 and electrically coupled to the back electrode BE5 of the semiconductor chip CP5 and the leads LD6 (sixth leads) integrally formed with the die pad DP3 and electrically coupled to the back electrode BE6 of the semiconductor chip CP6 are provided in the semiconductor device PKG. In addition, the leads LD7, LD8 (seventh leads and eighth leads) integrally formed with the die pad DPH and electrically coupled to the back electrodes BE1, BE2, BE3 of the semiconductor chips CP1, CP2, CP3 are provided in the semiconductor device PKG. Moreover, the leads LD9, LD10 (ninth leads and 10th leads) electrically coupled to the source pads P4S, P5S, P6S of the semiconductor chips CP4, CP5, CP6 via the metal plate MP4 (first metal plate) are provided in the semiconductor device PKG.

As a result, with the semiconductor device PKG mounted over the circuit board PB1, it is possible to supply potential (supply potential) VIN to the leads LD7, LD8 and supply reference potential (ground potential GND) lower than the supply potential to the leads LD9, LD10. It is possible to couple a power transistor included in the semiconductor chip CP1 and a power transistor included in the semiconductor chip CP4 in series between potential VIN and reference potential (GND). It is possible to couple a power transistor included in the semiconductor chip CP2 and a power transistor included in the semiconductor chip CP5 in series between potential VIN and reference potential (GND). It is possible to couple a power transistor included in the semiconductor chip CP3 and a power transistor included in the semiconductor chip CP6 in series between potential VIN and reference potential (GND). This makes it possible to cause the power transistors included in the semiconductor chips CP1, CP2, CP3 to function as high-side switches and cause the power transistors included in the semiconductor chips CP4, CP5, CP6 to function as low-side switches.

In this embodiment, in addition to providing the semiconductor device PKG with these leads LD, some contrivance is added to how to dispose and couple these leads LD.

A more specific description will be given. In this embodiment, as viewed in a plane, the leads LD1, the leads LD2, and the leads LD3 are disposed on the side MRd3 (side face MRc3) side of the sealing portion MR and the leads LD4, the leads LD5, and the leads LD6 are disposed on the side MRd1 (side face MRc1) side of the sealing portion MR. That is, as viewed in a plane, the leads LD1, the leads LD2, and the leads LD3 intersect with the side MRd3 (third side) of the sealing portion MR and the leads LD4, the leads LD5, and the leads LD6 intersect with the side MRd1 (first side) of the sealing portion MR. In this embodiment, as viewed in a plane, the leads LD8 and the leads LD10 are disposed on the side MRd2 (side face MRc2) side of the sealing portion MR and the leads LD7 and the leads LD9 are disposed on the side MRd4 (side face MRc4) side. That is, as viewed in a plane, the leads LD8 and the leads LD10 intersect with the side MRd2 (second side) of the sealing portion MR and the leads LD7 and the leads LD9 intersect with the side MRd4 (fourth side).

Another one of the major features of this embodiment is that: the source pads P4S, P5S, P6S of the semiconductor chips CP4, CP5, CP6 are coupled to the common metal plate MP4 and this metal plate MP4 is coupled to the leads LD10 disposed on the side face MRc2 side of the sealing portion MR and to the leads LD9 disposed on the side face MRc4 side of the sealing portion MR.

In the semiconductor device PKG101 in the investigated example shown in FIG. 31 to FIG. 35, unlike this embodiment, the source pads P4S, P5S, P6S of the semiconductor chips CP4, CP5, CP6 are respectively coupled to the different metal plates MP104a, MP104b, MP104c. For this reason, a source lead must be provided for each of the semiconductor chips CP4, CP5, CP6 and thus the source leads LD109b and drain leads LD105 of the semiconductor chip CP5 must be both disposed in a narrow area opposite the semiconductor chip CP1 (die pad DP102) on the side face MRc1 side of the sealing portion MR, as mentioned above.

In this embodiment, meanwhile, the source pads P4S, P5S, P6S of the semiconductor chips CP4, CP5, CP6 are coupled to the common metal plate MP4. For this reason, the source leads of the semiconductor chip CP4 or the source leads of the semiconductor chip CP6 can be used also for the source leads of the semiconductor chip CP5 without separately providing source leads of the semiconductor chip CP5. That is, the leads LD10 disposed on the side face MRc2 side of the sealing portion MR are located close to the semiconductor chip CP6 and the leads LD9 disposed on the side face MRc4 side of the sealing portion MR are located close to the semiconductor chip CP4 but not only the source pads P4S, P6S of the semiconductor chips CP4, CP6 but also the source pad P5S of the semiconductor chip CP5 can be electrically coupled to the leads LD9, LD10 via the metal plate MP4. That is, the leads LD9, LD10 are common source leads of the semiconductor chips CP4, CP5, CP6 (power MOSFETs 1, 2, 3).

For this reason, in this embodiment, the leads LD5 only have to be disposed between the leads LD4 and the leads LD6 (between a lead group comprised of the leads LD4 and a lead group comprised of the leads LD6) on the side MRd1 of the sealing portion MR; and it is unnecessary to dispose leads LD electrically coupled to the source pad P5S of the semiconductor chip CP5. As viewed from a different standpoint, the leads LD5 can be disposed in a position opposite the semiconductor chip CP5 (die pad DP2) on the side MRd1 of the sealing portion MR and it is unnecessary to dispose leads LD electrically coupled to the source pad P5S of the semiconductor chip CP5. That is, on the side MRd1 of the sealing portion MR, a position between the leads LD4 and the leads LD6, or, as viewed from a different standpoint, a position opposite the semiconductor chip CP5 (die pad DP2) can be used as an area dedicated to disposing the drain leads LD5 of the semiconductor chip CP5 without disposing source leads of the semiconductor chip CP5.

For this reason, in this embodiment, on the side MRd1 of the sealing portion MR, the leads LD5 are disposed between the leads LD4 and the leads LD6, that is, between a lead group comprised of the leads LD4 and a lead group comprised of the leads LD6 but a lead electrically coupled to the source pad P5S of the semiconductor chip CP5 is not disposed. As viewed from a different standpoint, in a position opposite the semiconductor chip CP5 (die pad DP2) on the side MRd1 of the sealing portion MR, the leads LD5 are disposed but a lead electrically coupled to the source pad P5S of the semiconductor chip CP5 is not disposed.

Therefore, it is possible to suppress resistance of a current path passing through the back electrode BE5 of the semiconductor chip CP5, the die pad DP2, and the leads LD5 and to suppress on-resistance (resistance during conduction) of the semiconductor chip CP5 (power MOSFET 5). Unlike the case of the investigated example shown in FIG. 31 to FIG. 35, for example, in the case of this embodiment shown in FIG. 5 to FIG. 15, the die pad DP2 and the leads LD5 can be integrally coupled with each other via a wide conductor (for example, a conductor wider in width than the width in the Y direction of the metal plate MP4); therefore, it is possible to reduce resistance of a current path passing through the back electrode BE5 of the semiconductor chip CP5, the die pad DP2, and the leads LD5. Further, a number of the drain leads LD5 of the semiconductor chip CP5 can be increased and this can also contribute to suppression of on-resistance of the semiconductor chip CP5 (power MOSFET 5). Since thermal resistance between the die pad DP2 and the leads LD5 can be suppressed, the semiconductor chip CP5 can be suppressed or prevented from rising in temperature as compared with the semiconductor chips CP4, CP6.

In this embodiment, the leads LD9 disposed in a position opposite the semiconductor chip CP4 (die pad DP1) and the leads LD10 disposed in a position opposite the semiconductor chip CP6 (die pad DP3) function not only as source leads of the semiconductor chips CP4, CP6 but also as source leads of the semiconductor chip CP5. For this reason, a sufficient number of source leads of the semiconductor chip CP5 can be ensured. The leads LD9, LD10 are electrically coupled to the source pad P5S of the semiconductor chip CP5 via the metal plate MP4 low in resistance. Therefore, it is possible to suppress resistance of a current path passing through the source pad P5S of the semiconductor chip CP5, the metal plate MP4, and the leads LD9, LD10 and to suppress on-resistance of the semiconductor chip CP5 (power MOSFET 5). As compared with the case of the investigated example shown in FIG. 31 to FIG. 35, in the case of this embodiment shown in FIG. 5 to FIG. 15, a number of leads LD electrically coupled with the source pad P5S of the semiconductor chip CP5 can be increased and this can also contribute to suppression of on-resistance of the semiconductor chip CP5 (power MOSFET 5).

As mentioned above, according to this embodiment, it is possible to achieve both resistance suppression in a current path passing through the source pad P5S of the semiconductor chip CP5 and the source leads LD (LD9, LD10) and resistance suppression in a current path passing through the drain back electrode BE5 of the semiconductor chip CP5 and the drain leads LD (LD5). Therefore, on-resistance of the semiconductor chip CP5 (power MOSFET 5) can be appropriately suppressed and thus performance of the semiconductor device PKG can be enhanced.

In this embodiment, it is unnecessary to dispose a source lead of the semiconductor chip CP5 in a position between the leads LD4 and the leads LD6 or, as viewed from a different standpoint, a position opposite the semiconductor chip CP5 (die pad DP2) on the side MRd1 (side face MRc1) of the sealing portion MR; therefore, size in the X direction of the sealing portion MR can be suppressed. For this reason, the flat dimensions of the semiconductor device PKG can be reduced and thus size reduction of the semiconductor device PKG is enabled.

In this embodiment, a lead LD electrically coupled to the source pad P5S of the semiconductor chip CP5 may be not disposed at all on the side MRd1 (side face MRc1) of the sealing portion MR. Thus, the source leads LD (LD9, LD10) of the semiconductor chips CP4, CP5, CP6 are disposed only on the sides MRd4, MRd2 of the sealing portion MR and none of the source leads is disposed on the side MRd1 of the sealing portion MR. As a result, the drain leads LD4, LD5, LD6 of the semiconductor chips CP4, CP5, CP6 only have to be drawn from the side MRd1 (side face MRc1) of the sealing portion MR. This facilitates routing of the wirings of the circuit board PB1 over which the semiconductor device PKG is mounted.

It will be assumed that of the source leads LD9 and the leads LD10 of the semiconductor chips CP4, CP5, CP6, the leads LD9 are omitted unlike this embodiment. In this case, when the semiconductor chip CP4 (power MOSFET 4) is turned on, a current flows from the source pad P4S of the semiconductor chip CP4 to the leads LD10 by way of the metal plate MP4. However, as the result of a current path being lengthened, there is fear of increase in conduction loss. It will be assumed that of the leads LD9 and the leads LD10, the leads LD10 are omitted. In this case, when the semiconductor chip CP6 (power MOSFET 6) is turned on, a current flows from the source pad P6S of the semiconductor chip CP6 to the leads LD9 by way of the metal plate MP4. However, as the result of a current path being lengthened, there is fear of increase in conduction loss.

In this embodiment, meanwhile, leads LD (leads LD9, LD10 in this example) electrically coupled to the source pads P4S, P5S, P6S of the semiconductor chips CP4, CP5, CP6 are disposed on the side MRd4 side of the sealing portion MR and on the side MRd2 side of the sealing portion MR. Thus, when the semiconductor chip CP4 (power MOSFET 4) is turned on, a current can flow from the source pad P4S of the semiconductor chip CP4 mainly to the leads LD9 close to the semiconductor chip CP4 by way of the metal plate MP4. When the semiconductor chip CP6 (power MOSFET 6) is turned on, a current can flow from the source pad P6S of the semiconductor chip CP6 mainly to the leads LD10 close to the semiconductor chip CP6 by way of the metal plate MP4. When the semiconductor chip CP5 (power MOSFET 5) is turned on, a current can flow from the source pad P5S of the semiconductor chip CP5 both to the leads LD9 and to the leads LD10 by way of the metal plate MP4. As a result, whichever semiconductor chip CP4, CP5, CP6 is turned on, it is possible to suppress resistance and suppress a conduction loss. Further, an impedance can be reduced.

When the semiconductor device PKG is controlled, two of the semiconductor chips CP4, CP5, CP6 (power MOSFETs 4, 5, 6) may be simultaneously turned on but three of them never be simultaneously turned on. For this reason, when the semiconductor chips CP4, CP5 out of the semiconductor chips CP4, CP5, CP6 are turned on, the temperatures of the semiconductor chips CP4, CP5 in on state rise and the temperature of the semiconductor chip CP6 not in on state is lower than the temperatures of the semiconductor chips CP4, CP5. For this reason, heat produced in the semiconductor chips CP4, CP5 can be dissipated toward the leads LD10 on the closer side to the lower-temperature semiconductor chip CP6 not in on state by way of the metal plate MP4. When the semiconductor chips CP5, CP6 out of the semiconductor chips CP4, CP5, CP6 are simultaneously turned on, heat produced in the semiconductor chips CP5, CP6 can be dissipated toward the leads LD9 on the closer side to the lower-temperature semiconductor chip CP4 not in on state by way of the metal plate MP4. Thus, provision of both the leads LD9 and the leads LD10 makes it possible to enhance the efficiency of heat dissipation from the semiconductor chips CP4, CP5, CP6 to leads LD by way of the metal plate MP4 even when two semiconductor chips of the semiconductor chips CP4, CP5, CP6 are turned on. As a result, it is possible to suppress temperature rise in the semiconductor chips CP4, CP5, CP6 when they are turned on and to enhance reliability of the semiconductor device PKG. Capability to suppress temperature rise in the semiconductor chips CP4, CP5, CP6 when they are turned on can also contribute to suppression of resistance (on-resistance) of a semiconductor chip in on state.

Hereafter, a description will be given to still another feature of the semiconductor device PKG in this embodiment.

The leads LD (leads LD7, LD8 in this example) integrally coupled to the die pad DPH with the high-side semiconductor chips CP1, CP2, CP3 mounted thereover are disposed both on the side MRd2 of the sealing portion MR and on the side MRd4 of the sealing portion MR. For this reason, when the semiconductor chips CP1, CP2 out of the semiconductor chips CP1, CP2, CP3 are simultaneously turn on, heat produced in the semiconductor chips CP1, CP2 can be dissipated toward the leads LD8 on the closer side to the lower-temperature semiconductor chip CP3 not in on state by way of the die pad DPH. When the semiconductor chips CP2, CP3 out of the semiconductor chips CP1, CP2, CP3 are simultaneously turned on, heat produced in the semiconductor chips CP2, CP3 can be dissipated toward the leads LD7 on the closer side to the lower-temperature semiconductor chip CP1 not in on state by way of the die pad DPH. Thus, provision of both the leads LD7 and the leads LD8 makes it possible to enhance the efficiency of heat dissipation from the semiconductor chips CP1, CP2, CP3 to leads LD by way of the die pad DPH even when two semiconductor chips of the semiconductor chips CP1, CP2, CP3 are turned on. As a result, it is possible to suppress temperature rise in the semiconductor chips CP1, CP2, CP3 when they are turned on and to enhance reliability of the semiconductor device PKG. Capability to suppress temperature rise in the semiconductor chips CP1, CP2, CP3 when they are turned on can also contribute to suppression of resistance (on-resistance) of a semiconductor chip in on state.

As viewed in a plane, the semiconductor chip CP1, the semiconductor chip CP2, and the semiconductor chip CP3 are lined along the X direction and the semiconductor chip CP4, the semiconductor chip CP5, and the semiconductor chip CP6 are lined along the X direction. As a result, the flat dimensions of the semiconductor device PKG can be reduced and thus size reduction of the semiconductor device PKG is enabled.

In this embodiment, as viewed in a plane, the leads LD12 are disposed on the side MRd2 (side face MRc2) side of the sealing portion MR and the leads LD11 are disposed on the side MRd4 (side face MRc4) side. That is, as viewed in a plane, the leads LD12 intersect with the side MRd2 of the sealing portion MR and the leads LD11 intersect with the side MRd4. This makes it possible to electrically couple the leads LD11, LD12 and pads P7 of the semiconductor chip CPC with each other respectively via a conductive coupling member (a wire BW in this example) without being obstructed by the semiconductor chips CP1 to CP6.

In this embodiment, on the side MRd4 (side face MRc4) of the sealing portion MR, the leads LD11 are disposed between the leads LD7 and the leads LD9 (between a lead group comprised of the leads LD7 and a lead group comprised of the leads LD9). On the side MRd2 (side face MRc2) of the sealing portion MR, the leads LD12 are disposed between the leads LD8 and the leads LD10 (between a lead group comprised of the leads LD8 and a lead group comprised of the leads LD10). This makes it possible to electrically couple the leads LD11, LD12 and pads P7 of the semiconductor chip CPC with each other respectively via a conductive coupling member (a wire BW in this example) without being obstructed by the metal plates MP1 to MP4.

In cases where the placement positions of the leads LD9 and the leads LD4 are exchanged and the placement positions of the leads LD10 and the leads LD6 are exchanged, on the sides MRd2, MRd4 of the sealing portion MR, the leads LD11, LD12 for the semiconductor chip CPC are brought closer to the drain leads LD4, LD6 of the semiconductor chips CP4, CP6. In this case, however, a large current having a frequency component is passed through the leads LD4, LD6 by switching operation. As a result, there is a possibility that the large current becomes a noise source and noise is introduced from the leads LD11, LD12 into the semiconductor chip CPC. In cases where the placement positions of the leads LD7 and the leads LD1 are exchanged and the placement positions of the leads LD8 and the leads LD3 are exchanged, on the sides MRd2, MRd4 of the sealing portion MR, the leads LD11, LD12 for the semiconductor chip CPC are brought closer to the source leads LD1, LD3 of the semiconductor chips CP1, CP3. In this case, however, a large current having a frequency component is passed through the leads LD1, LD3 by switching operation. As a result, there is a possibility that the large current becomes a noise source and noise is introduced from the leads LD11, LD12 into the semiconductor chip CPC.

In this embodiment, meanwhile, on the side MRd4 of the sealing portion MR, the leads LD11 for the semiconductor chip CPC are located close to the leads LD7, LD9 rather than to the leads LD1 to LD6 and on the side MRd2 of the sealing portion MR, the leads LD12 for the semiconductor chip CPC are located close to the leads LD8, LD10 rather than to the leads LD1 to LD6. Since the leads LD7, LD8 are supplied with supply potential VIN (fixed potential) and the leads LD9, LD10 are supplied with reference potential (fixed potential) lower than the supply potential, all of these leads are less prone to become a noise source. For this reason, in this embodiment, it is possible to prevent the leads LD1 to LD6 from becoming a noise source and noise from being introduced from the leads LD11, LD12 into the semiconductor chip CPC. This makes it possible to further enhance performance and reliability of the semiconductor device PKG. In PWM (Pulse Width Modulation) controlling the motor MOT, placement of a capacitor or an inductor on the power supply side readily stabilizes supply potential VIN supplied to the leads LD7, LD8 and reference potential (ground potential GND) supplied to the leads LD9, LD10. Also in this regard, the leads LD7, LD8, LD9, LD10 are less prone to become a noise source. To the contrary, the leads LD1 to LD6 through which a large current having a frequency component is passed by switching operation are prone to become a noise source.

The semiconductor device PKG also includes the lead LD13 (13th leads) integrally formed with the die pad DPC mounted with the semiconductor chip CPC. It is desirable that one or more of the leads LD13 should be disposed in each of a position between the leads LD7 and the leads LD11 and a position between the leads LD9 and the leads LD11 on the side MRd4 (side face MRc4) of the sealing portion MR. Further, it is desirable that one or more of the leads LD13 should be disposed in each of a position between the leads LD8 and the leads LD12 and a position between the lead LD10 and the leads LD12 on the side MRd2 (side face MRc2) of the sealing portion MR. Thus, leads LD adjoining to a lead group comprised of the leads LD11 or a lead group comprised of the leads LD12 are the leads LD13 integrally formed with the die pad DPC mounted with the semiconductor chip CPC; therefore, it is possible to more effectively prevent noise from being introduced from the leads LD11, LD12 into the semiconductor chip CPC.

Up to this point, a specific description has been given to the present invention made by the present inventors based on an embodiment thereof. However, the present invention is not limited to the above-mentioned embodiment and may be variously modified without departing from the subject matter thereof, needless to add.

An example will be taken. In relation to the above embodiment, a description has been given to a case where the power transistors respectively formed in the semiconductor chips CP1 to CP6 are power MOSFETs (1 to 6). Instead, IGBTs (Insulated Gate Bipolar Transistors) are also applicable as the power transistors respectively formed in the semiconductor chips CP1 to CP6. In this case, the pads P1S to P6S formed in the semiconductor chips CP1 to CP6 are emitter pads and respectively electrically coupled to the emitter regions of the IGBTs formed in the semiconductor chips CP1 to CP6. The back electrodes BE1 to BE6 formed in the semiconductor chips CP1 to CP6 are collector back electrodes and respectively electrically coupled to the collector regions of the IGBTs formed in the semiconductor chips CP1 to CP6. The pads P1G to P6G formed in the semiconductor chips CP1 to CP6 are gate pads and respectively electrically coupled to the gates (gate electrodes) of the IGBTs formed in the semiconductor chips CP1 to CP6. The gate pads (P1G to P6G) function as controlling terminals (controlling electrodes) controlling continuity between the emitter pads (P1S to P6S) formed on the front face side of the semiconductor chips (CP1 to CP6) and the collector back electrodes (BE1 to BE6) formed on the back face side of the semiconductor chips (CP1 to CP6). For this reason, in cases where IGBTs are used instead of power MOSFETs 1 to 6, "source" only has to be replaced with "emitter" and "drain" only has to be replaced with "collector" in the description of the above embodiment.

What is claimed is:

1. A semiconductor device comprising:
a first semiconductor chip including a first power transistor for high-side switch and having a first principal surface and a first back face located on an opposite side to the first principal surface,
wherein the first semiconductor chip includes a first back electrode formed in the first back face and coupled to the first power transistor, a first electrode formed in the first principal surface and coupled to the first power transistor, and a first gate electrode formed in the first principal surface and controlling continuity between the first electrode and the first back electrode;
a second semiconductor chip including a second power transistor for high-side switch and having a second principal surface and a second back face located on an opposite side to the second principal surface,
wherein the second semiconductor chip includes a second back electrode formed in the second back face and coupled to the second power transistor, a second electrode formed in the second principal surface and coupled to the second power transistor, and a second gate electrode formed in the second principal surface and controlling continuity between the second electrode and the second back electrode;
a third semiconductor chip including a third power transistor for high-side switch and having a third principal surface and a third back face located on an opposite side to the third principal surface,
wherein the third semiconductor chip includes a third back electrode formed in the third back face and coupled to the third power transistor, a third electrode formed in the third principal surface and coupled to the third power transistor, and a third gate electrode formed in the third principal surface and controlling continuity between the third electrode and the third back electrode;
a fourth semiconductor chip including a fourth power transistor for low-side switch and having a fourth principal surface and a fourth back face located on an opposite side to the fourth principal surface,
wherein the fourth semiconductor chip includes a fourth back electrode formed in the fourth back face and coupled to the fourth power transistor, a fourth electrode formed in the fourth principal surface and coupled to the fourth power transistor, and a fourth gate electrode formed in the fourth principal surface and controlling continuity between the fourth electrode and the fourth back electrode;
a fifth semiconductor chip including a fifth power transistor for low-side switch and having a fifth principal surface and a fifth back face located on an opposite side to the fifth principal surface,
wherein the fifth semiconductor chip includes a fifth back electrode formed in the fifth back face and coupled to the fifth power transistor, a fifth electrode formed in the fifth principal surface and coupled to the fifth power transistor, and a fifth gate electrode formed in the fifth principal surface and controlling continuity between the fifth electrode and the fifth back electrode;
a sixth semiconductor chip including a sixth power transistor for low-side switch and having a sixth principal surface and a sixth back face located on an opposite side to the sixth principal surface,
wherein the sixth semiconductor chip includes a sixth back electrode formed in the sixth back face and coupled to the sixth power transistor, a sixth electrode formed in the sixth principal surface and coupled to the sixth power transistor, and a sixth gate electrode formed in the sixth principal surface and controlling continuity between the sixth electrode and the sixth back electrode;
a seventh semiconductor chip including a circuit controlling each of the first semiconductor chip, the second semiconductor chip, the third semiconductor chip, the fourth semiconductor chip, the fifth semiconductor chip, and the sixth semiconductor chip and having a seventh principal surface and a seventh back face located on an opposite side to the seventh principal surface;
a first chip mounting portion mounted with the first, second, and third semiconductor chips and electrically coupled with the first, second, and third back electrodes;
a second chip mounting portion mounted with the fourth semiconductor chip and electrically coupled with the fourth back electrode;
a third chip mounting portion mounted with the fifth semiconductor chip and electrically coupled with the fifth back electrode;
a fourth chip mounting portion mounted with the sixth semiconductor chip and electrically coupled with the sixth back electrode;
a fifth chip mounting portion mounted with the seventh semiconductor chip;
a plurality of first leads electrically coupled to the first electrode of the first semiconductor chip;
a plurality of second leads electrically coupled to the second electrode of the second semiconductor chip;
a plurality of third leads electrically coupled to the third electrode of the third semiconductor chip;
a plurality of fourth leads integrally formed with the second chip mounting portion and electrically coupled to the fourth back electrode of the fourth semiconductor chip;
a plurality of fifth leads integrally formed with the third chip mounting portion and electrically coupled to the fifth back electrode of the fifth semiconductor chip;
a plurality of sixth leads integrally formed with the fourth chip mounting portion and electrically coupled to the sixth back electrode of the sixth semiconductor chip;
a plurality of seventh leads and a plurality of eighth leads integrally formed with the first chip mounting portion and electrically coupled to the first, second, and third back electrodes of the first, second, and third semiconductor chips;
a plurality of ninth leads and a plurality of 10th leads electrically coupled to the fourth, fifth, and sixth electrodes of the fourth, fifth, and sixth semiconductor chips via a first metal plate; and
a sealing body sealing the first semiconductor chip, the second semiconductor chip, the third semiconductor chip, the fourth semiconductor chip, the fifth semiconductor chip, the sixth semiconductor chip, the seventh semiconductor chip, at least a part of the first chip mounting portion, at least a part of the second chip mounting portion, at least a part of the third chip mounting portion, at least a part of the fourth chip mounting portion, at least a part of the fifth chip mounting portion, the first metal plate, parts of the first leads, parts of the second leads, parts of the third leads, parts of the fourth leads, parts of the fifth leads, parts of the sixth leads, parts of the seventh leads, parts of the eighth leads, parts of the ninth leads, and parts of the 10th leads,
wherein as viewed in a plane, the sealing body includes a first side extending along a first direction, a second side extending along a second direction intersecting with the first direction, a third side extending along the first direction and located on an opposite side to the first side, and a fourth side extending along the second direction and located on an opposite side to the second side,
wherein in the second direction, the seventh semiconductor chip is located between a first chip group comprised of the first, second, and third semiconductor chips and a second chip group comprised of the fourth, fifth, and sixth semiconductor chips and the first chip group is located along the third side and the second chip group is located along the first side,
wherein in the first direction, the second semiconductor chip is located between the first semiconductor chip and the third semiconductor chip and the first semiconductor chip is located towards the fourth side and the third semiconductor chip is located towards the second side,
wherein in the first direction, the fifth semiconductor chip is located between the fourth semiconductor chip and the sixth semiconductor chip and the fourth semiconductor chip is located towards the fourth side and the sixth semiconductor chip is located towards the second side,
wherein as viewed in a plane, the first leads, the second leads, and the third leads intersect with the third side of the sealing body,
wherein as viewed in a plane, the fourth leads, the fifth leads, and the sixth leads intersect with the first side of the sealing body,
wherein as viewed in a plane, the eighth leads and the 10th leads intersect with the second side of the sealing body, and
wherein as viewed in a plane, the seventh leads and the ninth leads intersect with the fourth side of the sealing body.

2. The semiconductor device according to claim 1, wherein on the first side of the sealing body, the fifth leads are disposed between the fourth leads and the sixth leads and a lead electrically coupled to the fifth electrode of the fifth semiconductor chip is not disposed.

3. The semiconductor device according to claim 1, wherein on the first side of the sealing body, the fifth leads are disposed in a position opposite the fifth semiconductor chip and a lead electrically coupled to the fifth electrode of the fifth semiconductor chip is not disposed.

4. The semiconductor device according to claim 1, wherein on the first side of the sealing body, a lead electrically coupled to the fifth electrode of the fifth semiconductor chip is not disposed.

5. The semiconductor device according to claim 1, wherein the first leads are electrically coupled to the first electrode of the first semiconductor chip via a second metal plate,
wherein the second leads are electrically coupled to the second electrode of the second semiconductor chip via a third metal plate, and
wherein the third leads are electrically coupled to the third electrode of the third semiconductor chip via a fourth metal plate.

6. The semiconductor device according to claim 1, wherein as viewed in a plane, the first semiconductor chip, the second semiconductor chip, and the third semiconductor chip are lined along the first direction, and
wherein as viewed in a plane, the fourth semiconductor chip, the fifth semiconductor chip, and the sixth semiconductor chip are lined along the first direction.

7. The semiconductor device according to claim 1,
wherein the seventh semiconductor chip includes a plurality of seventh electrodes formed in the seventh principal surface, and
wherein the first gate electrode of the first semiconductor chip, the second gate electrode of the second semiconductor chip, the third gate electrode of the third semiconductor chip, the fourth gate electrode of the fourth semiconductor chip, the fifth gate electrode of the fifth semiconductor chip, and the sixth gate electrode of the sixth semiconductor chip are respectively electrically coupled to the seventh electrodes of the seventh semiconductor chip via a plurality of first wires.

8. The semiconductor device according to claim 1,
wherein the seventh semiconductor chip includes a plurality of eighth electrodes and a plurality of ninth electrodes formed in the seventh principal surface, the semiconductor device further comprising:
a plurality of 11th leads respectively electrically coupled to the eighth electrodes of the seventh semiconductor chip; and
a plurality of 12th leads respectively electrically coupled to the ninth electrodes of the seventh semiconductor chip,
wherein as viewed in a plane, the 11th leads intersect with the fourth side of the sealing body and the 12th leads intersect with the second side of the sealing body.

9. The semiconductor device according to claim 8,
wherein on the fourth side, the 11th leads are disposed between the seventh leads and the ninth leads, and
wherein on the second side, the 12th leads are disposed between the eighth leads and the 10th leads.

10. The semiconductor device according to claim 9,
wherein the 11th leads are respectively electrically coupled to the eighth electrodes of the seventh semiconductor chip via a plurality of second wires, and
wherein the 12th leads are respectively electrically coupled to the ninth electrodes of the seventh semiconductor chip via a plurality of third wires.

11. The semiconductor device according to claim 9, further comprising:
a plurality of 13th leads integrally formed with the fifth chip mounting portion,
wherein one or more of the 13th leads are disposed in each of a position between the seventh leads and the 11th leads on the fourth side, a position between the ninth leads and the 11th leads on the fourth side, a position between the eighth leads and the 12th leads on the second side, and a position between the 10th leads and the 12th leads on the second side.

12. The semiconductor device according to claim 1,
wherein the seventh leads and the eighth leads are leads supplied with supply potential, and
wherein the ninth leads and the 10th leads are leads supplied with reference potential lower than the supply potential.

13. The semiconductor device according to claim 12,
wherein in the semiconductor device, the first leads and the fourth leads are not tied to each other via a conductor, the second leads and the fifth leads are not tied to each other via a conductor, and the third leads and the sixth leads are not tied to each other via a conductor, and
wherein outside the semiconductor device, the first leads and the fourth leads are electrically coupled with each other, the second leads and the fifth leads are electrically coupled with each other, and the third leads and the sixth leads are electrically coupled with each other.

14. The semiconductor device according to claim 12,
wherein the semiconductor device is mounted over a circuit board,
wherein the first leads and the fourth leads are electrically coupled with each other through a first wiring of the circuit board,
wherein the second leads and the fifth leads are electrically coupled with each other through a second wiring of the circuit board, and
wherein the third leads and the sixth leads are electrically coupled with each other through a third wiring of the circuit board.

15. The semiconductor device according to claim 14,
wherein the first wiring, the second wiring, and the third wiring of the circuit board are disposed below the semiconductor device.

16. The semiconductor device according to claim 15,
wherein the circuit board further includes a fourth wiring electrically coupling the seventh leads and the eighth leads with each other and a fifth wiring electrically coupling the ninth leads and the 10th leads with each other.

17. The semiconductor device according to claim 16,
wherein in the circuit board, the fourth wiring and the fifth wiring are formed in a layer located below the first wiring, the second wiring, and the third wiring.

18. The semiconductor device according to claim 1,
wherein the first semiconductor chip, the second semiconductor chip, the third semiconductor chip, the fourth semiconductor chip, the fifth semiconductor chip, the sixth semiconductor chip, and the seventh semiconductor chip are used to form an inverter circuit.

19. The semiconductor device according to claim 1,
wherein the sealing body has an eighth principal surface and an eighth back face located on the opposite side to the eighth principal surface, and
wherein a part of each of the first chip mounting portion, the second chip mounting portion, the third chip mounting portion, the fourth chip mounting portion, and the fifth chip mounting portion is exposed from the eighth principal surface.

20. The semiconductor device according to claim 1,
wherein the first power transistor, the second power transistor, the third power transistor, the fourth power transistor, the fifth power transistor, and the sixth power transistor are all power MOSFETs.

* * * * *